(12) United States Patent
McClure et al.

(10) Patent No.: US 10,289,757 B2
(45) Date of Patent: May 14, 2019

(54) SYSTEM AND METHODS FOR SOLAR PHOTOVOLTAIC ARRAY ENGINEERING

(71) Applicant: HST Solar Farms, Inc., Los Angeles, CA (US)

(72) Inventors: Tucker McClure, Redondo Beach, CA (US); Santanov Chaudhuri, Los Angeles, CA (US); Eric Ware, Winter Park, FL (US); Neal Shah, La Canada/Flintridge, CA (US); Rudra Roy, Los Angeles, CA (US); Gregg Luconi, Monrovia, CA (US); David Ives Brown, Pasadena, CA (US); Donald Douglas-Hamilton, San Francisco, CA (US)

(73) Assignee: HST Solar Farms, Inc., Los Angeles, CA (US)

( * ) Notice: Subject to any disclaimer, the term of this patent is extended or adjusted under 35 U.S.C. 154(b) by 35 days.

(21) Appl. No.: 14/713,774

(22) Filed: May 15, 2015

(65) Prior Publication Data
US 2015/0331972 A1  Nov. 19, 2015

Related U.S. Application Data

(60) Provisional application No. 61/994,416, filed on May 16, 2014.

(51) Int. Cl.
 *G06F 17/10* (2006.01)
 *G06F 17/50* (2006.01)
 (Continued)

(52) U.S. Cl.
 CPC .......... *G06F 17/5004* (2013.01); *G06F 17/11* (2013.01); *H02S 10/00* (2013.01);
 (Continued)

(58) Field of Classification Search
None
See application file for complete search history.

(56) References Cited

U.S. PATENT DOCUMENTS 6,546,535 B1  4/2003  Nagao et al.
7,516,557 B2  4/2009  Courter
(Continued)

FOREIGN PATENT DOCUMENTS

DE  102012106124 A1  5/2013
DE  102012210132 A1  12/2013
(Continued)

OTHER PUBLICATIONS

Tiwary et al. Generation of Yield-Aware Pareto Surface for Hierarchical Circuit Design Space Exploration ACM, DAC Jul. 24-28, 2006 (Year: 2006).*

(Continued)

*Primary Examiner* — Aniss Chad
*Assistant Examiner* — Cuong V Luu
(74) *Attorney, Agent, or Firm* — Bookoff McAndrews, PLLC

(57) ABSTRACT

The present application concerns automated optimization, customization or production methods for the design of a solar photovoltaic array, involving one or more or all components in a photovoltaic array, in which the products include system designs, production drawings, permitting and construction drawings, layouts for the mechanical and electrical systems, bill of materials and financial return analyses of such a photovoltaic array.

33 Claims, 25 Drawing Sheets

(51) Int. Cl.
  *H02S 99/00* (2014.01)
  *G06F 17/11* (2006.01)
  *H02S 10/00* (2014.01)
  *H02S 20/32* (2014.01)
  *H02S 20/10* (2014.01)

(52) U.S. Cl.
  CPC .............. *H02S 20/10* (2014.12); *H02S 20/32* (2014.12); *H02S 99/00* (2013.01); *Y02E 10/50* (2013.01)

(56) References Cited

U.S. PATENT DOCUMENTS

| | | | |
|---|---|---|---|
| 8,344,548 | B2 | 1/2013 | Stern |
| 8,417,061 | B2 | 4/2013 | Kennedy et al. |
| 2003/0093762 | A1* | 5/2003 | Rietman .............. G05B 13/027 700/97 |
| 2004/0131467 | A1* | 7/2004 | Wobben .................. F03D 13/20 416/132 B |
| 2007/0157614 | A1* | 7/2007 | Goldman .................. F02C 3/22 60/641.15 |
| 2008/0015839 | A1 | 1/2008 | Noureldin et al. |
| 2009/0032084 | A1 | 2/2009 | Aiken et al. |
| 2009/0133735 | A1 | 5/2009 | Yuguchi et al. |
| 2009/0234692 | A1 | 9/2009 | Powell et al. |
| 2010/0217566 | A1* | 8/2010 | Wayne ................ G06F 17/5004 703/1 |
| 2010/0217639 | A1 | 8/2010 | Wayne et al. |
| 2010/0217724 | A1 | 8/2010 | Wayne et al. |
| 2010/0235206 | A1* | 9/2010 | Miller ...................... E04D 3/352 705/7.11 |
| 2011/0016147 | A1* | 1/2011 | Fornage ................. G06Q 10/08 707/769 |
| 2011/0106328 | A1* | 5/2011 | Zhou ..................... G05B 13/024 700/291 |
| 2011/0121144 | A1* | 5/2011 | Berbegal Pastor ..... H02S 20/32 248/185.1 |
| 2011/0205245 | A1 | 8/2011 | Kennedy et al. |
| 2011/0227417 | A1* | 9/2011 | Walker .................... H02J 3/383 307/72 |
| 2012/0123596 | A1 | 5/2012 | Plaisted |
| 2013/0024014 | A1 | 1/2013 | Sharma et al. |
| 2013/0060394 | A1* | 3/2013 | Jones ..................... G06Q 10/04 700/291 |
| 2013/0061142 | A1 | 3/2013 | Brier et al. |
| 2013/0246010 | A1 | 9/2013 | Dershowitz et al. |
| 2014/0005845 | A1* | 1/2014 | Thomas .................. H02J 3/385 700/291 |
| 2014/0032178 | A1 | 1/2014 | Kicinski et al. |
| 2014/0188297 | A1 | 7/2014 | Jordan et al. |
| 2014/0196455 | A1* | 7/2014 | Kuo ......................... F03G 6/005 60/641.8 |
| 2014/0312700 | A1* | 10/2014 | Catthoor ........... H01L 31/02021 307/77 |
| 2014/0331198 | A1 | 11/2014 | Bischoff et al. |
| 2015/0006118 | A1 | 1/2015 | Bischoff et al. |
| 2015/0226461 | A1* | 8/2015 | Kremer .................... F03G 6/065 126/574 |
| 2015/0239365 | A1* | 8/2015 | Hyde .................. B60L 11/1861 701/2 |
| 2015/0355618 | A1* | 12/2015 | Sharma .................. G05B 17/02 700/291 |
| 2015/0377516 | A1* | 12/2015 | Nielsen ................... F24S 23/74 126/693 |

FOREIGN PATENT DOCUMENTS

| | | |
|---|---|---|
| EP | 0973106 A2 | 1/2000 |
| EP | 1677240 A2 | 7/2006 |
| EP | 2570946 A1 | 11/2011 |
| EP | 2570984 A1 | 3/2013 |
| EP | 2660739 A1 | 11/2013 |
| WO | 2011054649 A2 | 5/2011 |
| WO | 2013037940 A1 | 3/2013 |
| WO | 2013037948 A1 | 3/2013 |
| WO | 2013060584 A2 | 5/2013 |
| WO | 2013079282 A2 | 6/2013 |
| WO | 2013104446 A1 | 7/2013 |
| WO | 2013164123 A1 | 11/2013 |
| WO | 2013185951 A1 | 12/2013 |

OTHER PUBLICATIONS

Gunawan et al. Multi-Objective Robust Optimization Using a Sensitivity Region Concept Struct Multidisc Optim 29, pp. 50-60 (Year: 2005).*
Blair et al., "System Advisor Model, SAM 20141.14: General Description," NREL Technical Report NRELTP-6A20-61019. (Obtained from the internet.).
Blasco et al., "A new graphical visualization of n-dimensional Pareto front for decision-making in multiobjective optimization," Infor Sci 178, pp. 3908-3924, 2008.
Boehm et al., "Using the WinWin Spiral Model: A Case Study." Computer, July issue, pp. 33-44, 1998.
Busacca et al., "Multiobjective optimization by genetic algorithms: application to safety systems," Rel. Eng Sys Safety, 72, pp. 59-74 ,2001.
Chaudhari et al., "Computing the Most Significant Solution from Pareto Front obtained in Multi-objective Evolutionary," Int J Adv Com Sci App 1(4), 2010.
Coello, "Handling Preferences in Evolutionary Multiobjective Optimization: A Survey," IEEE Evol Comp 1, 30-37 (2000).
Deb et al., "A Fast and Elitist Multiobjective Genetic Algorithm: NSGA-II," IEEE Trans Evol Comp 6(2), 2002.
Gay et al., "Finding Robust Solutions in Requirement Models," Autom SW Eng 17(1), 87-116 (2010).
Schletter Inc., broschure, "Helios3D Solar Plant Engineering," obtained from www.schletter.us.
Li & Tam, "Determining the Optimum Tilt Angle and Orientation for Solar Energy Collection Based on Measured Solar Radiance Data," Int J Photoenergy, Art. ID. # 85402 (2007).
Mattson et al., "Smart Pareto Filter: Obtaining a Minimal Representation of Multiobjective Design Space," Eng. Opt. 36(6), 721-740 (2004).
Morse, "Reducing the size of the Nondominated set: Pruning by Clustering," Comp Ops Res 7, 55-66.
Narvarte & Lorenzo, "Tracking and Ground Coverage Ratio," Prog Photovolt Res Apps 16, 703-714 (2008).
Rachmawati & Srinivasan, "Preference Incorporation in Multi-Objective Evolutionary Algorithms: Survey," IEEE Congress Evol Comp, 962-968 (2006).
Tiwari et al., "AMGA: An Archive-based Micro Genetic Algorithm for Multi-objective Optimization," GECCO 2008, ACM, 729-736 (2008).
Coello, "A Short Tutorial on Evolutionary Multiobjective Optimization," Lecture Notes (2001).
Watanabe et al., "NCGA: Neighborhood Cultivation Genetic Algorithm for Multi-objective Optimization Problems," GECCO 2002, 458-465 (2002).
Zio & Bazzo, "A Comparison of Methods for Selecting Preferred Solutions in Multiobjective Decision Making," in Computational Intelligence Systems in Industrial Engineering, Ed. C. Kahraman, Springer, 23-43, Atlantis Computation Intelligence Systems, vol. 6 (2012).
Zio et al., "Optimal Power System Generation Scheduling by Multi-objective Genetic Algorithms with Preferences," Rel Eng Sys Safety 94(2), 432-444 (2009).
Zitzler et al., "Performance Assessment of Multiobjective Optimizers: An Analysis and Review," IEEE Trans Evol Comp 7(2), 117-132 (2003).
International Search Report, PCT/US2015/031056, dated Oct. 20, 2015.

* cited by examiner

FIG. 7

| Part No. | Description | | Quantity | Unit Price | Price |
|---|---|---|---|---|---|
| PV MODULES | | | | | |
| -- | (300) Canadian Solar Inc.: CS6X - 300P 300W PV Module | cnt | 332,940 | $aa | $aa,aaa,aaa |
| PV INVERTERS | | | | | |
| -- | SMA America: SC800CP-US 380V [DEC 2012] 823kW Inverter | cnt | 93 | $aa,aaa | $a,aaa,aaa |
| BOS: RACKING | | Assy Quantity | | | |
| 110-P416-ASSY-001 | HRack PileDriven Racking System | 1 | 20,809 | $aaa.aa | $a,aaa,aaa |
| 140-P4TT-EWZ-002 | Module Mounting Rail | 5 | 104,045 | $aa.aa | $a,aaa,aaa |
| 140-P4PL-PRL-001 | Support Purlin | 2 | 41,618 | $aa.aa | $aaa,aaa |
| 140-P4PL-PIL-001 | Support Pile Foundation | 2 | 41,618 | $aa.aa | $aaa,aaa |
| 140-P4PL-SST-001 | Support Strut | 2 | 41,618 | $aa.aa | $aa,aaa |
| various | Fastener hardware kit: Plates, Clips, SoftNuts, etc. 140-B1CA-END-01B,140-B1CA-MID-01B,130-P4TT-GDBC-SS 130-P4TT-GDLG-SS,130-P4TT-HEX-XN,130-P4TT-HEX-XB etc. | 1 | 20,809 | $aa.aa | $aaa,aaa |
| BOS: COMBINER BOXES, DC WIRING | | unit | | | |
| 310-CBX-15S-15 | 15-input Combiner Box | cnt | 1,116 | $aaa.aa | $aaa,aaa |
| 400-W-ST2CB-12 | String to CB PV Wire AWG 12 CU XLP/USE-2/RHH/RHW-2 | Kft | 4,836 | $aa.aa | $aaa,aaa |
| 410-W-CB2INV-1 | CB to Inverter PV Wire AWG 1 CU XLP/USE-2/RHH/RHW-2 | Kft | 101 | $aaa.aa | $aa,aaa |
| 410-W-CB2INV-1/0 | CB to Inverter PV Wire AWG 1/0 CU XLP/USE-2/RHH/RHW-2 | Kft | 103 | $aaa.aa | $aa,aaa |
| 410-W-CB2INV-2/0 | CB to Inverter PV Wire AWG 2/0 CU XLP/USE-2/RHH/RHW-2 | Kft | 84 | $a,aaa.aa | $aa,aaa |
| 410-W-CB2INV-3/0 | CB to Inverter PV Wire AWG 3/0 CU XLP/USE-2/RHH/RHW-2 | Kft | 155 | $a,aaa.aa | $aaa,aaa |
| 410-W-CB2INV-4/0 | CB to Inverter PV Wire AWG 4/0 CU XLP/USE-2/RHH/RHW-2 | Kft | 296 | $a,aaa.aa | $aaa,aaa |
| LABOR | | unit | | | |
| -- | Pile Driving Labor | man-hr | 10,405 | $aa.aa | $aaa,aaa |
| -- | Pile Driving Equipment | man-hr | 10,405 | $aa.aa | $aaa,aaa |
| -- | Post Mobilization & Setting | man-hr | 5,202 | $aa.aa | $aa,aaa |
| -- | Foundation Layout | man-hr | 5,202 | $aa.aa | $aa,aaa |
| -- | Rack Assembly Labor | man-hr | 13,873 | $aa.aa | $aaa,aaa |
| -- | Module Mounting Labor | man-hr | 33,294 | $aa.aa | $aaa,aaa |
| -- | Combiner Install | man-hr | 558 | $aa.aa | $a,aaa |
| -- | DC Electrical Wiring | man-hr | 1,387 | $aa.aa | $aa,aaa |
| -- | Inverter Install | man-hr | 186 | $aa.aa | $a,aaa |
| -- | Grounding Install | man-hr | 3,468 | $aa.aa | $aa,aaa |
| -- | AC Electrical Equipment | man-hr | 156 | $aa.aa | $a,aaa |
| -- | Drainage Features, Erosion Control | man-hr | 0 | $aa.aa | $aa |
| -- | Access Road, Earthwork, Site Excavation | man-hr | 0 | $aa.aa | $aa |
| -- | Trenching and Backfill | man-hr | 6,546 | $aa.aa | $aaa,aaa |
| Engineering & Other Services | | unit | | | |
| -- | Design and Engineering | per kW | 99,882 | $aa.aa | $aa,aaa |
| -- | Engineering Drawings | per kW | 99,882 | $aa.aa | $aaa,aaa |
| -- | Construction Drawing Sets | per kW | 99,882 | $aa.aa | $aa,aaa |
| -- | Permitting, Wet Stamp, PE Certificate | per kW | 99,882 | $aa.aa | $aa,aaa |
| -- | Geotechnical Survey & Soil Reports | per kW | 99,882 | $aa.aa | $aa,aaa |
| -- | Detail Survey | per kW | 99,882 | $aa.aa | $aa,aaa |
| -- | Project Management | per kW | 99,882 | $aa.aa | $aaa,aaa |
| -- | Environmental Assessment Reports | per kW | 99,882 | $aa.aa | $aa,aaa |
| Miscellaneous | | unit | | | |
| -- | Shipping | per kW | 99,882 | $aa.aa | $aaa,aaa |
| -- | Subcontractor Overhead / Margin | per kW | 99,882 | $aa.aa | $a,aaa |
| -- | Contingency / HST Margin | per kW | 99,882 | $aa.aa | $a,aaa |

——— fixed ———

——— 1-axis-trackers ———

— 2-axis-tracker —

SYSTEM AND METHODS FOR SOLAR PHOTOVOLTAIC ARRAY ENGINEERING

CROSS-REFERENCE TO RELATED APPLICATIONS

This application claims benefit under 35 USC § 119(e) to U.S. Provisional Patent Application Ser. No. 61/994,416, filed 16 May 2014 and entitled 'Systems and Methods of Custom Solar Photovoltaic Array Design Optimization,' the disclosure of which is hereby incorporated herein in its entirety.

TECHNICAL FIELD

The present application concerns systems and methods for the automated design of solar photovoltaic power plants.

BACKGROUND

Technological developments designed to harvest solar energy have greatly accelerated in recent years. One particular aspect of this has been the use of photovoltaic (PV) modules consisting of a multitude of interconnected photovoltaic cells. Each solar cell produces about 0.6V when illuminated by sunlight, thus with a module of 72 such cells, can yield a total of about 40 volts or about 300 Watts. Arrays of modules form panels, mounted on a support system usually referred to as a rack. This includes not only roof-mounted systems but also commercial and large-scale ground-mounted utility plants designed to introduce the generated electrical power into the grid.

While this technology has become the world standard for solar energy harvesting, much of the technical aspects of PV implementations are still in rapid development. Solar cell technology is far from being settled, as efforts are being made to improve the amount of energy collected per unit dollar of investment. Thus every aspect of the PV design and its implementation in the field is under scrutiny in order to minimize the cost-to-benefit ratio. With rapid declines in the prices of solar modules in recent years, the cost of solar modules has become a significantly smaller fraction of the total cost of the photovoltaic power system. Besides the cost of modules, important factors can include: costs associated with the land procurement; labor for design, construction and management; materials for the electrical components of the solar plant itself and those components required to integrate the power into the local electrical grid, as well as the mechanical infrastructure; operations and maintenance (O&M) costs, cost of capital (e.g., loan repayments). These are all variables that can be potentially adjusted. More non-controllable factors, which can impact the productivity and profit of a PV solar plant, include the solar insolation at a given position on the Earth (latitude and longitude), geological conditions in soil or terrain, and the meteorological conditions, not only on a seasonal or annual basis, but perhaps on a diurnal basis as well.

To aid in understanding the overall problem, a few examples might help to clarify the situation and its inherent complexity. For instance, an obvious adjustable variable is the tilt (elevation of a PV module) towards the Sun. A lower tilt may produce less power but it results in such reduced wind loading that the structural costs are reduced. Moreover, a lower tilted panel also is subject to larger accumulation of dirt and debris. Additionally, a lower tilted panel could be subject to greater snow loading and thus greater structural costs. These are all considerations that impact the design of the PV panel structural support system.

Another variable that can be changed is the effectiveness of land utilization given how modules are organized at site. In other words, a variable that can change is the module packing density or ground coverage ratio (GCR: defined as panel dimension projected onto the ground divided by panel row spacing), as it can be optimized for maximum energy harvest or maximum return on investment. Another possibility is to align solar modules with different azimuths. This is particularly important as it can optimize the internal return of return (IRR) given a grid utility's Time of Day (TOD) payment factors. Since utilities pay more for electricity at peak times, they provide TOD tables that weight the value of the power produced to match their hourly demand. An internal-rate-of-return (IRR) maximized fixed structure will, when viewed as an entire array, be aimed at the most valuable azimuthal angle. For example, a utility in Arizona might want more of its production after 4 PM, while a utility a few hundred miles west in California could want more of its production between noon and 2 PM, and the optimal array for either of these scenarios would have a different azimuth.

One of the many technical factors that can impact a project financially is that of the electrical and mechanical module support system, impacted by local conditions such as wind, snow, soil conditions, and seismic conditions as well. There are three basic groups of support system designs that vary in their ability to adjust the position of the module towards the instantaneous position of the Sun. The first group involves a static rack that provides no instantaneous adjustment, and the position is permanently fixed. However, such racks can be seasonally adjusted but remain fixed in daily operation.

The second and third groups involve tracking the Sun to collect more solar light, accounting for the fact that the Sun does not move in a constant declination. Such a requirement has financial implications that are not readily obvious from a simplistic assessment of a PV power plant design, as its implementation and the form of this implementation yields opposing results.

The second possible module support system method is to move the module or panel along an axis (single-axis tracking), tracking the Sun as it moves across the sky in its diurnal arc. There are several implementations of this type of tracking: vertical single axis tracker; horizontal single-axis tracker; and equatorial or polar tracker. Each one of these variations of single-axis tracking possesses advantages and disadvantages and for particular needs and sites. An obvious advantage is that more solar power is collected. Disadvantages include either increased shading or decreased GCR, and greater costs in maintenance and/or replacement due to the larger number of mechanical and/or electrical parts. Even a specific type of single-axis tracker can have different tracking ranges, tilt angle, and tracking accuracies that depend on tracking methods.

The third method is dual-axis tracking, which provides movements that follow the diurnal and seasonal paths of the Sun. Each axis requires some sort of mechanism to provide the movement, normally by gearing and a motor. This type of tracking provides the most collected solar light, but because of the potential of shading of one panel to another at certain times of the day, there is a reduction in the attainable solar power collected. Thus a design with dual-axis tracking may require a greater separation between panels to reduce losses imposed by shading of one panel by another at extreme hour angles. Thus GCR is reduced.

Modules are usually warranted for several decades, but tracking systems that are robust enough to last a similar period of time, requiring no or little maintenance, are rare and expensive. Thus long-term maintenance of the mechanics of tracking along with availability risks have to be considered as part of the overall problem of designing a solar PV plant.

A static module support system eliminates the need for maintenance associated with a tracking system, and thus presents a viable option for optimal system designs, particularly in areas where O&M labor costs are high or areas that are closer to the equator where dual-axis tracking systems offer less of a performance advantage. Thus dual-axis tracking is more beneficial at more northerly locations. There are a great variety of static support systems, each of which possesses advantages and disadvantages.

A common approach for static, or fixed, racks is to cover an area with linear configurations of module arrays, with the long axis normally parallel to, or nearly so, a line of latitude. The modules are then oriented so that the normal to the PV module surface is oriented to maximize incident flux for a particular time of the year, at the declination when the sun crosses the local meridian. This is the tilt angle of a module. This traditional and commonplace approach makes the construction simple as a replication of a single design, such as the module support, is repeated as needed.

If a static support rack is chosen, then a decision is required to set the tilt and azimuth angles to particular values given a value of GCR. The tilt and azimuth angle would achieve a desired goal, such as maximizing energy that could be achieved over a certain period of time or during a certain part of the day. Importantly, other adjustable parameters include, height above the ground (or ground clearance), spacing between the rows of modules, and bank (permanent EW angle bias of a module, e.g., EW tilt). These all add complexity to designing a static support rack. For example, increasing ground clearance (height) increases structural and electrical costs but saves operational costs for the life of the project, and increasing row spacing decreases shading and increases system performance but also decreases GCR, while increasing electrical, module packing density, and operational costs.

In the case of bank, a geographic variation would be possible if the terrain of the site possesses irregularities. Moreover, it can be non-zero if there are other non-controllable aspects involved such as shading and persistent diurnal meteorological conditions.

Other local variations can also influence IRR or other figures-of-merit, such as soil conditions, site undulations, and local geographical features such as forests or buildings. Any and all of these can influence the energy collected. Grade or soil characteristics will also influence the selection of foundation or rack design. Costs that are affected by site-specific features are also important to take into consideration—for example, sites with sandy soil generate far less skin friction for ground penetrating piles than do sites with clay-like soil, and thus require far longer piles and higher costs.

Foundation type is one of many other variables that need to be considered as part of the design. These include above-ground concrete ballast, subterranean poured concrete foundation, post/pile driven, or ground screws. Bedrock that is just below the basal subsoil will require a different mounting approach.

Sites that have high load bearing characteristics and, for example, 5-12 feet of penetrable soil, are well suited for a pile driven module rack. On the other hand, if sites cannot endure surface penetration, landfills for example where landfill caps cannot be disturbed, then this will force the use of more costly above-ground footings, more costly above-ground electrical wiring conduits, and more costly inverter installations. All of these factors must be taken into account.

Other design variables are the costs and types of wirings for direct current (DC) and separately for alternating current (AC). Costs and warranties for inverter types, switchgear, power management systems, cooling equipment, combiner boxes, DC-DC optimizers, and energy storage facilities will also affect the optimum solution. A mechanical system design with higher energy production and lower cost than an alternative mechanical system design might require an electrical system with higher cost than the electrical system needed by that alternative mechanical design.

Modules are often clustered in strings in physical and electrical combinations that are sized according to GCR requirements, power requirements, and inverter input (as well as other variables, well-known to the person skilled in the art). For example, photovoltaic designers typically combine 18 to 21 modules into a string, and combine these strings to produce an array or panel. However, common practice is subject to change when other options, in concert with other parameters or variables, are taken into account.

Another example would be the design of a solar array with different rows of modules having different mechanical and electrical design parameters to optimize one user's needs. No current approach addresses this user or is able to find the optimum solution that could have, for example, the rows of panels on the peripheries of the array would require a different structural quality and wall thickness than the interior rows. This type of structurally optimum solution leverages the fact that interior rows see reduced wind loading due to the presence of the surrounding rows. Similarly no current approach is able to design different strings with different module and wiring configurations, or to design back rows that can have higher tilts due to lack of shading concerns.

Computer-aided performance optimizations are also in a rudimentary form. For instance, consider the literature available on "tilt" optimization. Some suggest tilt angles that are simple functions of latitude, but this fails to consider site specifics (such as typically cloudy winters or morning fog in summer). At best, some consultants offer to provide "tilt optimization" services as a detailed, hands-on process. No other tools allow one to run a "batch" of simulations at various tilt angles to determine the best angle from a performance perspective.

While all of these approaches work to a degree, they are either overly simplistic or laborious, and thus time consuming. Given the somewhat large number of variables and constraints involved, no design of a solar power plant or array can be accomplished in even a finite amount of time that is reliably accurate, detailed, and optimized (financially or otherwise).

There are several existing tools that will help facilitate the look of what a PV plant will look like when imposed upon, say, an image from Google Maps or other equivalent mapping service. Boundary points are interactively defined and with various parameters selected (row spacing, PV module type) the program will present a first-order look of a design. There is neither any optimization nor any automated design production in such approaches.

A few services (e.g., Helioscope from Folsom Labs; Helios3D from Schletter GmbH) exist to define a visual design automatically based on a user's input. However, these methods are suboptimal for the extensive task to be performed. A basic design is derived and the parts replicated ad nauseum; this is essentially multiplying a number of parts for a Bill-of-Materials (BOM) for a solar "kit" to fill the desired geographic area or capacity needs. There is no direct customization of the parts or configuration of the modules. These attempts at design culminate in a single fixed design.

In addition to these visual design programs, there are a variety of PV plant simulators that have been developed. The best and most useful is that of the System Advisor Model (SAM) developed by the US National Renewable Energy Laboratory. It provides a simulation based upon extensive input parameters.

In current practice, simulations are already used to determine the performance of a design. Unfortunately, the process of refining that design is not automated. For example, there is no optimization within current standard simulations; that is, current practice does not simulate multi-variable mechanical and electrical design parameters, multi-dimensional considerations including meteorological, environmental and cost factors, or a specific solar project's optimization goals.

At present the industry lacks sufficiently detailed tools to aid in the evaluation of the plurality of inputs and outputs of various system designs, given the large number of variables or parameters involved. The number of permutations of the design parameters rapidly becomes so large that it is infeasible to attempt to "brute force" an optimal solution by simply evaluating the system model for every possible permutation. For this reason, the solar industry typically uses excessive standardization in photovoltaic project design and ignores more effective solutions to handle large numbers of permutations. This is in stark contrast to the lack of granularity in sensitivity analysis that can be achieved with the standard few iterations of a human PV design engineer or team of engineers.

SUMMARY

At present the industry lacks sufficiently detailed, automated, and flexible interdisciplinary engineering tools to aid in the evaluation of the plurality and complexity of inputs and outputs of various system designs of solar photovoltaic power plants, given the large number of variables and constraints, and the multi-dimensional nature of the problem. The number of permutations of the solar photovoltaic design parameters rapidly becomes so large that it is infeasible to attempt to "brute force" an optimal solution by simply evaluating the system model for every possible permutation. For this reason, the solar industry typically uses standardization in photovoltaic project design and ignores more effective solutions to handle large numbers of permutations. An effective solution to such a multivariate and interdisciplinary problem has the potential to improve system efficiency and economics of solar power.

The systems and methods of the present application are herewith disclosed to overcome this deficiency in the solar photovoltaic power plant design and engineering industry. The approach is basically to define one or more goals that are to be optimized, either collectively or singly, by adjusting one or more design variables while being constrained by input specifications and rules. Such goals or figures-of-merit are mathematically represented by one or more objective functions, a preferred Pareto solution of which are used to design the solar power plant.

In a set of embodiments an automated site engineering design system to design an optimized solar array of photovoltaic panels is disclosed: the design system comprising a user input interface; a set of databases; one or more objective functions; a component definition feature which determines the nature and locations of the various components that comprise the power plant; an automated output specifications generator, which takes the preferred Pareto solution and produces the documents, reports, manuals and drawings necessary to implement the power plant; one or more layout features that produce the designs of the specific layout, e.g., the layout of a panel support, the layout of the wiring, the layout of the inverters, the layout of trenches for electrical conduits, the layout of the rows of panels, the layout of the access roads, and the interconnection layouts between all electrical components such as modules, inverters, DC-DC optimizers, power management systems, transformers, switchgear, and one or more inverters. To implement the power plant is to perform at least one of the following: to manufacture the requisite components, to assemble the components, and to install said components at the site.

Input specifications include all characteristics of the components and material that comprise the electrical design and the mechanical or structural design of the solar power plant. These comprise numerical constraints, as well as rules to be honored during the design. The input specifications also include building codes and regulations, electrical codes and regulations, regulatory agency specifications, site meteorological constraints, installation and operational labor constraints, site shading constraints, site geographic or geological constraints, site thermal constraints, site soil constraints, and site seismic constraints, as well as financial and economic constraints. Extensive databases exist to provide these input specifications, but also to interact with any module, step, or process that involves computations or optimizations.

The array engineering design system generates an optimized solar array design constrained using input specifications and design variables and customized to the goals of the solar power system owner. The system can thus prevent the generation of a design that requires tools, processes, and materials other than the predefined set of tools, processes, and materials; and, an automated specifications generator having an input for receiving said optimized solar array engineering design and producing output specifications, reports, drawings, calculations and manuals needed to manufacture, to apply for permit, and to install said optimized solar array.

The following objective functions comprise those used in the disclosed embodiments of the present application: maximum internal rate of return, minimum payback period for investment, minimum nominal levelized cost of electricity, minimum real levelized cost of electricity, minimum total capital cost, maximum internal rate of return given a specific maximum capital cost, maximum internal rate of return given a specific maximum site areal coverage, minimum DC wiring volume (length divided by gauge), total cost of electrical components, total cost of operations and maintenance, total cost of the installation of the electrical components, total cost of structural components, total cost of site preparation, total cost of the installation of structural components, maximum internal rate of return given solar power time of use factors, payback period, net present value of system, and max power density collected. A multi-objective function can be defined by a summation of other objective functions (or other mathematical combination thereof) and a weighting scheme can also be introduced such that certain objective functions are given greater importance that others. An automated decision maker is able to select preferred Pareto solutions based on various criteria, including a predetermined weighting scheme.

The output specifications provide detailed information regarding one or more types and numbers of solar panels, one of more types and numbers of structural components, one or more types and numbers of inverters, switchgear, grounding equipment, one or more types of wiring, wiring layouts, one or more DC-DC optimizers, one or more max-power-point trackers, one or more transformers, one or more energy storage devices, and one or more power management systems, combiner boxes, bill-of-materials for solar array, costs of individual structural components, costs of individual electrical components, special coating requirements, wire and conduit schedules, single line diagrams, labeling lists, CAD drawings and files, digital list of accurate site positions, permit drawings, permit calculations, construction drawings, civil diagrams, production drawings, and plant layout.

The one or more rules may include one or more of the following characteristics: a limitation imposed by the longitude/latitude of the site; limitations imposed by the size, terrain, and geometry of the site; a limitation imposed by the type of PV module to be used; a limitation imposed by the amount of grid electrical power; a limitation imposed by the available funding; a limitation imposed by the seismicity of the site; a limitation imposed by the meteorological conditions found at the site; a limitation imposed by the amount of electrical energy to be produced; a limitation imposed by the costs of finance; a limitation imposed by the soil and bedrock of the site; a limitation on the maximum losses due to electrical components; a limitation imposed by the use of maximum power point tracking electronics; limitations imposed by local safety agency regulations and specifications such as building codes, and electrical code specifications.

The optimization process is often an iterative one, as the design of one area might affect the design of another, and thus repeated computations are commonplace until a convergence occurs. The systems and methods presented herein can also be performed by a sequence of optimizations, in which each step in said sequence comprises optimizing one or more objective functions, a set of input specifications comprising numerical constraints, one or more rules, and a set of design variables; a design is optimized based upon these objective functions, and one or more of the generated output specifications are then used in a subsequent optimization thus improving the design moreso. Thus an optimal design is arrived at by executing each step of sequence of optimizations, evaluating the results of each optimization of each sequence, adding one or more constraints generated from results of an earlier step of said sequence to the set of constraints of a next step in said sequence; and, generating a set of output specifications based on the results of the last step in said sequence.

In another aspect of the present application, a decision maker is introduced into the evaluation of the results of the computations and/or optimizations that can direct the systems and processes to the next step. The decision maker can be an automated system or a human agent. One mechanism for automation is by defining a weighting vector determined by a decision maker.

In another aspect of the present application, a method is disclosed of identifying a set of designs compliant with one or more constraints within a constraint set defined by input specifications, providing an objective space of at least one objective and a space of design variables, examining a plurality of designs that comply with at least one constraint of said at least one objective, identifying according to said examination, a set of designs from said plurality of designs that have corresponding design variables, in said design variable space, that are within a range of selected extrema within said design variable space and which are members of the Pareto solution set; and, displaying, storing, or further processing said set of designs. A virtual space can be defined within this context that represents the site and the terrain of the power plant. A plant layout feature is also defined in which a user can place components at locations within the virtual space. One or more of the design variables can also be civil design variables.

The virtual design space can provide component icons representative of said complement of components; and, allowing said user to move said icons in said virtual space to define said component locations. There can be an automatic arranging of the location of the component and automated adjusting said virtual space to fit said arrangement of said component locations. The adjustments can be implemented using the optimization techniques outlined hereinabove.

In another aspect of the present application, the detailed system design including civil, mechanical and electrical design of the solar PV power plant can be achieved with one or more goals in mind. Possible methods can include minimizing the total cost and maximizing the overall rate of return, based upon the selected input specifications, selecting a set of design variables, and selecting a set of design variables comprising one or more of the following components: types and numbers of photovoltaic module, numbers and types of structural components, types and numbers of inverters, types and amounts of wiring, the numbers and types of inverters, the numbers and types of transformers, the numbers and types of power management systems, and the numbers and types of energy storage devices. With these input specifications, and optimizations, a Pareto set of detailed solar system designs can be obtained and the output specifications generated.

In another aspect of the present application, an electrical design of the solar PV power plant can be achieved with one or more goals in mind. Possible methods can include minimizing the cost of the electrical design and maximizing the overall rate of return, based upon the selected input specifications, selecting a set of design variables, and selecting a set of design variables comprising one or more of the following electrical components: types and amounts of DC wiring, types and numbers of photovoltaic modules, types and amounts of AC wiring, the numbers and types of inverters, the numbers and types of transformers, the numbers and types of power management systems, the numbers and types of DC-DC optimizers, types and numbers of maximum power-point trackers, the numbers and types of combiner boxes, warranties for electrical components, and the numbers and types of energy storage devices. With these input specifications, and optimizations, a Pareto set of electrical designs can be obtained and the output specifications generated.

In another aspect of the present application, the mechanical and structural design of the solar PV power plant can be achieved with one or more goals in mind. Possible methods would include minimizing the cost of the structural design and maximizing the financial return of the project, based upon the selected input specifications, selecting a set of design variables, and selecting a set of design variables comprising one or more of the following structural components. With these input specifications, and optimizations, a Pareto set of structural designs can be obtained and the output specifications generated.

As part of the cost estimate aspects, site imagery (e.g., satellite) can be used to estimate the amount of effort to prepare a particular site for receiving a solar PV power plant. This involves estimating the amount of earth to be moved from DTM data, the amount of vegetation that needs to be removed, by the use of segmentation (to isolate the site and any areas within that site for identification based on its closed nature, entropy, and energy. Metrics all derived from analyses of multi-color imagery of the site location. The 3D profile of the terrain (DTM, digital terrain model) of the site is important for two reasons. First, the amount of earth that needs to be moved or graded to facilitate a more appropriate area for the placement of the power plant. An estimate can be derived as to the amount, just from modeling with a low-order 3D surface (the desired shape of the terrain of the site), and deriving a statistic (e.g., variance) between the actual 3D profile and the low-order model which would correlate with the amount of earth to be moved or the amount of effort to prepare the site. Thus a contribution to the overall project cost of site preparation will be derived assuming local rates for time, equipment, and labor or site reshaping/preparation.

In addition to altering the 3D profile of a site for a power plant, another estimate that enters into the overall cost estimate is the amount of vegetation, such as trees and shrubbery, which needs to be removed in advance for the site preparation. This can be estimated from one or more images of the site in differing wavelengths. The length of a shadow cast by an object, a tree for example, estimates its size and/or height above the ground. The images can be digitally processed by known image processing techniques, such as segmentation, and measurable quantities such as energy and entropy, to produce one or more metrics that correlate with the amount of work to be performed to prepare the site. An area within a site can be identified first by segmentation and then identified as a pond by being a closed structure and also using the values of energy and entropy within that area as compared to areas external to it.

Other aspects, objects, systems, processes, and features disclosed in the present application will become apparent when viewed in light of the detailed description and preferred embodiments when taken in conjunction with the attached drawings and claims.

Embodiments may be implemented in hardware and/or in software (including firmware, resident software, microcode, etc.) Furthermore, example embodiments may take the form of a computer program product on a computer-usable or computer-readable storage medium having computer-usable or computer-readable program code embedded in the medium for use by or in connection with an instruction execution system. In the context of this application, a computer-usable or computer-readable medium may be any medium that can contain, store, communicate, propagate, or transport the program for use by or in connection with the instruction execution mechanism, apparatus, system, or device.

Computer program code for carrying out operations of data processing systems presented herein may be written in a high-level programming language such as Java, AJAX, C, and/or C++, for development convenience. In addition, computer program code for executing operations of example embodiments may also be written in other programming languages such as, but not limited to, interpreted languages.

BRIEF DESCRIPTIONS OF THE DRAWINGS

FIGS. 6(A-D) depict four possible forms of reporting results from the systems and methods presented herein. FIG. 6(A) is the predicted annual cash flow (in USD) over the lifetime of a design of a solar PV power plant. FIG. 6(B) shows a typical predicted monthly production of energy (in MWhr) for a given year. FIG. 6(C) is a chart showing the predicted monthly revenues (in thousands of USD) generated by a power plant for a one year period. FIG. 6(D) shows the predicted total annual output (in GWhr) for a PV power plant over the lifetime of said power plant.

FIG. 7 is an exemplar of a bill-of-materials for a solar power plant.

Figures 8A, 8B:
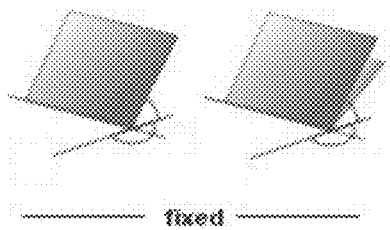
Figures 8C, 8D, 8E:
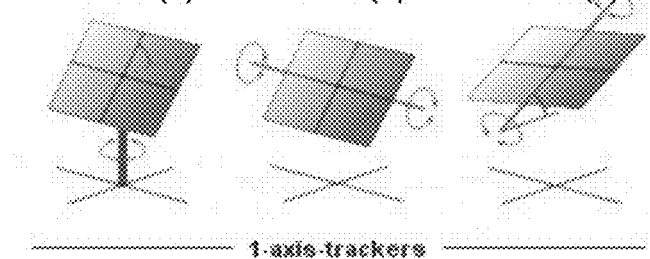
Figure 8F:
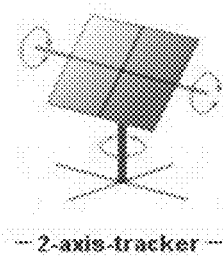

FIGS. 8(A-F) show six different types of tracking modes with the rotational directions indicated, if applicable. FIG. 8(A) is fixed or static system. FIG. 8(B) is a fixed or static system that can be adjusted in tilt to accommodate seasonal solar declinations. FIG. 8(C) is a vertical single-axis tracker (VSAT). FIG. 8(D) is a horizontal single-axis tracker (HSAT). FIG. 8(E) is an equatorial or polar single axis tracker. FIG. 8(F) is a two-axis tracker.

Figure 9A:
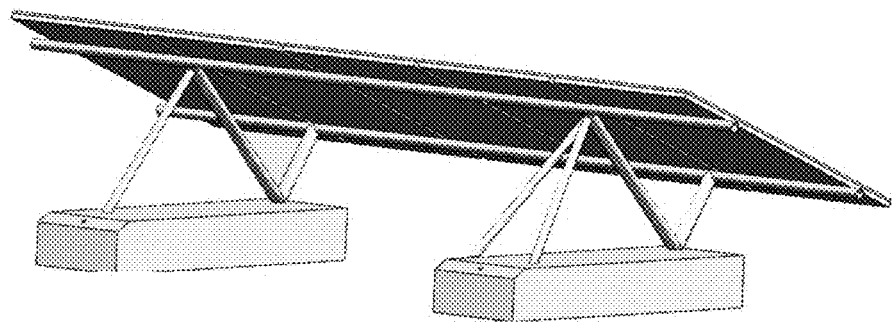
Figure 9B:
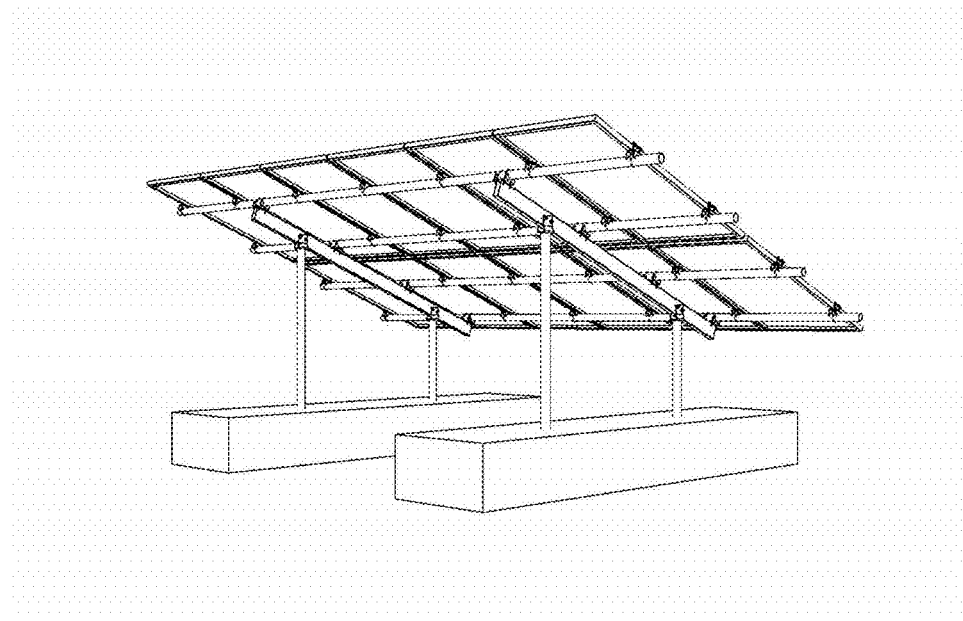

FIGS. 9(A-B) depict two ballasted PV panels. FIG. 9(A) shows a PV panel (plurality of PV module) supported by two rails which are in turn supported by two ballasted Z-racks: the right one providing more lateral stability than the left one. FIG. 9(B) is a four-pole system the lower ends of which are embedded in the ballast.

FIGS. 10(A-D) show four possibilities for pile-driven support systems. FIG. 10(A) is a four-post pile driven support. FIG. 10(B) is a two-pile driven support with a variation of the upper support, which holds the modules. FIG. 10(C) is another variation of a two-pile driven support system with an alternative panel support design. FIG. 10(D) is an HSAT variation of FIG. 10(B).

Figure 11:
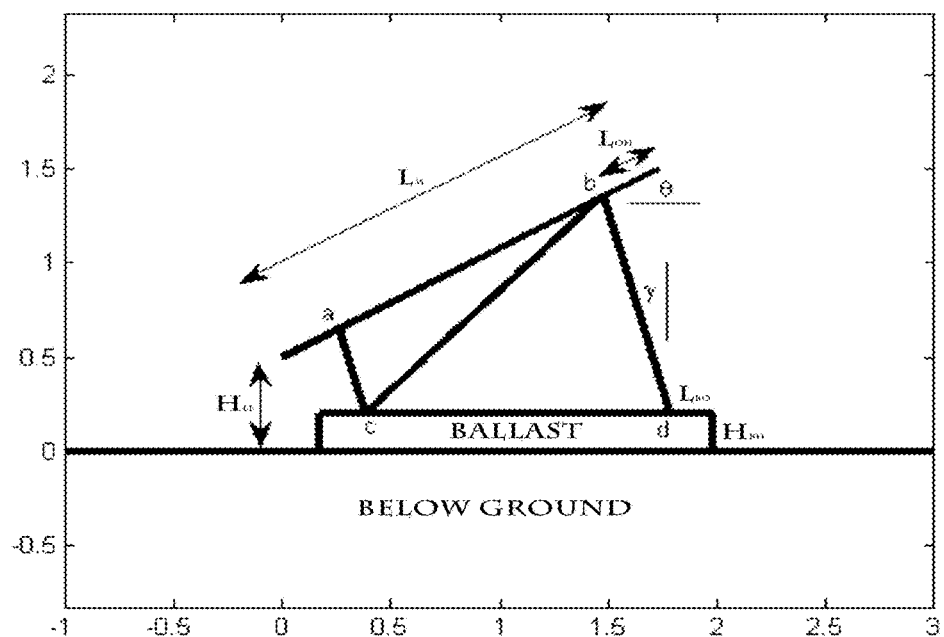

FIG. 11 is an elevation side view of a ballasted Z-rack design with the various design parameters indicated.

Figure 12:
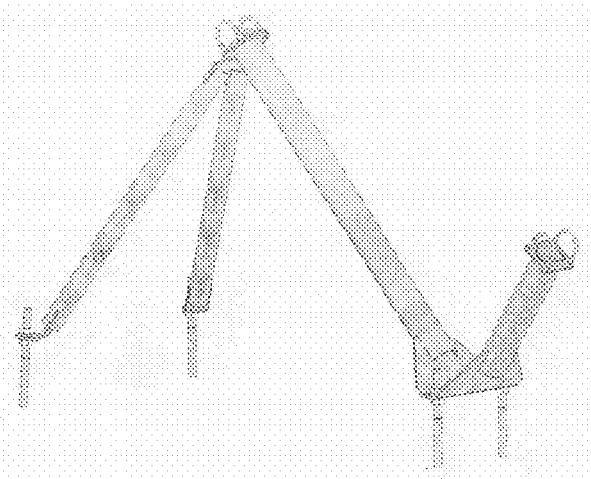

FIG. 12 is a perspective view of bi-pod variation of the Z-rack support system. This design provides greater lateral stability should it be recommended by the optimization systems or processes.

Figure 13A:
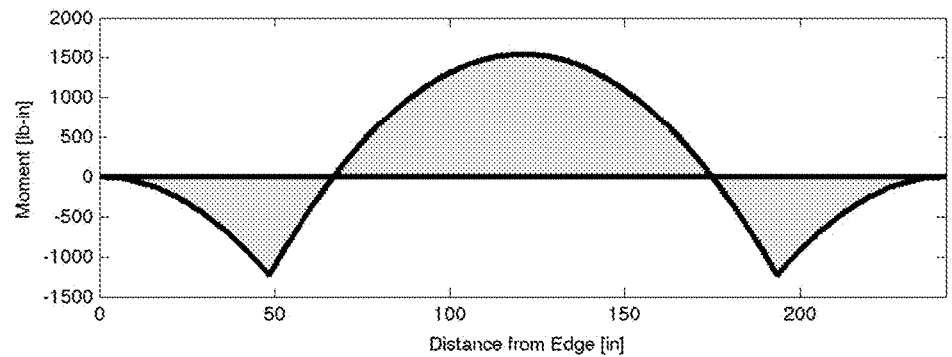
Figure 13B:
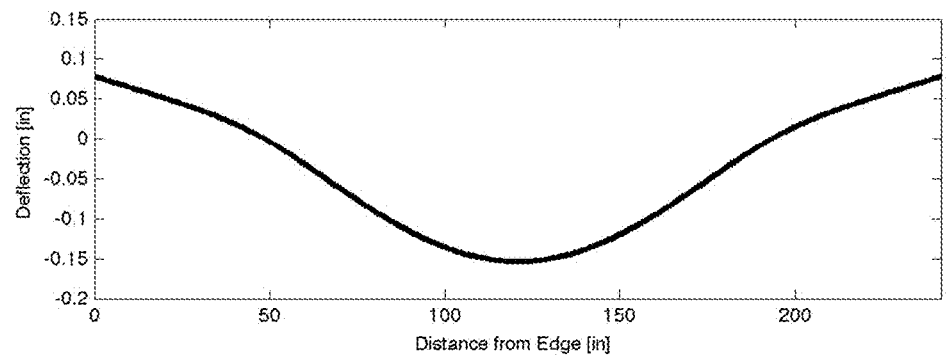

FIG. 13(A) is a plot of the moment on an EW horizontal tubular rail carrying the modules vs horizontal distance from the edge. The abscissa is measured in inches, while the ordinate axis is measured in pound-inches. FIG. 13(B) is a plot of the physical deflection of the rail vs. horizontal distance from the edge. Both abscissa and ordinate axis are measured in inches.

FIGS. 14(A-D) show design variations on configurable ballasts. FIG. 14(A) is a ballast form appropriate for the ballast of the support system shown in FIG. 9(B). The ballast form size is scalable. FIG. 14(B) is an alternative ballast form, also applicable to the support system of FIG. 9(B). In this case the sides are made of plywood or other cheap materials. FIG. 14(C) is an exploded view of another configurable ballast form, one which is created by the joining together of two identical forms. The length of the form is adjustable (thus the weight and the ground footprint of the ballast) depending upon the recommendation of the optimization systems or processes. FIG. 14(D) depicts the two forms of FIG. 14(C) joined together to make a ballast form.

Figure 14A:
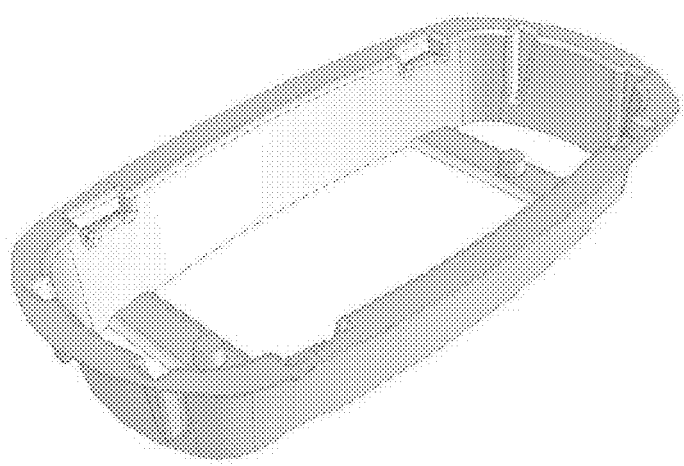
Figure 15:
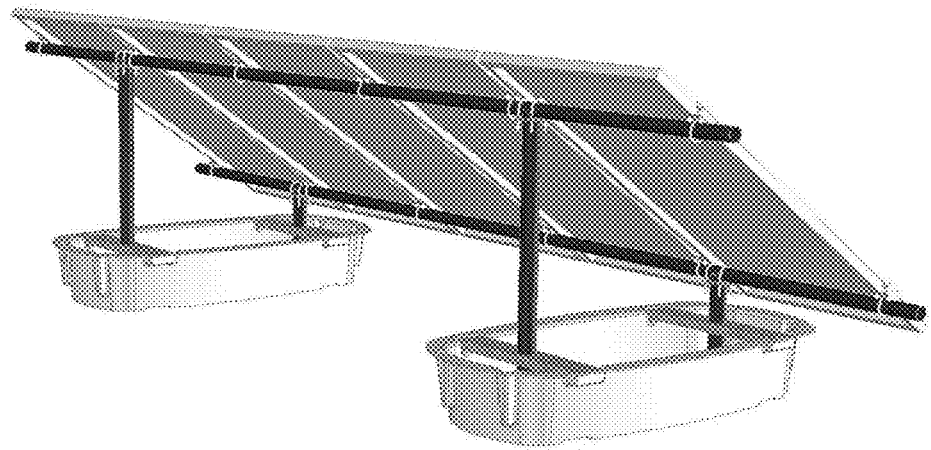

FIG. 15 shows the implementation of the ballast form of FIG. 14(A) in a ballasted support system.

Figure 16:
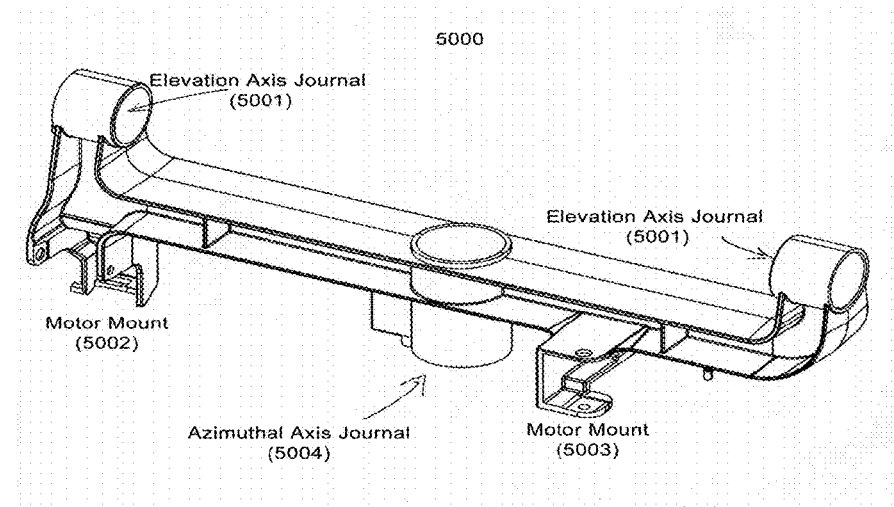

FIG. 16 depicts an exemplar of an armature or yoke which supports one or more PV modules. The armature possesses gearing, journals, and motors to implement 2D tracking of the sun during the year.

Figure 17:
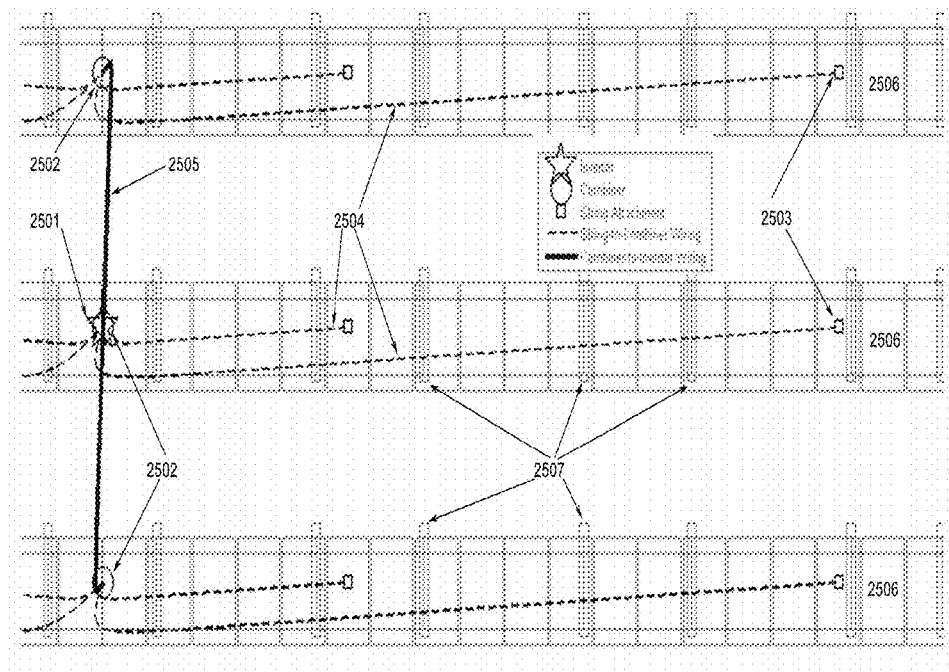

FIG. 17 shows an exemplar of an optimized electrical design for three rows (partial views) of PV panels with string, inverter, and combiner boxes indicated.

Figure 18:
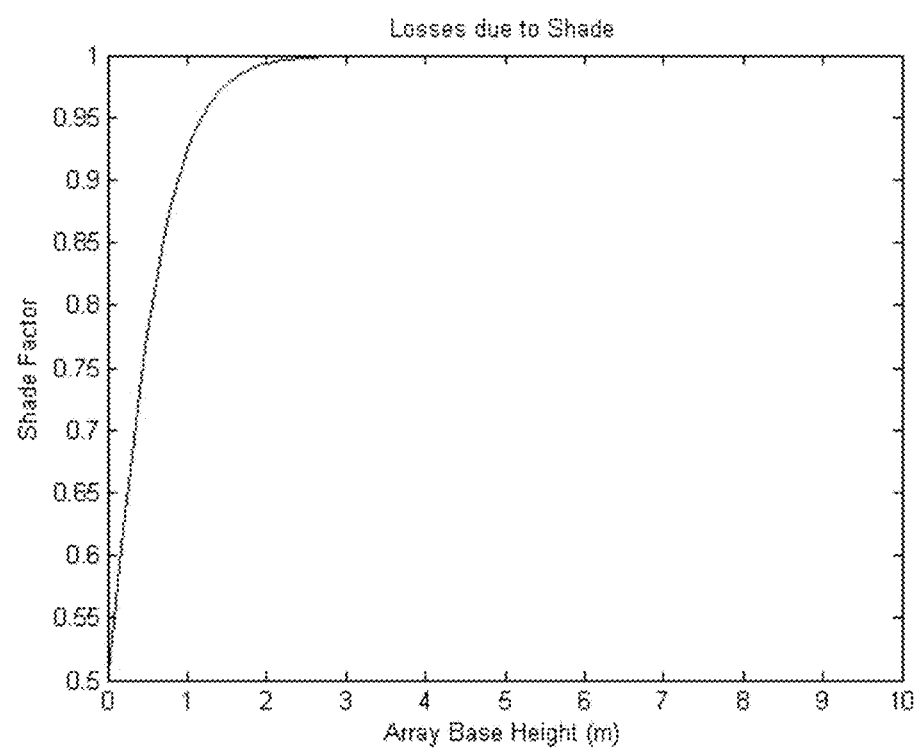

FIG. 18 is a shading graph that indicates the shading factor that one row of PV panels suffers from an increase in height of the row immediately in front of it.

Figure 19:
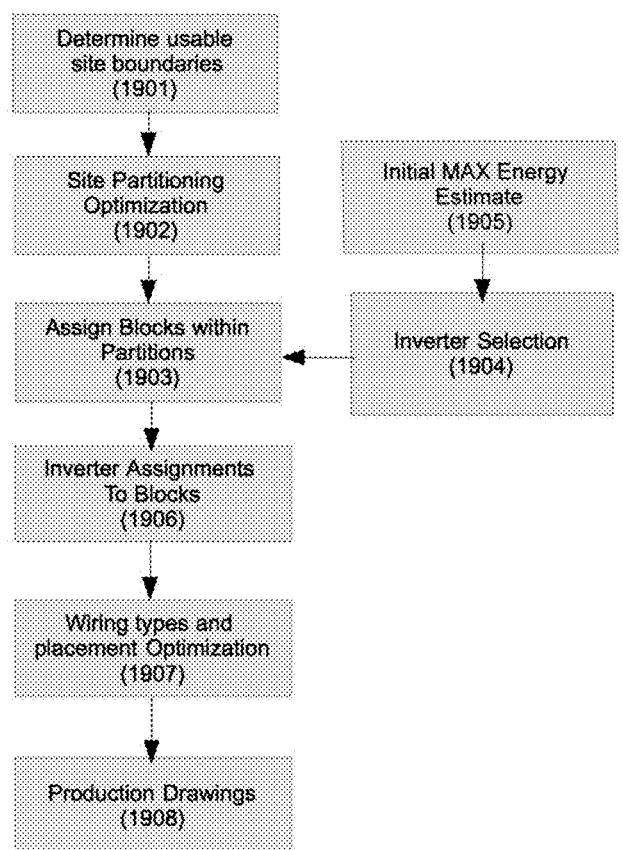

FIG. 19 is an embodiment for the optimization of an electrical design of a PV array when there is to be maximum energy collection with the available land.

Figure 20:
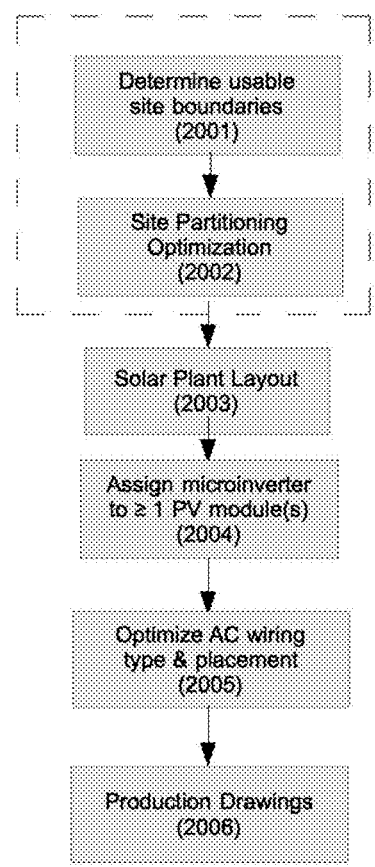

FIG. 20 is an embodiment for the optimization of an electrical design of a PV array when microinverters are to be used.

Figure 21:
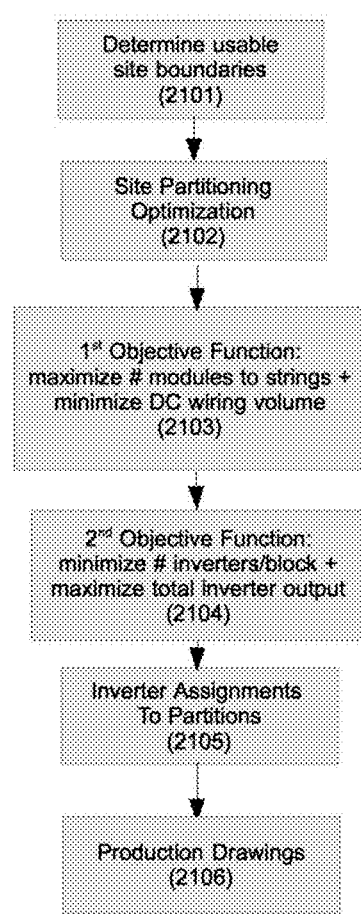

FIG. 21 is an embodiment for the optimization of an electrical design of a PV array when string or central inverters are to be used.

Figure 22:
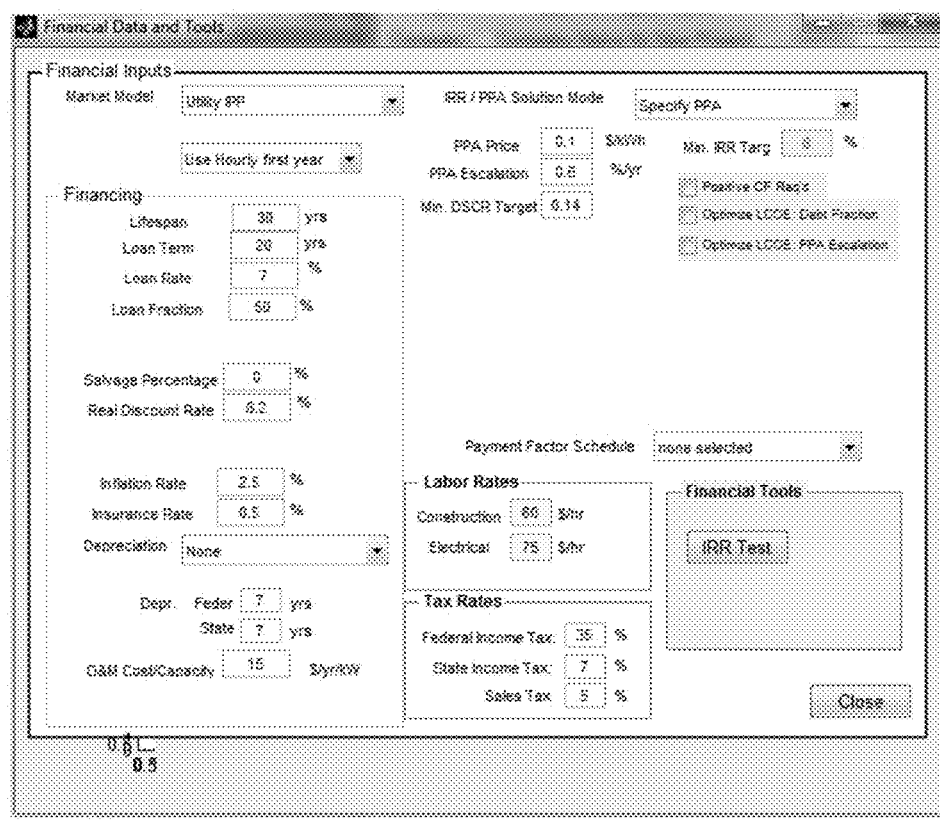

FIG. 22 is an exemplar that depicts an input interface or GUI for specifying financial input specifications and options.

Figure 23:
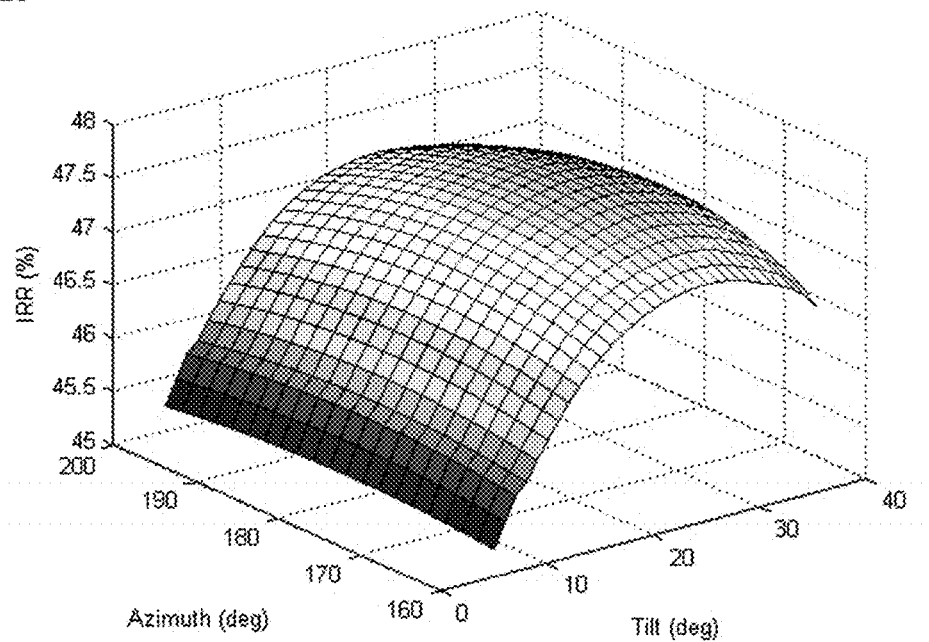

FIG. 23 is an exemplar of a perspective diagram showing the IRR (in %), as a function of both azimuth and tilt of a module or panel. The units are degrees.

Figure 24:
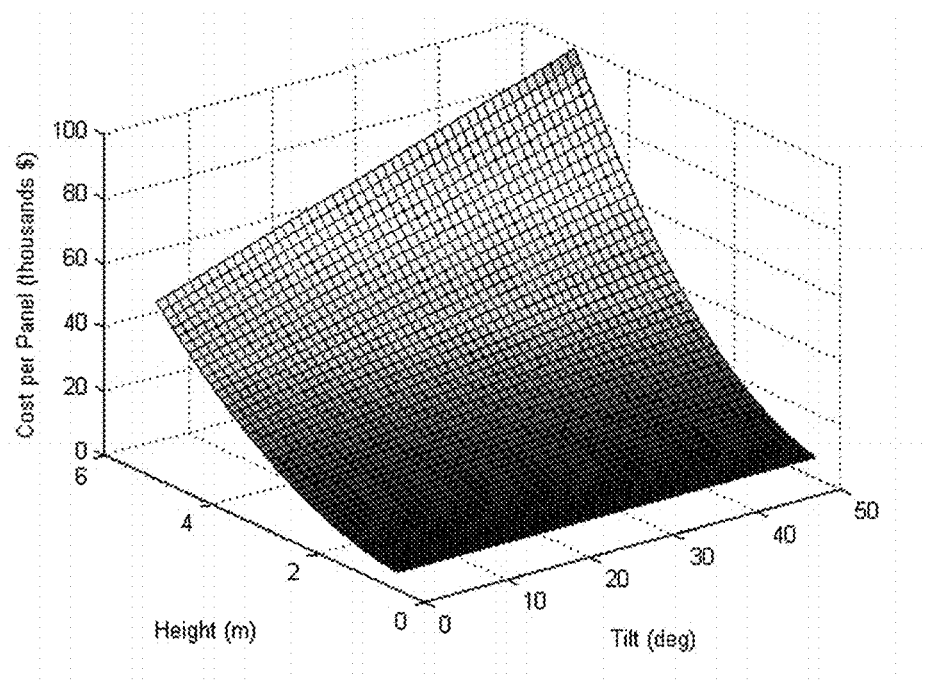

FIG. 24 is an exemplar of a perspective diagram showing a relationship between the cost per panel as a function of tilt and height for a certain set of input parameters. This is one way to inspect the effectiveness of a given design by visualization of varying design variables.

DETAILED DESCRIPTION

Figure 1:
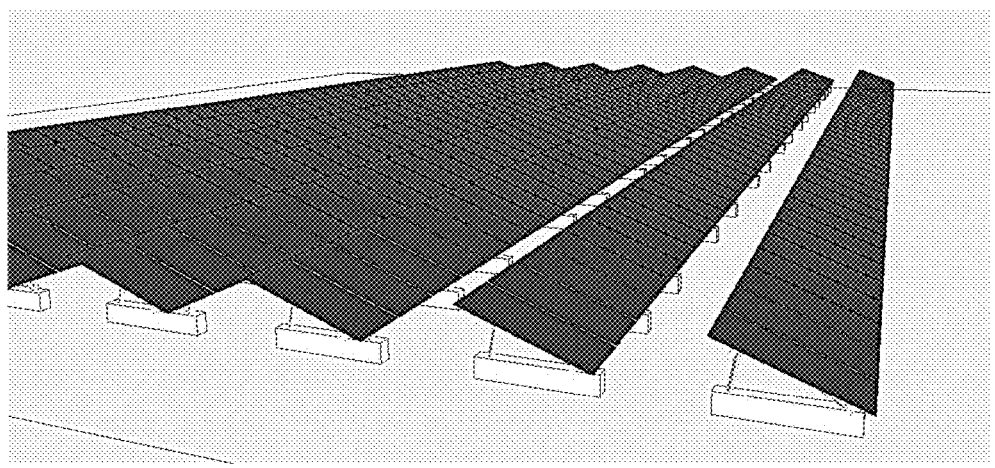
FIG. 1 is a perspective depiction of a solar photovoltaic array or power plant. The support structure upholding the panels of PV modules is based on a concrete ballasted Z-rack.

The present application describes embodiments to optimize the design of a solar Photovoltaic (PV) power plant from the numerous ostensible configurations. A schematic of what a solar PV power plant might look like is shown in FIG. 1, where PV modules are assembled into PV panels and supported by rows of structures that are, in this depiction, ballasted by above-ground concrete blocks.

The embodiments presented herein comprise automated and semi-automated custom power plant design systems and methods to design a solar power plant that satisfies one or more optimization goals based upon a large collection of input specifications and other constraints such as rules based, at the least, on structural, electrical, topographical, meteorological, and seismic limitations. Optimizations are typically iterative.

One or more figures-of-merit are defined to guide the overall design. The end-products of this transformation are a set of tangible output specifications for the optimal power plant design that satisfy the input specifications, comprising, at least, numerical constraints and one or more rules or limitations. These output specifications can then be directly used to assess feasibility of development, apply for local, state or federal permits, manufacture, assemble, and install the power plant.

In another aspect of the present application, an automated output specifications generator is disclosed which takes the input specifications (or a subset thereof) and one or more design variables of an optimized design and produces all the desired drawings, specifications, and procedures for implementing (i.e., at least one of the following: manufacturing, assembling, and installing) the solar power plant.

An alternative to producing output specifications of a design is to produce a feasibility study. This can be achieved by generating and presenting several possible and alternative optimized designs. These can be generated based upon minimal information, such as site location and size of a solar power plant. The systems and methods of the present application are able to produce preliminary designs based upon different standard sets of input specifications. One example of a set of feasibility studies might involve maximizing the IRR, maximizing the total energy production, minimizing preliminary total cost of the project, minimizing LCOE, etc. for each of the three tracking modes (static, 1D, and 2D) at a given site.

In optimizations, a figure-of-merit is mathematically represented by an objective function containing a designated set of variables that will be optimized to find the best overall solution or solutions. The optimization problem may have only one objective function (OF; or cost function or figure-of-merit; known as a single-objective optimization problem), or it may have multiple and (possibly) conflicting objective functions (known as multi-objective optimization problem). A mathematical combination of objective functions can be a weighted sum or a convolution. These approaches and others are used in the present application to achieve an optimum solution (or solutions, should they exist) for the design, manufacture, and implementation of a solar PV power plant.

Figures-of-merit can include internal rate-of-return (IRR), a payback period for investment, a cost-to-benefit metric, a cost-to-benefit-to-risk-factor metric, amount of collecting area, levelized cost of electricity (LCOE), amount of electricity produced in a given time period, a statistic as to the amount of solar energy collected (mean, median, mode) over a period of time, the profit of the investment over time or at the end of a particular period of time, volume or cost of wiring used, mass or cost of structural materials, maximum amount of solar energy collected given a usable land area constraint, or a maximum output during the greatest load on a grid. Individual figures-of-merit may be weighted or unweighted, according to the need of the user. The APPENDIX lists some of the possible components and terms that can be used to define any figure-of-merit to the design of a solar PV power plant, as well as mathematical definitions of specific ones such as IRR and LCOE.

A subset of the information (design variables) used to optimize these aforementioned one or more figure(s)-of-merit include selection of a PV module (including flat, flexible, and bifacial), curvature of a flexible PV module (if applicable), type of tracking, type of foundational support, characteristics of the support system (including module tilt, height, azimuth, bank, row spacing) and layout at the module, panel, row, and site level. Also included is the electrical layout feature or system and the components that comprise said electrical layout. The electrical layout feature or process identifies the location where these electrical components are to be placed and their interconnections. The electrical layout feature has internal optimization systems and processes. These components comprise various PV modules, various types of DC wiring, various types of AC wiring, various types of inverters, various types of transformers, various types of energy storage units (such as batteries, inductors, fuel cells, and capacitors), switchgear, power management systems, as well as various types of combiner boxes.

The trade-offs between various input specifications, with numerical constraints and rules, and the design variables are far from being obvious given the excessive complexity and decidedly non-orthogonality of the many possible inputs involving the overall problem. The embodiments of the present application address a long-sought need, which will improve not only efficiency of the plant as an energy collector (thus improving the financials), but the efficiency of the installation of said solar plant as well.

Generalized Multi-Objective Optimization Problem

The multi-objective optimization problem is often stated as: min $F(x)=(f_1(x), f_2(x), \ldots, f_k(x))^T$, where $x=(x_1, x_2, \ldots, x_n)^T$, is the design vector, $f_1(x), f_2(x), \ldots, f_k(x)$ are the k objective functions or objective vector, $(x_1, x_2, \ldots, x_n)$ are the n optimization (design) variables, and min represents the minimum. This determination is subject to various constraints: $g_j(x_i) \leq 0$, $h_k(x_i)=0$, and limitations or bounds: $x_i(L) \leq x_i \leq x_i(U)$, where the indices are j=1, 2, . . . , J; k=1, 2, . . . , K; i=1, 2, . . . , N. Inequality constraints are given by $g_j(x_i)$ and can be greater than a certain value, less than, or limited by upper and lower limits. Equality constraints are given by $h_k(x_i)$. These constraints represent some functional relationships amongst the design variables and other design parameters (input specifications such as numerical constraints and one or more rules or limitations) which satisfy certain physical phenomena and certain resource limitations. Although the optimization defined above is minimization, the other extremum, maximization, is just the negation of minimization. The space in which the objective vector belongs is the objective space, and the image of the feasible set under F(x) is the design space or design variable space. All of these spaces can be represented in a virtual computer environment.

One way to define a multi-objective function is by way of summation: $F(x)=\sum_{i=1}^{M} \lambda_i f_i(x)$, for M single objective functions, where is $\lambda_i$ a weighting function or constant, which is normally, but not necessarily universally, assigned via user interaction. This approach is one of the possibilities that can be used in the present application. The components of a weight vector will be the individual weights $\lambda_i$.

A multi-objective optimization task results in a set of optimal solutions, known as Pareto-optimal solutions each portraying a trade-off between the various objectives. There exists a plethora of classical and evolutionary approaches to arrive at a number of such Pareto-optimal solutions iteratively and reliably (Deb et al. 2001; Coello et al. 2002). These solutions satisfy certain conditions involving gradients of objective and constraint functions.

The space formed by the objective vectors of Pareto optimal solutions (also known as non-dominated or efficient) is known as the Pareto optimal frontier. Any final design solution should be a member of the Pareto optimal set. If the solution is so chosen, then there would not exist any solutions that are better in all attributes. Without additional subjective input, all Pareto optimal solutions are considered equally good. A solution to an optimization that is not expressly a Pareto solution is likely to have been identified by a local extremum, and not a global one.

Optimization methods can be divided into derivative (e.g, gradient) and non-derivative methods (e.g., evolutionary or genetic). It is preferable, but not mandatory, in the present application, to use non-derivative methods, as they are more suitable for general engineering design problems. However, these systems and methods disclosed in the present application are not limited to one approach over another. One reason is that non-derivative methods do not require any derivatives of the objective function in order to calculate the optimum. Another advantage of these methods is that they are more likely to find a global optimum, and not be stuck on local optima as gradient methods often do.

In the case of gradient-based methods, one or more of the following are applicable to the problems posed in the present application: simplex, SLP, SQP, exterior penalty, interior penalty, generalized reduced gradient, method of feasible directions, gradient descent, conjugate gradient, and mixed integer programming (Polak 1997).

For a general design problem, it is hard sometimes to express objective functions in terms of the design variables directly. A variety of computer-aided engineering tools are available today, which allow the designer to estimate the performance of the design in an early stage of the design process. Such design tools might include CAD packages (e.g., Solidworks, Pro/E), FEA software, CFD solvers, self-write simulation codes, commercial multi-purpose modeling and simulation packages such as Matlab, spread sheet programs such as Microsoft Excel, and many more. The objective function can also be composed of a mixture of numerical simulations, analytical calculations as well as selections from databases among other things.

There are also other techniques to conduct engineering optimization, for instance neural network optimization and response surface approximations, as well as Taguchi methods and other statistical methods. It will be readily recognized by the ordinary person skilled in the art, that there are many mechanisms by which optimizations can be achieved.

The most preferred methods of the present application are those of genetic algorithms (GAs) and the closely related evolutionary strategies which are a class of non-gradient methods that has grown in popularity and are used extensively in engineering applications (see, e.g., Goldberg 1989). The next most preferred methods are those of gradient or derivative approaches.

Multi-objective optimization algorithms, especially those based on evolutionary principles, have seen wide acceptability as, for most engineering problems, a quick computation of approximate solutions is often desirable. Evolutionary algorithms (EAs) are adaptive search techniques inspired by nature and their working principle is based on Darwin's theory of survival-of-the-fittest. The adaptive nature of EAs can be exploited to design optimization algorithms by designing suitable variation operators and an appropriate fitness function.

A GA works with a population (a set of solutions) instead of a single solution (individual). This property of a GA makes it an ideal candidate for solving multi-objective optimization problems where the outcome (in most cases) is a set of solutions, rather than a single solution. The population approach of a GA also makes it resilient to premature convergence, thereby making it a powerful tool for handling highly nonlinear and multi-modal functions. The following genetic algorithms provide a good set of complimentary approaches to solve multi-objective problems such as the ones addressed in the present application. These are the preferred algorithms in the present application.

Non-dominated Sorting Algorithm (NSGA-II) (Deb et al. 2002): In the elitist Non-dominated Sorting Genetic Algorithm (NSGA-II), each objective parameter is treated separately. The algorithm is simple and efficacious. Standard genetic operation of mutation and crossover are performed on the designs. This algorithm begins its search with a random population of solutions and iteratively progresses toward the Pareto-optimal front so that at the end of a simulation run, multiple trade-off optimal solutions are obtained simultaneously. Thus a Pareto set is constructed where each of its designs has the "best" combination of objective values and improving one objective is impossible without sacrificing one or more of the other objectives. NSGA-II is widely used and has become a de facto standard against which the performance of other algorithms is compared. NSGA-II solutions are normally clustered so that a few well-distributed solutions can be readily identified. One way of verifying these clustered solutions is to perform a single-objective optimization procedure (e.g., a genetic one will suffice) independently on each objective function subjected to constraints.

Other possible applicable algorithms include: Neighborhood Cultivation Genetic Algorithm (NCGA) (Watanabe et al. 2002) and Archive-based Micro-Genetic Algorithm (AMGA) (Tiwari et al. 2008).

A first derivative of an objective function can aid in identifying points that might be extrema. However, this alone cannot distinguish a point that is a minimum from one that is a maximum or one that is neither. When the objective function is twice differentiable, which it is in the current situation, these cases can be distinguished by checking the matrix of second derivatives of the objective function and the bordered Hessian. The conditions that distinguish maxima, or minima, from other stationary points are the second-order conditions. If a candidate solution satisfies the first-order conditions, then satisfaction of the second-order conditions as well is sufficient to establish at least local optimality.

Pareto Solutions Set

The advantage of using evolutionary computational approach is that it can leave the decision makers (DM) with the difficult task in selecting only one alternative to be implemented from a, perhaps unmanageable, set of Pareto (non-dominated) solutions.

Oftentimes a subset of the set of solutions will have similar characteristics and just be minor variations of each other. Occasionally, however, distinct solutions can exist and it is up to the decision maker (DM) to choose a preferred one. While a human DM inspecting the various solutions is a default approach, automated methods and systems are possible so that a preferred solution is presented to the user (or DM) without undue machinations.

As previously indicated, a multi-objective function may be a weighted summation of selected single-objective functions that have been selected by the user to define the multi-objective function. The problem can be posed mathematically by defining a multi-objective function as a vector where the components of said multi-objective are the single-objective functions. A weight vector can also be defined, of similar dimension. A sensible approach would be to give high weights to requirements that have a high impact on the design and low weight to those that have low impact on the design.

One method to create an automatic DM involves a user learning about the sensitivity or significance of weights in Pareto solutions and implementing these pre-determined weight constraints in an automatic fashion. There is not an a priori correspondence between a weight vector and a solution vector. It is up to the DM to choose appropriate weights, noting that weighting coefficients do not necessarily correspond to the relative importance of the objective functions. While the DM will not know in advance which weight vectors are the appropriate to identify a satisfactory solution, the relative importance of the weight vectors can be obtained by detailed inspection from many trial runs with different weight vectors. Thus experience can be gained over time as to which weight vectors are to be used in deciding which one of the Pareto solutions is the preferred one. With this a priori knowledge, an automatic system can then select those solutions that possess weight vectors that are within certain pre-defined limits.

There are other alternative methods by which at the end of a multi-objective optimization, the DM can use to select the preferred solutions from the Pareto set. For this reason, there are a variety of decision making support tools that have been developed to aid the DM in selecting the preferred solutions, and in an automatic way.

There are different approaches for introducing DM preferences in the optimization process, like the ones presented by Rachmawati and Srinivasan (2006), and Coello (2000); a common classification is based on when the DM is consulted: a priori, a posteriori, or interactively during the search.

The a priori method considered is the Guided Multi-Objective Genetic Algorithm (GMOGA) (Zio et al. 2009), in which the DM preferences are implemented in a genetic algorithm to bias the search of the Pareto optimal solutions. The first a posteriori method considered has been introduced (Zio & Bazzo 2011) and uses subtractive clustering to group the Pareto solutions in homogeneous families; the selection of the most representative solution within each cluster is performed by the analysis of Level Diagrams (Blasco et al. 2008) or by fuzzy preference assignment (Zio & Bazzo 2009), depending on the decision situation, i.e., depending on the presence or not of defined DM preferences on the objectives.

Another procedure is a two-step procedure which exploits a Self Organizing Map (SOM) (Fausett 1994) and Data Envelopment Analysis (DEA) (Cooper et al. 2006) to first cluster the Pareto solutions and then remove the least efficient ones. The a posteriori procedure of analysis is applied to the Pareto set obtained by a standard Multi-objective Genetic Algorithm (Busacca et al. 2001).

While the shape of the Pareto front (set of all Pareto solutions) gives information about possible tradeoffs among the conflicting objectives, it gives no information about the composition of the individual solutions in the generated set. Such information could be identified by looking at the details of each individual solution, but this approach is tedious and no support is provided to help decision makers identify relations between the different solutions. Identifying such relations may be important for decision making. An important example is the case where the Pareto solutions are close to each other in terms of cost and value but very different from each other in terms of selected requirements.

Alternative approaches measure the sensitivity of optimal solutions with respect to variations in the design variables—e.g. the cost and value of individual requirements—or analyzing the robustness of the solutions with respect to the non-determinism of the genetic algorithm search (see, e.g., Gay et al. 2010). Sensitivity and robustness analysis are concerned with understanding how the set of optimal solutions could change due to uncertainties in the design variables or caused by the genetic algorithm.

Another approach that does not require additional input from DM's is to use one of the objection functions, such as cost or IRR, as a measure of the importance of a requirement on the design. A clustering algorithm is one that groups together solutions that have a lot of 'cost' in common. This is the approach normally taken in clustering algorithms. Clusters can be separated by traditional approaches, such as k-means, or a hierarchical one as it allows an adjustment of the level of granularity of the clusters and does not require that the number of clusters to be specified in advance. A distance can be defined (e.g., Jaccard, or Euclidean, or Mahalanobis) and the clustering technique can rely on a 'cost'-weighted distance function as an appropriate technique to group solutions for requirements selection.

The idea of clustering solutions in a Pareto optimal set is not new (e.g. Morse 1980; Rosenman & Gero 1985; Mattson et al. 2004). The approach taken by some techniques is to cluster solutions according to how close they are in terms of objective attainment (which is useful to help understanding solutions when the number of objective is larger than 3). An alternative approach, in contrast, is to cluster solutions according to how close they are in terms of design decisions. This latter approach is helpful in understanding optimal solutions in industrial design problems (Aittokoski et al. 2009). The design decisions in such problems consist in selecting optimal values for a small number of continuous variables.

Input Specifications

Input specifications to the power plant design system or procedure include, at a minimum, the items listed in TABLE 1. Moreover, there are additional constraints, limitations, or conditions (collectively known herein as rules) imposed by structural and electrical codes, availability of materials, manufacturing constraints, manufacturing tools, processes, and materials, and site-related conditions such as topographical, meteorological, and seismical.

The initial entries into the optimization process would be, at the least, the longitude and latitude along with the site geometry or at least the physical site size. Default values can be used for any of the input specifications. Entire default configurations can also be defined, at least initially. A sequence of analyses can occur by varying the major options, such as the tracking mode (0, 1, or 2) to at least gain an awareness of what might be possible. Choosing initial values for the numerical constraints requires some experience with PV solar arrays.

There are various types of inputs, such as numerical constraints, all of which are selected from the total set of available inputs, lookup tables, process controls, databases, or options. Moreover, numerical constraints can be fixed real or integer values. Boolean variables are also present as is the use of Boolean logic to control information and processing. Ranges can be defined for a numerical constraint (meaning upper and lower limits). For example, 'tilt' can be specified to be within a range of, say, 10 to 40 degrees; or possible inverters would have to satisfy both a minimum and maximum voltage rating.

The optimization process will adjust the designated design variables in order to determine the optimum solution or a set of solutions (Pareto optimal) within the constraints imposed upon the optimizer or the optimization process by the input specifications.

Another type of input to the power plant design system or procedure are process controls, such as the number of iterations, the type of optimization algorithm, the identification of Pareto solutions and the subsequent clustering analyses thereof, the amount of detail of the results to be presented or stored, and the number of optimized solutions (Pareto) to presented.

Another type of input are the definitions of the one or more figures-of-merit (FoM) to form the objective function (OF). Physical constants are also part of the input information fed to the power plant design system or procedure. An objective function is called primary if it is related to an overall or large-scale goal of the system or method. In other words, a primary objective function is one influenced by a number of unrelated design variables, such as the options of foundation support and the options of inverter. Another example would be an objective function correlated to the ground coverage ratio, which is dependent upon the specific design of the array.

A secondary objective function is one in which a specific item (e.g., volume of DC wiring; specific structural optimization) is, or a group of components or items that are related (e.g., electrical components; power management), are design variables to achieve specific optimizations within the overall optimization system or process.

The APPENDIX covers in part the canonical equations used to estimate the value of a solar PV power plant. Several of the most important objective functions that can drive the overall design of a solar power plant are 1) maximum internal rate of return (IRR) for the lifetime of the project; 2) the minimum payback time for investment; 3) the minimum of the nominal levelized cost of electricity (LCOE); 4) the minimum total capital invested; 5) the maximum IRR in combination with a maximum capital cost; 6) the maximum IRR given with a specified maximum area; and, 7) the minimum total capital cost with a maximum annual kilowatt-hour delivered to the grid. All of these figures-of-merit are mathematically definable, thus capable of being optimized. Other equations relevant to understanding the basics of the design of a power plant are also presented.

The equations for the first three aforementioned principal objective functions are (where the various components and terms are defined in the APPENDIX):

(1) The IRR is equal to r, which is obtained by solving this equation:

$$EI = EQUITY_{Invested} = \sum_{n=1}^{L} \left[ \frac{CF(n) + \text{TAX}(n)}{(1+r)^n} \right]$$

(2) The payback time=$t_{PB}$ is obtained by solving this equation for $t_{PB}$.

$$\int_{o}^{t_{PB}} CF(t) dt = EI$$

where EI is defined as in (1).

(3) LCOE:

$$LCOE_{nom} = \frac{A_{nom}}{B_{nom}}$$

where $$A_{nom} = \sum_{t=1}^{L} \left[ \frac{E(t)}{(1+d_{nom})^t} \right]$$

$$B_{nom} = \frac{EI + \sum_{t=1}^{L}[INT(t) + OM(t) + LL(t) + I(t) + TAX(t) + REPAY(t)]}{(1 + d_{nom})^t}$$

Figure 2:
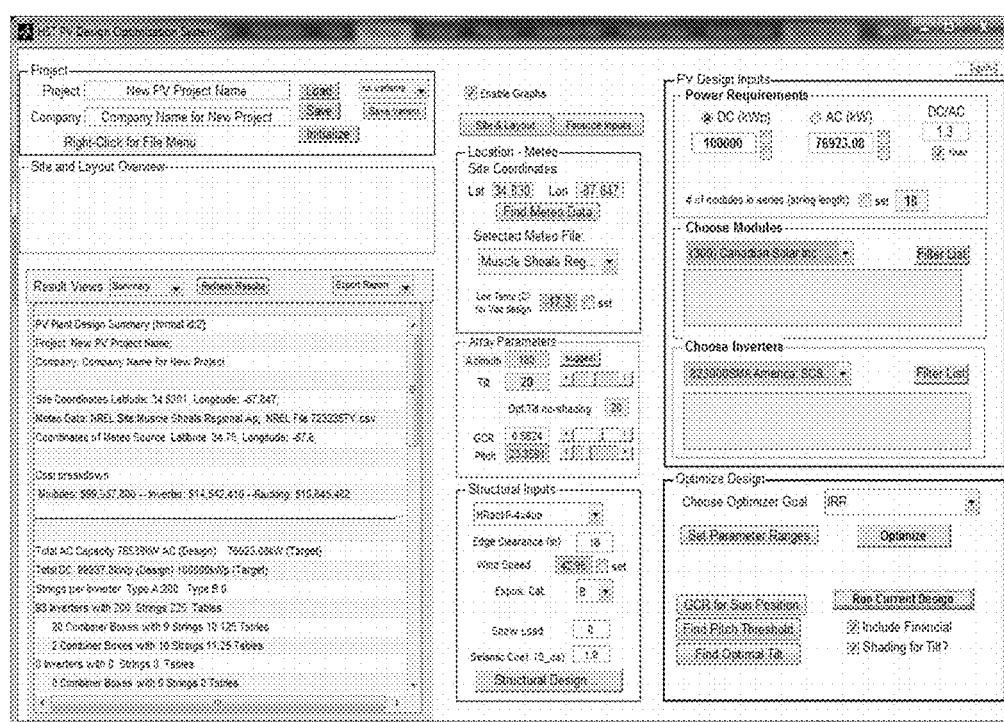
FIG. 2 shows an example of user interface for the optimization process for design of a solar PV power plant.

Given the complexity of the overall procedure and the large number of parameters or variables, another embodiment of the present application is to simplify and facilitate the entering of information via a graphical user interface (GUI) or by defining an input file or database that contains all of the required input information or specifications and rules. In either case, the various inputs controlled by the user become displayable and alterable in a straightforward manner. FIG. 2 presents an exemplar of a possible input format for the user to enter the initial conditions, and some of the inputs and controls for the optimization. The various self-explanatory input specifications are appropriately labelled within FIG. 2. These entries would be readily obvious to any solar project owner, manager, or engineer.

Additional parameters, variables, options, or constants may be added, edited, saved, or deleted so that they can be automatically added to the optimization. If only a figure-of-merit is desired, e.g., IRR, then a default set of input specifications plus site specifics would suffice to produce one or more designs (Pareto solutions) to provide further guidance in designing the solar PV power plant.

TABLE 1

| Section | Parameters and Variables |
|---|---|
| PV Modules | Costs, efficiency as a function of wavelength |
| | Number of cells, max power output |
| | Manufacturer |
| | Physical size: dimensions and weight |
| | Cell construction (crystalline Si or polycryst. Si, etc) |
| | Open Circuit Voltage, Short-circuit I |
| | Diodes: bypass, blocking |
| | Smart modules and their specifications |
| | Max power point tracking (software and hardware) |
| | Internal microinverter |
| | Bifacial |
| | Flexible, curvature for maximum power |
| Electrical (non-PV) | Grid Requirements |
| | Transformers, costs, loads, warranty, efficiency |
| | DC wiring Specs: Gauge, insulation, costs; resistance losses |
| | AC wiring Specs: Gauge, insulation, costs; resistance losses |
| | Combiner boxes, costs, warranty |
| | Type of inverter: microinverter or central inverter |
| | Numbers and specifications of inverters chosen |
| | Microinverters, costs, number, warranty, efficiency |
| | Central Inverters, costs, number, warranty, efficiency |
| | Over-design factor for each electrical component |
| | Power management electronics, costs, warranty |
| | Energy storage, batteries, capacitors, inductors, loads, charging times; costs, warranties |
| | Derating factor for each electrical component |
| | Local electrical codes |
| Location | Latitude and longitude |
| | Local regulatory codes |
| | Terrain |
| | Basal and subsoil conditions |
| | Depth of bedrock |
| | Land clearing/preparation costs |
| Location (cont.) | Delineation of boundaries |
| | Shadowing from terrain or vegetation |
| Mechanical | Tracking mode: 0, 1, or 2 |
| | Tracking mode 0 (static): pile, ballasted (subsurface or surface), four-posted, screw-driven, Z-rack |
| | Tracking mode 1: horizontal, vertical, equatorial |
| | Tracking mode 2: alt-az or other mount |
| | Tracking modes 1 or 2: Armature, gearing, material, coatings, motors, bearings, journals, axes, lubrication |
| | Module/panel: height, azimuth, bank, tilt, other geometric parameters |
| | Codes for rooftop installations |
| | Codes for carport installations |
| | Codes for utility installations |
| | Over-design factor for each component |
| | Structural materials |
| | Coatings/anodizations of structural materials (above and/or below grade) |
| | Seismic loading, lateral and vertical, min and max |
| | Wind buffeting |
| | Snow and wind loadings |
| Goals | IRR |
| | LCOE |
| | Total collector area |
| | Solar energy load |
| | Amount of energy harvested |
| | Total Capital Cost |
| | Payback period for Investment |
| | Other terms and components are given in the APPENDIX |
| Layout | Row spacing |
| | Shading |
| | Access Roads |
| | Drainage channels |
| | Electrical conduit trenches |
| | Height/Clearance |
| Tools | Predetermined set of tools, processes, and materials only to be considered in the manufacturing and installation of the solar PV power plant |

Databases

The databases are a fundamental part of the disclosed system and process embodiments given the large number of input specifications and the large number of potential solutions. For example, one database consists of a list of the available PV modules and their operating characteristics. The database for the modules includes information necessary to simulate their performance over time given different solar irradiance values as well as information required to incorporate those modules into a solar array, comprising, at the least dimensions and approximate cost. Data for the derivation of performance includes, but is not limited to: unit price as a function of size of array, width, length, weight, number of cells, open-circuit voltage, short-circuit current, maximum power current, temperature, and voltage at reference conditions.

In addition to PV modules database, other databases contain specific information about every aspect of power plant design. Just to name a few, these aspects include types of racks, types of trackers, costs of wiring, types or wiring, types and costs of inverters, yield strengths of metals, costs of metal, costs of coating metal, costs of cutting metal, costs related to various foundational supports, regional labor costs based on either prevailing or non-prevailing wages, costs of site preparation, fencing and landscaping, perhaps the price of power or TOD factors.

Another database is for the specific data regarding the inverter, and these data are used to simulate the performance of the inverters over time given input current from the strings as well as their approximate cost. The performance parameters are taken directly from the Sandia inverter database (Sandia National Laboratory) and include, but are not limited to: unit cost as a function of size of array, maximum input voltage and current, maximum power-point tracking voltage bounds, maximum possible AC power output, and output AC voltage. The Sandia inverter database is obtainable from the National Renewable Energy Laboratory (NREL) System Advisor Model (SAM).

Another database will contain the basic information of all materials used in the manufacture of the structural components. At a minimum, the materials will include steel tubing (square, circular, rectangular), C-channels, Z-channels, I-beams, and the like (of various profiles and cross-sections, and various alloys and various yield strengths), which could be used in the structural design. Also, current prices for said materials as well as the costs for weatherizing said materials are also contained in the appropriate database. If, for example, the site is coastal, or nearly so, then the increased air salinity (i.e., marine layer) would require a different coating than one located in a dry climate. Thus options for coatings would form another database or at least specified as an input.

Design Optimization

In embodiments, depicted in FIG. 3(A or B), optimization usually proceeds by an iterative approach either automatically or with human intervention to control the sequencing of subsequent refinement of optimizations and revisions of inputs.

Figure 3A:
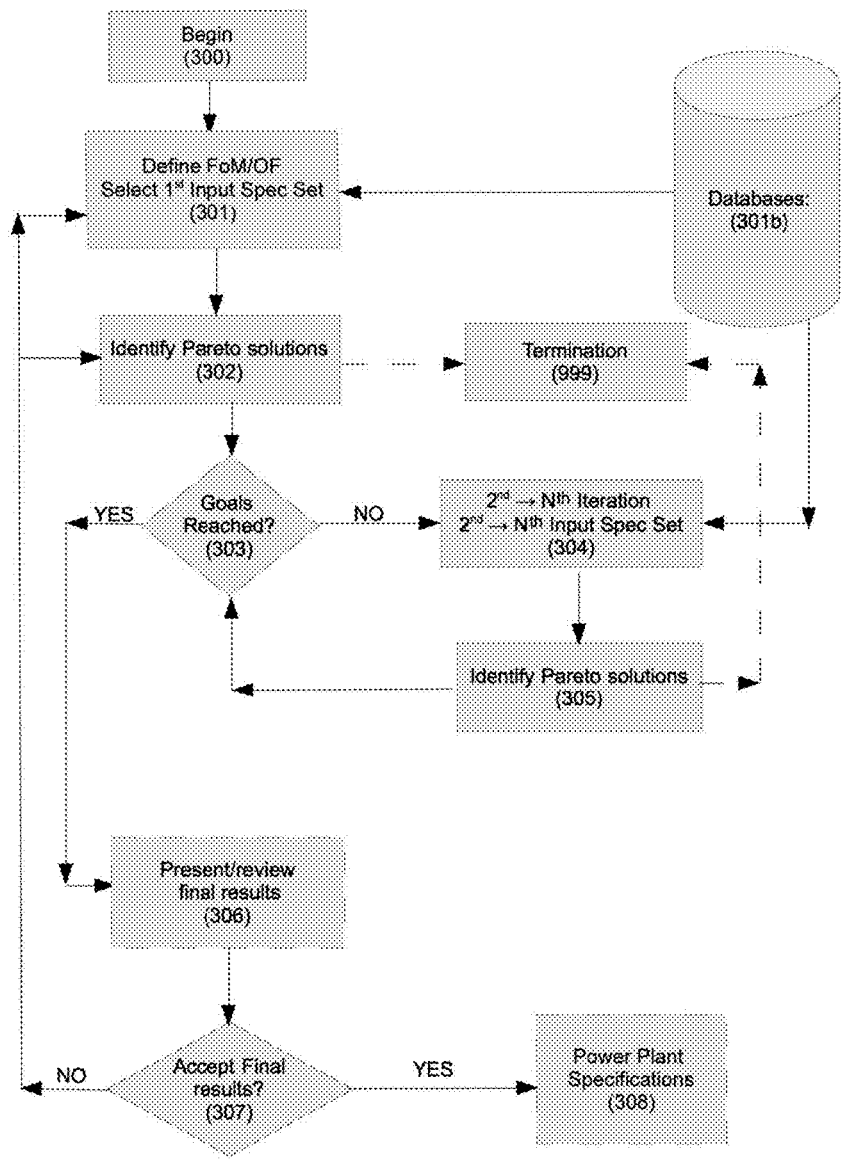
FIG. 3(A) is a flowchart showing an embodiment of a method of optimizing a set of design variables constrained by input specifications to produce a set of output specifications for an optimized solar PV power plant.

In this FIG. 3(A), the first step is to select a $1^{st}$ set of input specifications (301), design variables, options (such as FoM's or OF's), and one or more databases (301b). This $1^{st}$ set of input specifications could specify the minimum information that will permit at least a rudimentary evaluation and optimization (such as location and layout of the site). Additional constraints, inputs, or iterations can be added as the overall solar power plant optimization and evaluation progresses. With this input information, the optimization of the specified figures-of-merit (objective functions) will provide the Pareto solutions (302) constrained by the $1^{st}$ set of input specifications and design variables. Should a fault occur during execution of step 302, then termination (999) is possible. Inspection of the results (303) either by the user or automatically by a decision maker (DM) can permit the optimization process to continue to the next level of refinement (305) with a $2^{nd}$ or $3^{rd}$, $4^{th}$, $5^{th}$, . . . , $N^{th}$ set of input specifications (304) or to proceed to termination (999). A report of the results (designs, costs, values of the figures-of-merit, etc) is produced (306). If the final results are accepted, either automatically by a DM or by direct inspection (307) by a user, the power plant or output specifications are subsequently generated (308). The systems and methods check to ensure that input entries are within realistic ranges. Should the final results be rejected, the options are to return to step 301 to begin anew, or to step 302 in which another of the possible solutions identified earlier might be analyzed further downstream.

The choice of initial values for the design input information (parameters, variables, options, definitions; step 301 of FIG. 3(A)) can rely on large part on default values (based on common usage), but with any project-specific or site-specific information. For the global optimization procedure, new initial input information (step 304 of FIG. 3(A) for the $2^{nd}$ and additional optional optimizations) can be entered after the first run of the local optimization process (Step 302 of FIG. 3(A)). Retained results of the first or subsequent iterations can be used to feed the initial steps of subsequent iterations, as an enhancement to this embodiment.

An additional embodiment for the optimization process is to perform internal optimizations on certain input information (e.g., design variables of a support structure or a component of the electrical design, ranges of parameters) in order to optimize those inputs before continuing with the overall optimization. In FIG. 3(A), this means that step 302 and/or the one or more iterations represented by step 305, contain one or more internal optimizations (one or more secondary objective functions). The design variables or input specifications defined by ranges that are in these internal optimizations of steps 302 and/or 305 can be manually selected or automatically selected by some criteria, such as the value of the partial derivatives of the object function (with respect to a selected independent variable) only associated with a particular subset of variables and/or parameters that possess ranges.

The power plant output specifications (308) include, but are not limited to: plant layouts, production drawings, permit drawings, construction drawings, specifications for all configurable mechanical components and their labeling, single-line diagrams, wire schedules, civil diagrams, installation drawings, interconnection diagrams, bills-of-material, and CAD/CAM files to control any applicable CNC machine used to fabricate the either the electrical or mechanical components (e.g., laser or plasma cutters).

Rules of the structural and electrical codes of the region in which the power plant is to be built provide constraints early on in the optimization process so that certain non-feasible optimizations are not produced. Other rules will be based on seismic accelerations, likely wind loading/buffeting, environmental conditions that dictate the type of metal coatings, and constraints imposed on the structural design. In all of these cases, a selectable over-design factor is one of the input specifications.

In an enhancement of the basic embodiment, either or both of the individual steps 302 and 305 can contain multiple and possibly distinct optimizations on one or more sets of inputs or subsets thereof. The optimizations in this case could be nested, in parallel, in series, or their individual figures-of-merit could be mathematically combined into a multi-objective function which is optimized. In the case of nested optimizations, a secondary objective function can be optimized in an inner nested procedure, whereupon completion of that procedure, another optimization occurs using the one or more results that were determined previously.

Beyond the initial criteria, other initial inputs to the design process could include, but are not limited to, the value of the grid voltage, maximum usable land area, desired AC:DC ratio (provided it exists), module type, rack or tracker type, inverter type, the desired number of modules that belong in a single string, and the number of strings that belong in a sub-array.

Figure 3B:
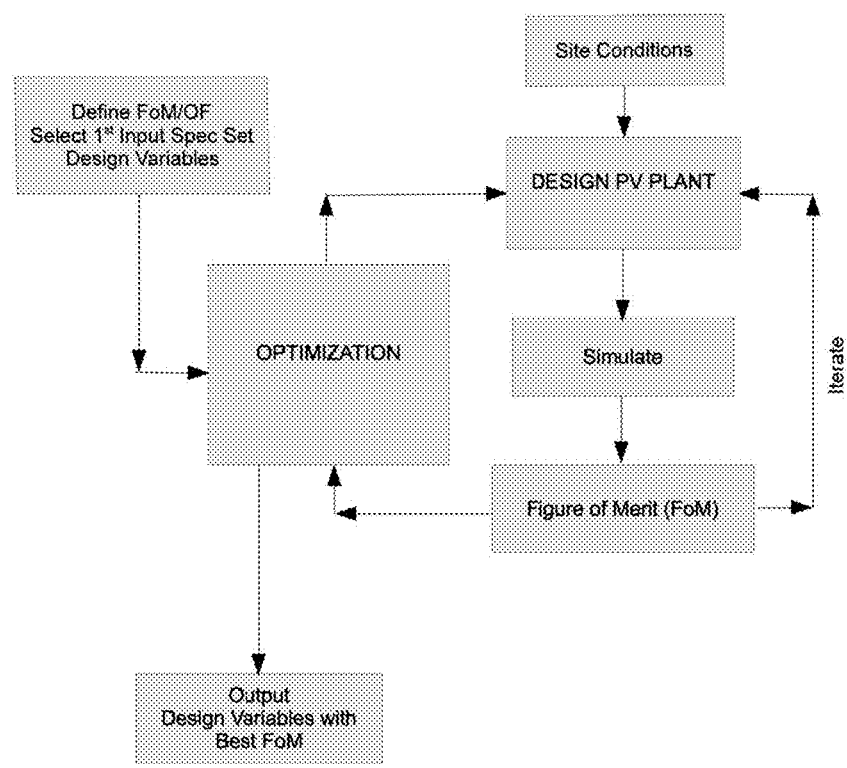
FIG. 3(B) is a basic method for the optimization of a PV power plant design given various inputs, site conditions and other constraints, and Figures-of-merit.

In another aspect of the present application, a basic method for achieving an overall PV power plant design optimization is presented in FIG. 3(B). The optimization of the design the PV plant involves selecting/customizing valid structural elements, selecting electrical wiring and components, laying out of all components, estimating labor and other costs to install the plant, estimating total life-time cost, and any activities necessary to reasonably estimate the cost of the site or otherwise evaluate the figure or merit, taking into account the site conditions and current set of parameters. Design variables or other input specifications include any decisions or information that is needed to influence the design, including for instance tilt, azimuth, module selection, inverter selection, structural member selection, foundation selecting, row spacing, height or clearance, and layout choices. The optimization process ensures that these parameters are set in a way that optimizes the figure of merit, using any available technique.

Figure 4A:
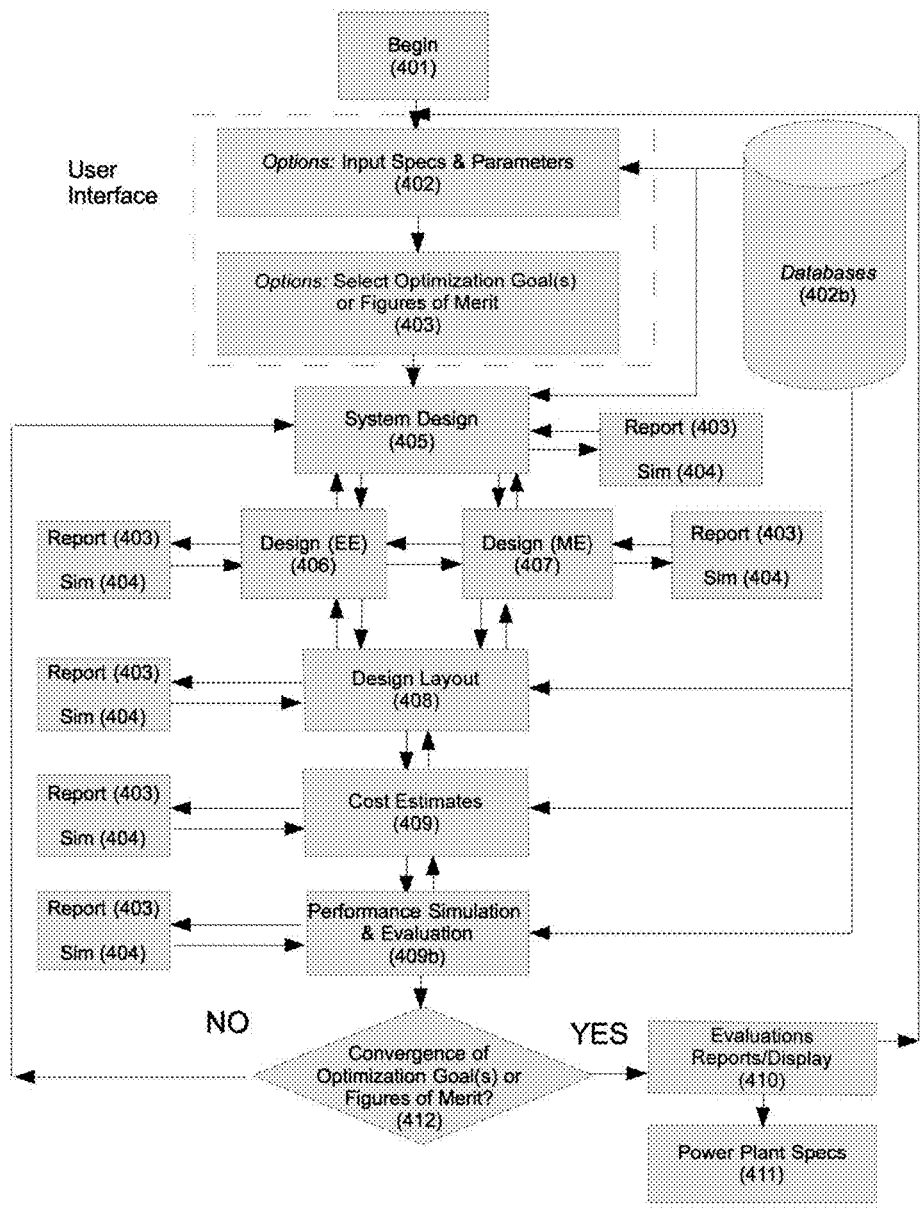
FIG. 4(A) is a flowchart of an alternative embodiment of a method of optimizing a set of design variables constrained by input specifications to produce a set of output specifications for an optimized solar PV power plant.
Figure 4B:
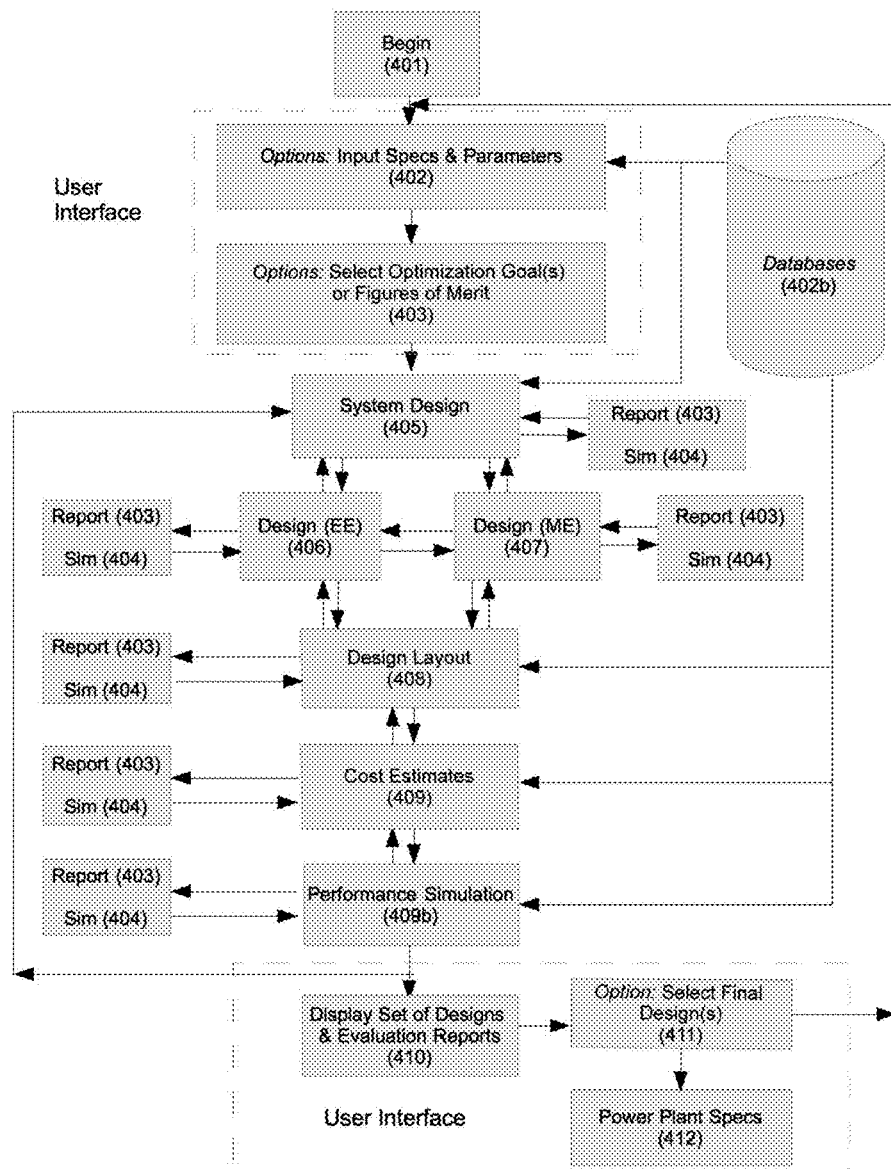
FIG. 4(B) is an alternative version the approach of FIG. 4(A), in which a human agent can be involved in the decision making for the final design.

Other aspects for the architecture of the optimization process are presented in FIGS. 4(A) and 4(B). In both of these there is a User Interface which allows a user to control the specifics of the entire design optimization system or process. The method of FIG. 4(A) will be first emphasized.

The options object (402) comprises at least two components: one involves the input specifications comprising structures: parameters, design variables, ranges, rules, other inputs, and constants. Being structures, the system or process has the ability to access their fields readily. The options are used throughout the system or process in design, simulation, and reporting. A design needs only a few initial conditions. By combining these with several inputs (e.g., location and area for the installation), environmental constraints and financial inputs (e.g., tax incentives), an entire optimized design with financials can then be constructed for the specific site. From this point additional information or constraints can be added. These constraints could also be introduced into the initial input information. After a first iteration, additional iterations can occur. These iterations make more fine adjustments such as changes to the individual panel bank, tilt, height, row spacing, and perhaps supporting structure if variations in the terrain require such a variation.

The other options object component comprises one more objective functions, or mathematical combinations thereof, to be optimized, at least initially. During operation of the system or process, the DM can alter the selection and sequencing of objective functions.

The options object (402) can gather its input from one or more databases (402b). The options object (402) can provide a validation on the input specifications and to check if there is enough information given to continue.

The various inputs are retrieved from the database object (402b). This object contains desired information to configure the simulation and for the processes of design data structures and cost estimations. It contains the parameters, design variables, other user inputs, constants, with options for each (e.g., the potential PV module types), a current cost for each module, information about setting the values correctly in the simulation and, if appropriate, their ranges—in other words any and all information required for a proper optimization and evaluation of one or more solar power plant designs. The database can also store information about the various results obtained during execution of the system or process.

The report object (403) contains the information used to build the report. As the design and simulation progress in time, information is added to the report. At the conclusion of the process, the report (403) can generate a readable document, allowing the user to inspect every step of the process. The report also will contain the information required to produce all the specifications of the power plant. The choice of a report is optional. A pair of bi-directional arrows between two modules or steps means that one step or module or process can communicate with another step or module or process to share information or results that might impact the determinations of that other step.

The sim object (404) is the simulation core that determines performance including financial metrics of PV modules. It makes performance predictions and cost of energy systems based on installation and operation costs and system design parameters that are specified by the user. Initial values are set from the parameters, variables, inputs, and constants defined in step 402. If, however, only a design is required, a simulation will not be required. The sim object can be called upon at any computational or optimization step to provide results that can be evaluated as impacting the design and thus other factors. For example, structural design can impact electrical design and vice versa.

The system design object (405) can begin with some basic input information such as the location, and perhaps inputs such as amount of investment, amount of energy to be produced, the return on investment, or the size of the potential site for the solar PV power plant.

Other initial input criteria could be the module type, inverter type, and the number of modules that belong in a single string, although these are not mandatory. This function and all remaining design functions update relevant fields of the design object, set various values in the simulation, and add information to the report (if desired).

The next three steps provide the electrical (EE) design layout (406), and that of the structural (ME) design (407). There is communication between the EE (406) and ME (407) sections as one design can impact the other as well as either can also impact the system design (405). Steps 406 and 407 could be performed concurrently depending upon the computational configuration specified. Should a fault occur at a given step, e.g., lack of convergence or lack of significance of a solution, then the preferred approach is to return to a previous step for additional input. Upon completion of these tasks, there is an overall integration of the design layout (408) into a coherent form.

The next step is the cost estimation (409) task. These estimates are derived from the quantities and types of specific components that were assembled in the design layout (408).

The next step is to evaluate the performance (409b) of the current design by simulations. The production of energy, the O&M costs, the various financial metrics are derived to determine if this design can meet basic goals (412) which can be decided by the DM. If there are more than one designs from the Pareto set, then the DM can decide which one to pursue further. The DM is automated in this case. If the DM considers the evaluations to be positive, then reports can be displayed (410), and the results analyzed in further detail. A set of output or power plant specifications can then be generated (411). There exists the option in step 410 to reject the designs offered, and to begin anew, perhaps with different input specifications and/or objective function definitions.

The simulation has the ability to adjust the continuously variable parameters, while other variables are of a discrete nature may be adjusted less frequently. In addition, there are parameters that are fixed during the simulations. In this mode, most of the options structures (parameters, design variables, constants, and other inputs) will be invariant from run to run. Thus during continuous optimization, only a subset of the input specifications will be used.

The results are also obtained from the sim object and converted to the most appropriate form for the report or display. This produces the results object, which contains information like power generation and cash flow over time, maximum inverter voltage, and any warnings from the any of the computations. Upon approval of the results presented by the report and/or display components, the power plant production specifications (411) are generated.

The method of FIG. 4(B) is essentially the same as that of FIG. 4(A) until the step just after the performance simulation (409b). In this embodiment, the DM is that of a human agent and a user interface allows the visualization (410) of the design layout or layouts (408) from the various Pareto solutions, the financials, the specific designs of the structures and those of the electrical layouts, along with detailed reports concerning every aspect of the overall power plant design. The user then chooses the preferred design (411) or rejects all of them to start the process anew at step 402. Acceptance of a design results in the generation of the output or plant production specifications. These specifications can then be used to implement the power plant design, which comprises at least one of the following steps: manufacturing of the components, assembling of the components, and installation of the components on site.

Figure 5:
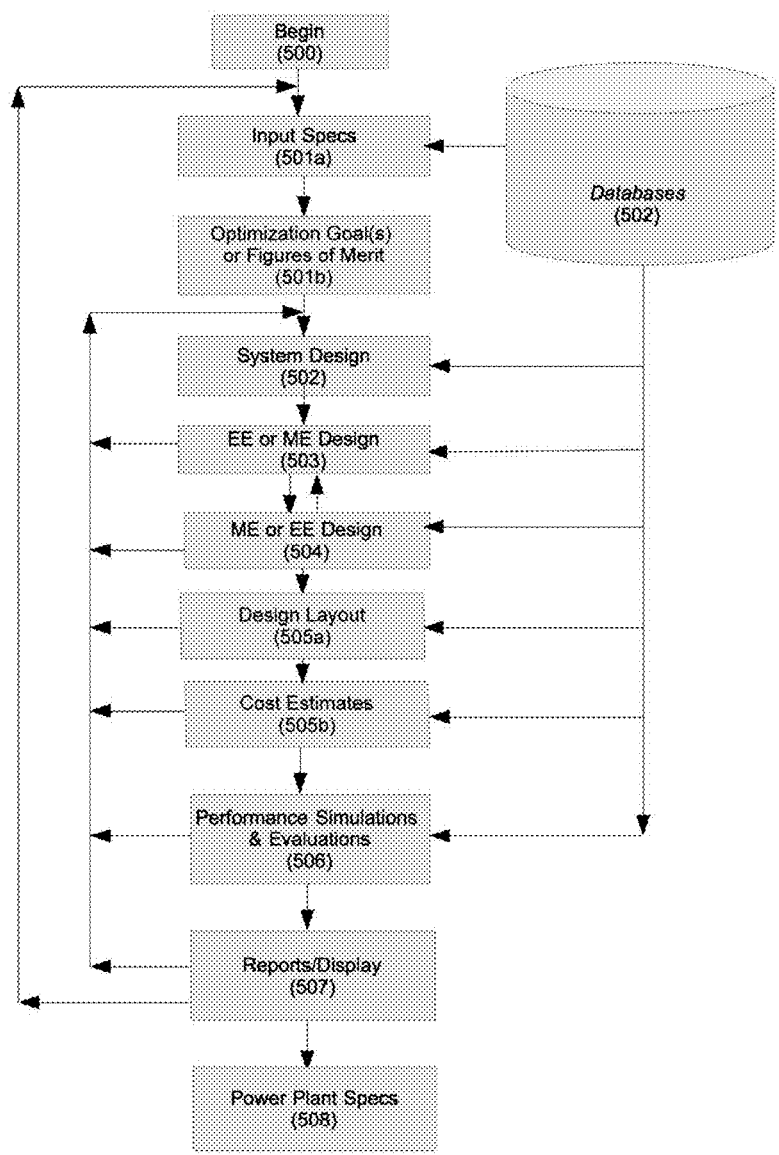
FIG. 5 is a flowchart of an alternative embodiment of a method of continuous optimizing of a set of inter-related design variables constrained by input specifications to produce a set of output specifications for an optimized solar PV power plant.
Figure 6A:
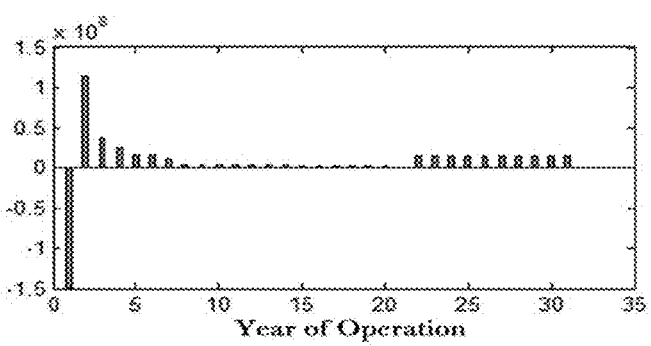
Figure 6B:
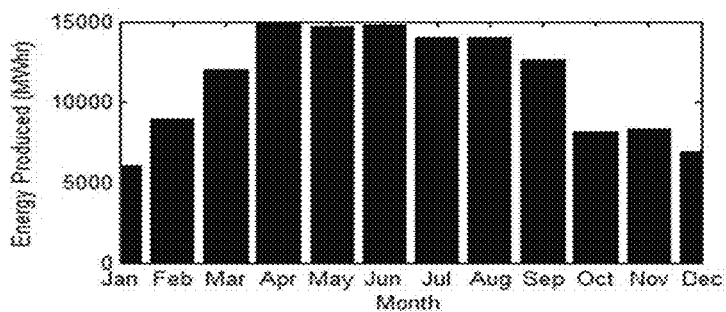
Figure 6C:
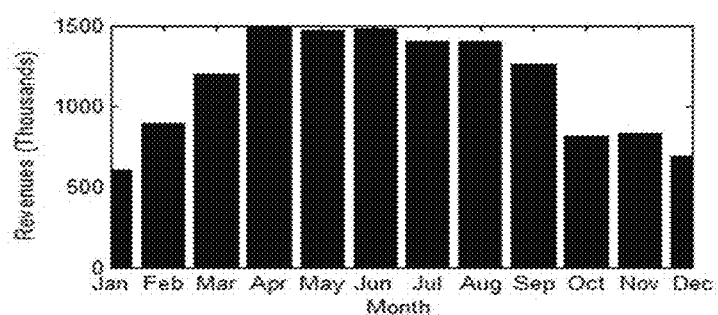
Figure 6D:
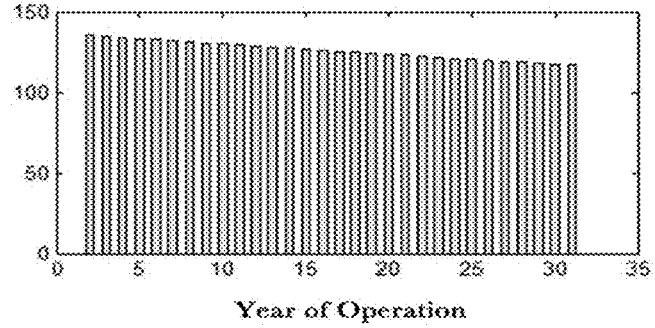

Another embodiment of an optimization procedure is outlined in FIG. 5. In this approach, the input specifications are entered (501a) either manually via a GUI or via a file or database. Various databases (502) can provide input as well into this step of 501a. A validity check concerning the legitimacy of input specifications is performed. A concomitant step (501b) to step 501a is the definitions of one or more optimization goals (figures-of-merit).

At this point an initial layout of the system (502) can occur, and the results are dependent upon the content of input specifications. After the initial system design (502), the process can either perform optimization (503) on the electrical layout (EE) or the structural and mechanical layout (ME). Upon deriving a solution the process proceeds to optimize (504) the other layout not performed in step 503. In an example, if in step 503 EE optimization was performed, then in step 504 ME optimization would be accomplished, or vice versa. Naturally, there has to be communication between them to exchange results, such if a result from one module (EE or ME) affects the results of the other module. If there is not a convergence or solution found with either step 503 or 504, due to no or a low-significance extremum found (established, e.g., by the strength of a peak relative to its local background and/or the level of the partial derivatives), then the program can revert to a previous step and either continue automatically based on a another possible solution established in a previous step. Special optimization procedures can be used in these cases, where the values of the first and second derivatives of the objective function with respect to the variable under consideration are both close to zero.

Upon completion of the steps 503 and 504, a layout of the design can be assembled (505a). Subsequently from this step, the upfront cost of a system will be determined (505b) as well as the hourly or average income from the performance as can be estimates of the amount of energy collected, which are derived from simulations (506). The results of the simulations (506) and the cost estimates (505) can be prepared and evaluated (507). One of the many ways to present the results thus obtained is graphical.

At any point between the steps of 502 and 506, a fault occurs, such as the lack of convergence, an overabundance of trivial iterations, etc., then the systems or processes can return to the step 502 to begin anew with adjusted input specifications or design variables.

In another aspect of the present application, for every permutation of fixed input specifications, a continuous solver on the continuous variables is performed. A set of solutions can be graphically displayed using vectors from the point of the initial guess to the optimized solution for the 3D space defined. An illustrative example would be a plot of the variables: azimuth (degrees), tilt (degrees), and height (in meters). Assuming the local minimum found by the traditional solver is within an acceptable range, then optimized results for every permutation will exist and the user can simply select the permutation that yielded the optimized or best results. As there are multiple local extrema that may yield false impressions, a global search with the continuous solver can be performed subsequently to identify the global extremum. Such techniques are well known by the ordinary skilled person in the art.

FIGS. 6(A-D) are a collection of several graphic illustrations demonstrating the types of information that can be presented to the user which could be used to evaluate the efficacy of a design: FIG. 6(A) shows the cash flows in USD over the plant life expectancy (cash as a function of time); FIG. 6(B) depicts the predicted monthly energy to be collected for the first year of plant operation; FIG. 6(C) is a plot of the predicted monthly revenue for the first year of plant operation; and, FIG. 6(D) the annual energy output in GigaWatt-hours (GWh). (In FIG. 6(D), the linear decrease of the output vs. time is due to the chronological diminution of PV efficiency due to migrating atoms in the PV substrates.)

Assuming some canonical ideas about operations costs, maintenance costs over the lifetime of the array can be estimated. In some cases, input from the project owner, or the installer may be entered such as O&M (operations and maintenance) costs over various geographies or costs of capital assumptions. By combining the individual cost components (see, FIG. 7), an estimate of the total cash flow, e.g., FIG. 6(A), of the project is derivable. Thus the project's value (step 507 of FIG. 5) as exemplified by FIG. 6(A) within a given time period can be estimated. The results of any or all of the aforementioned determinations along with the results of useful documents for project developers and owners (the electrical, structural, construction and permit drawings) can be presented on a display, in any graphic form or in a printable, storable table or figure. The full spectrum of power plant output specifications (308) can be produced and is the product of both the system and method embodiments of the present application.

In an embodiment of the present application, where a specified DC level does not exist, the electrical design of the project can be determined by using simulations to layout the solar PV modules. The method uses a generally accepted rule to minimize shading on the array located from ±3 hrs. of the Sun crossing the local meridian at winter solstice and to determine the associated row spacing for a given tilt and azimuth. Once row spacing is determined, the method proceeds to re-evaluate the current project and check if electrical losses are within an acceptable range. If this is so, the electrical design for the inverter and module pairing is then determined by grouping or clustering modules over the site to match the inverter loading and system power requirements. If electrical losses are not within the acceptable range, the process iterates until suitable row spacing is determined and an electrical design can be generated.

The steps 302 and/or 305 of FIG. 3(A), or the step of 406 of FIGS. 4(A or B), or the step of 503 (or alternatively 504) of FIG. 5 provides the designs of the electrical configuration for the chosen module and inverter, as well as string layout and assignments. For each module and inverter pairing, one of the inner loops of optimization (e.g., within steps 302 and/or 305 of FIG. 3(A), or step 407 of FIGS. 4(A or B), or step 504 (or 503) of FIG. 5) provides an automated layout with a given tilt, azimuth and GCR, and from there it either provides the structural design, or updates an existing one.

Upon completion of these tasks, the next step is that of cost estimation using the following method: the pressures and forces placed on the supporting structure from wind buffeting, seismic loads, snow loads, and dead loads (gravity) are calculated; the determination of the most economical, lightest gauge support structure strong enough to bear the maximum possible load plus an over-design factor is then determined. This procedure continues until there is a complete design for the given set of design parameters. From this point the performance of the design over its lifespan can be modeled and the figure- or figures-of-merit can be determined. For more discussion, see the section on Cost Estimations.

In each of the four methods presented in the flow charts of FIGS. 3, 4(AB), and 5, the databases can be accessed by any of the computational or optimizing modules, steps, or processes.

Example embodiments are described above with reference to block diagrams and/or flowchart illustrations of methods, devices, systems and/or computer program products. It is understood that a block of the block diagrams and/or flowchart illustrations, and combinations of blocks in the block diagrams and/or flowchart illustrations, can be implemented by computer program instructions. These methods may be provided to a processor of a general purpose computer, special purpose computer, parallel processor(s), and/or other programmable data processing apparati to produce a machine, such that the instructions, which execute via the processor of the computer and/or other programmable data processing apparatus, create means (functionality) and/or structure for implementing the functions/acts specified in the block diagrams and/or flowchart block or blocks.

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. In some alternate implementation, the steps of the flowchart may be inspected, surveyed, or controlled by a human agent.

Structural/Mechanical Design

The design of the structural support system (i.e., rack) for the PV modules is one of the major areas of PV power plant design that can benefit from optimization. Some of the basic structural requirements and inputs of the support system itself include type, tilt, height, module type, module bank, seismicity of the site, and wind buffeting and wind/snow loading of the panels. (These are not necessarily similar effects as snow loading acts only in the downward direction, but wind loading can be from any direction.) The embodiments disclosed herein are able to provide a complete design of the structural support system with products such as: components that meet the qualifications while minimizing material and labor costs and installation complexities; said components also being optimized not only for the site overall, but also for site perturbations (if so desired); and output specifications. These output specifications comprise at least design and production drawings; bill-of-materials to be manufactured; and CAD/CAM files for input to CNC machines such as laser/plasma cutters, and any other machinery that participates in the manufacture and installation of the power plant site.

From the known meteorological conditions, and/or the local, ASCE or International Building Codes applicable at a particular site, the wind and snow loads are determined for the likely designs, and thus the overall load on each panel or array. The exposure category (defined in the applicable building code of the region is defined for the US in the American Society of Civil Engineering: ASCE 7-10, or ASCE 7-05 code), using tilt, height, and layout of the site are also used to determine dead loads, wind and snow loads on the support structure. As per various structural codes and regulations, various load combinations can also be computed to determine critical load combinations. From these determinations, there is a selection as to an appropriate number of supports of the appropriate type and within the goal of the lowest cost-to-benefit solution satisfying strength requirements. Each support comes with an associated cost and installation time. An option exists to provide more lateral structural support for additional stability, should that be required. The most cost-effective module support design that bears the predicted load, including a desired over-design factor, can be chosen. This assumes little structural customization per site but is the easiest to implement. In this case, the minimum structural cost will be calculated directly.

As alluded to earlier, there are several approaches to mounting modules or panels on a support rack. Options are dependent upon desired GCR, type of soil, the terrain of the site, and the type of tracking. A choice of the tracking mode can be specified as one of the inputs to the analysis or can be left as a variable, to be determined. In FIGS. 8(A-F), the various tracking modes are shown schematically and the angular movements marked. The type of tracking affects the amount of energy that can be collected per unit time, the GCR, and the O&M costs.

Tracking modes varies from none (i.e., fixed or static; FIGS. 8(AB), to one dimensional following of the solar diurnal path at some fixed tilt, FIGS. 8(CDE), to full two-axis tracking of the panel, FIG. 8(F). In two-axis tracking, normally tracking along a first axis performs the diurnal movements, and tracking along a second axis adjusts for the seasonal variations of the solar declination. In the case of the seasonal variations of the solar declinations, a slow adjustment of about one degree per week suffices to achieve proper adjustment of the north-south tilt.

Each one of these tracking modes has advantages and disadvantages. For example, the increase in light collected using a HSAT, FIG. 8(D), relative to a static support system is on the order of 18 to 25%. Adding a second tracking motion (dual-axis tracking or DAT) yields an increase of 37 to 45% relative to a static system (Narvarte & Lorenzo 2008). It may be desired as part of the initial input criteria that the tracking be DAT so as to produce a more uniform energy collection during the day and year.

Single-axis tracking comes in various flavors depending upon the mount. A horizontal axis-tracker (an HSAT) depicted in FIG. 8(D) has the panels or modules rotating about an axis approximately aligned with a line of latitude. A vertical axis tracker, or VSAT, depicted in FIG. 8(C), is one where the tilted panels are rotated E to W about an axis approximately perpendicular to the ground. An equatorial or polar tracker, depicted in FIG. 8(E), has an axis that is parallel (or approximately parallel thereto) the Earth's axis of rotation. At each north-south end of the panel are journals or bearings within which the polar axis rotates. An adjustment of tilt to correct for declination changes can be also be implemented as indicated in FIG. 8(C). This is distinct from the DAT using motors to actuate both movements.

Some of the considerations in the selection of which of the tracking mode to choose are: latitude of the site, cost, reliability over decades (implying operations and maintenance costs), seismic activity, wind loading, terrain and soil conditions, and weather conditions such as rain and snow levels. The choice of tracking mode impacts the GCR, as with added tracking dimensions the GCR is reduced to avoid inter-module shading. While tracking provides more collected energy this increase is moderated as the total amount of energy is reduced by the lesser GCR: thus they represent a conflicting pair of goals.

The nature of the support system can also impact the foundational support type: for example, penetrating (pile, screw driven, subterranean concrete) or above ground concrete ballast. If pile is selected, then the embedment (and bedrock) depth (discussed in the section entitled Site-Specific Constraints), lateral bearing pressure, skin friction coefficient, soil stiffness/subgrade modulus, and other elements from the geotechnical report will need to be specified or gathered.

If above ground concrete ballast is selected, then the coefficient of soil friction and soil cohesion will need to be specified in the inputs, perhaps in a refining optimization. Thus information of a geological nature is also used as an input to the optimization process, which includes the types of soils and their respective physics. The weight of the ballast (or ballasts in a configurable sense) and the dimensions of the ballast forms are some of the output specifications the optimization process, should a ballasted support system be chosen, either via the optimization process or as a given as would be the case if the site is landfill.

Figure 10A:
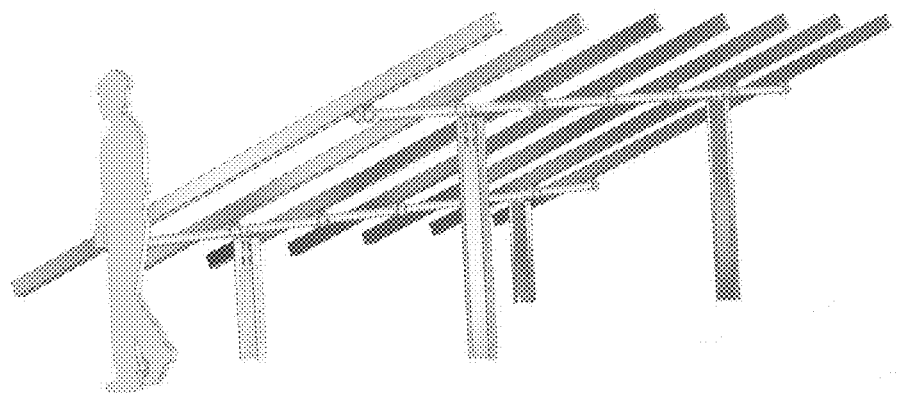
Figure 10B:
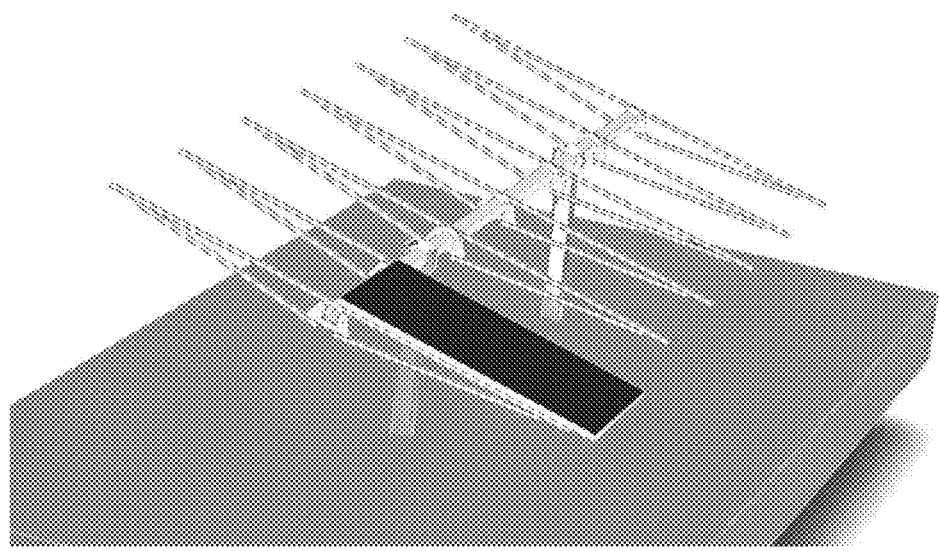
Figure 10C:
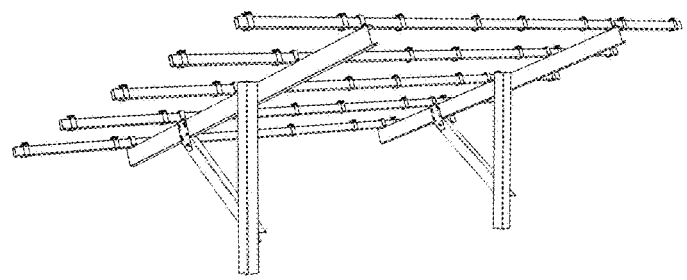
Figure 10D:
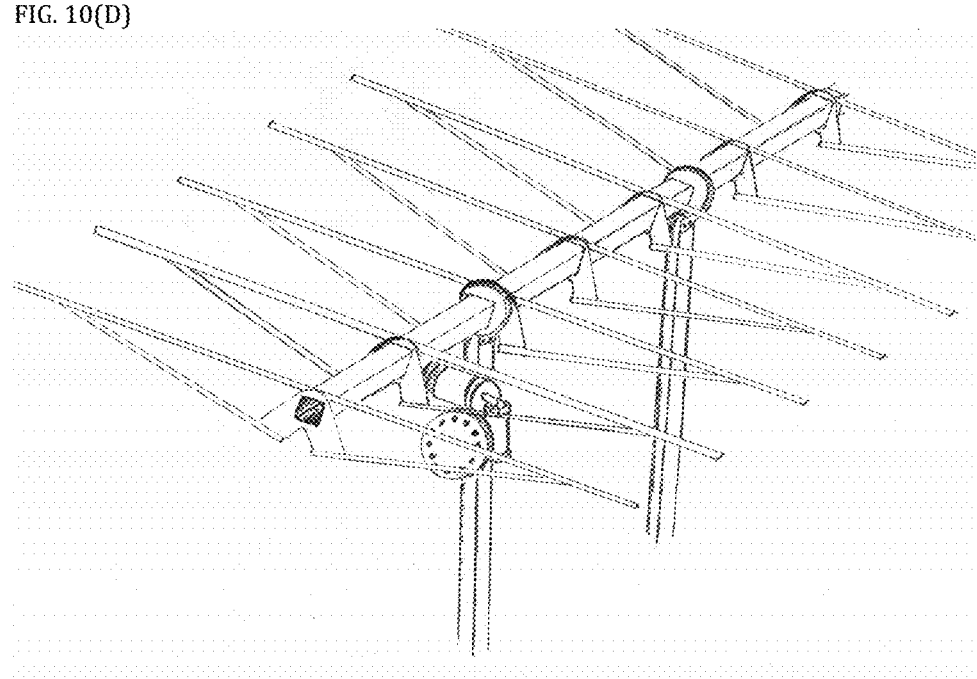

If the choice or the determination of the tracking mode is that of static, there are a great variety of support rack designs available. Options include a ballasted Z-rack as shown in FIG. 9(A); a ballasted four-pole support as depicted in FIG. 9(B); a four-pole pile driven rack in FIG. 10(A); a dual pile driven support as shown in FIGS. 10(B), 10(C), or 10(D). In these FIGS. 9-10, the specific rack designs shown are just possible variations out of a set of many possibilities. Naturally, possible rack designs are dependent upon the level of tracking.

It is useful to discuss the types of specific geometric variables that are at the disposal of the optimization systems or processes. An example will be made of the Z-rack support and its basic geometric layout is shown in FIG. 11, which is shown with a module tilt of 10 degrees. Design variables are marked such as height of lower edge ($H_{LE}$), the length ($L_B$) and height ($H_{BH}$) of the ballast and the length of the ballast overhang ($L_{BO}$), and the angles (q and g); the distances ab, cb, and bd. The width of the ballast ($W_B$) is also a factor, but is not shown in this planar projection. The length of the module ($L_M$) is likely to be specified as a parameter (i.e., fixed). The length of the module overhang ($L_{OH}$) from the connection point b could also be a variable. While these specifics are in relation to the Z-rack design, these are only to illustrate the several structural variables that are at the disposal of the optimization process.

Similar concepts, approaches, analyses, arguments can be applicable to any structural support system, such as any variant of SAT or DAT, as would be readily recognized by the ordinary skilled person in the art. Another variable to aid in strengthening a support is the wall thicknesses of the various structural components (struts, rails, purlins, legs, pipes, tubes, roll-formed channels). FIG. 10(D) depicts one of the possible designs for a HSAT—horizontal single-axis tracker. The line connecting the two piles would be aligned approximately along a line of longitude.

The optimization of the structural design, when considering criteria such as wind buffeting and wind/snow loading, might recommend additional lateral support, such as that depicted in FIG. 9(A) (the right-hand support). FIG. 12 is a perspective view of an alternative embodiment of the Z-rack support system, in which lateral stabilization of the panel has been increased by the presence of a second rear support member, forming a bi-pod. Additional lateral stabilization can be achieved by having both support structures of FIG. 9(A) the same as depicted in FIG. 12.

Another embodiment for a support structure consists of additional customization, thus introducing into the solution continuously variable parameters. One of the many possible continuously variable parameters could be the thickness of the support structure members. An example would be the wall thicknesses of tubular, rectangular, Z- or C-channel supports used in rails or purlins. With a connection to SolidWorks (or similar 3D-CAD software), the optimization problem becomes one focused on structural design or designs that can determine the wall thicknesses that provides adequate structural strength for the minimum cost. An over-design factor can be a parameter into this calculation (as in any of the structural design parameters). In normal situations, more structure than is necessary is suboptimal from the perspective of unnecessary cost and increased weight. Thus it is sufficient to find the minimum viable structural cost that satisfies the design input specifications. This helps significantly reduce the scope of the overall optimization.

Given the input parameters, such as topographical and meteorological concerning local conditions, there could be an adjustment to the placement of the string of the array which is accomplished by altering the dimensions of the local vertical posts, driven posts, trackers, ballasted two-posts, or Z-rack structures; meaning these structures are made up of configurable components ideally designed for a particular placement at a particular location of a power plant. These could also be continuously variable parameters.

Wind buffeting and wind/snow loading on the modules must be also taken into account. Winds can create differential pressures to cause significant problems, if not properly considered. Wind buffeting can result in the loosening of components and joints over time. Moreover, it can aid in damaging the teeth of gears, bearings, couplings that might be present in any of the tracking options (SAT or DAT), should these items be inferior to the needs of the actual conditions. Replacement and maintenance of such mechanical items only serve to decrease the overall financial productivity of a poorly designed power plant. Such deficiencies can be overcome if wind buffeting, wind/snow loadings, all are properly considered from the beginning in the design as is herein disclosed. If the site is known to be particularly windy, then a static system might have a lower cost-to-benefit than most tracking systems that can be stowed when winds are above a certain limit.

Similarly, significant accumulations of snow and dirt on the modules can also create additional problems. The amount of tilt of a module has impact on its light collecting ability beyond just pointing towards the Sun—lower tilts reduce the chances that snow will slide off or dirt washed off when raining. Dirt accumulation on the module surface is naturally location dependent, with greater soiling losses (up to 25% or some California locations) for high-traffic, high-pollution areas with infrequent rain. Coastal installations will see module surfaces that can be covered in a saline-based film, which requires special attention to remove, and support structure surfaces that can be coated with corrosive salt. The module problems are factored into the optimization approach usually via the performance derate factors.

An output of an embodiment derives rail deflections under dead loads (i.e., load of caused by weight of the array only). An exemplar of such an output is depicted in FIG. 13(A), which is a plot of the moment on an EW horizontal tubular rail carrying the modules vs. horizontal distance from the edge. The abscissa is measured in inches, while the ordinate axis is measured in pound-inches. FIG. 13(B) is a plot of the physical deflection of the rail vs. horizontal distance from the edge. Both abscissa and ordinate axis are measured in inches.

Reference is made to FIGS 10(ABCD), which present views of post or pile-driven systems that are embedded into soil with mechanical post drivers. The post (or "pile") is itself driven into the ground to provide structural stability and to generate moment to counteract overturning or lift. Mounted on the pile is a series of mounting brackets that connect purlin beams and tie-bars, also known as support struts. The East-West rails, usually made of steel, are then attached on to the purlins using a bolted collar connection, and the modules are snugly attached to the top of the rails via a set of aluminum module clips.

In another embodiment related to pile-driven configurations, one product of the output specifications is a digital list of accurate ground positions where piles are to be driven. This file can be communicated to the mechanical pile driver to place the piles laterally and to the proper depth and in an automated or semi-automated procedure. Such an approach saves time from manual movements and adjustments of the pile driver. An initial positioning of the driver can be manual, and the remaining movements automatically performed within a specified error of its proper or desired location. Accurate placements may be accomplished by the use of precision differential corrected GPS (or equivalent), laser ranging, inertial navigation systems, separately or any of these in combination, or by relative accurate offsets from a defined zero-point position within the site of the power plant using any of these techniques.

The variable-gauge pile foundation can be many various shapes including C channel, wide flange (I-beam), Hollow Structural Steel (HSS) Square, and HSS Round. The tie bar/support strut and the purlin beam are made of a variable-width and variable-gauge roll formed or tubular steel. Widths can be changed with adjustable tooling to match site requirements—as an example, if high wind speeds require a wider section, tooling can expand wider to yield a wider roll formed piece. The depth of the pile foundation is dependent on soil friction, composition (e.g. granular versus clay-like), and lateral and wind uplift load, to name a few factors.

One of the deliverables (output specifications) of the embodiments described in the present application are CAD/CAM files (from, e.g., Solidworks) which guide, for example, a laser or plasma cutting machine or any other machinery used to manufacture or installation of structural components. Every notch or groove in a flange, roll formed section, or tube to make the rack is cut with precise instructions from the CAD/CAM file to determine just the right tilt, azimuth, and other variables of the final rack. Moreover, given configurable components, each component can be laser etched with an ID. Other techniques for identification include a sticker with any form of a bar code or an RF ID device. Permits drawings involving structure also guide local and state and federal permits. Construction drawings involving structure also guide construction managers and installation crews.

Configurable Ballasts

The ballast is of such a weight as to counteract lift and drag forces due to excessive wind buffeting of the PV modules and due to seismic activity. The poundage of ballast is determined by the soil friction coefficients, wind loading/buffeting, and seismic loading of the rack with PV modules mounted, and solving for a static equilibrium. The ballast must provide enough resisting moment to avoid tipping and overturning in either transverse or longitudinal directions; it must provide enough downforce to avoid horizontal sliding due to dead load, or due to wind or seismic loading, and to counteract the normal force due to wind uplift. These are all derived based on appropriate load combination in the latest building code ASCE 7-10, or ASCE 7-05 in regions where that is appropriate (also local or international regulatory codes—as applicable in region). Lateral accelerations applied on seismic zones and design wind speeds as per applicable building codes determine the wind and seismic loads. Exemplars of such factors might be, but are not limited to, 67% for overturning, 50%-200% for sliding, and 67% for wind uplift. Wind speeds that determine the dimensions of ballast vary by code. An example would be, say, 110 mph for ASCE 7-10. For seismic ground acceleration, lateral accelerations of 0.75-2.5 g are possible design safety factors depending on seismic zone. Naturally other safety design factors are possible and the aforementioned are only for reference as an aid to understanding the approximate nature of the complexities of the overall problem.

Concrete (or similar material) is molded into shape with a special form (ballast form) that should preferably be made a commonly available configurable form of polyethylene (PE), plywood, Medium Density Overlay (MDO) plywood, honeycomb cardboard, compressed cellulosic modules, or other appropriate structural material readily obvious to the skilled person in the art. This provides the concrete the shape it needs during curing and forms a significant portion of the system's structural strength and serves as its foundational support. Three configurable ballast forms are depicted in FIGS. 14(ABCD).

Figure 14B:
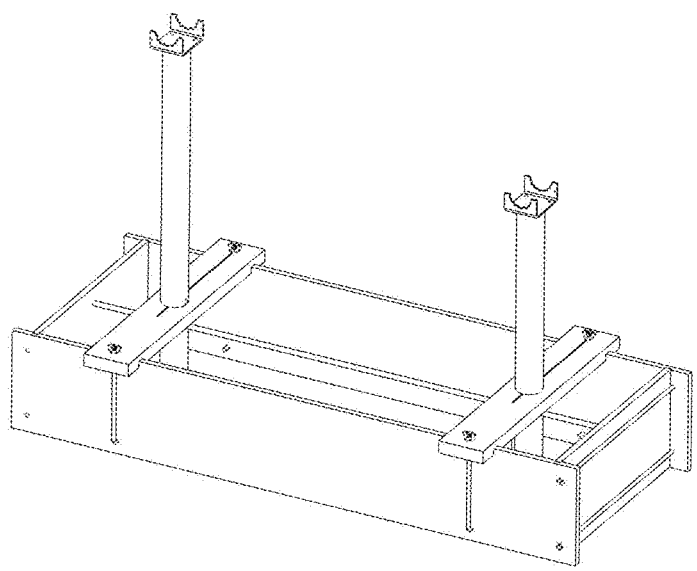
Figure 14C:
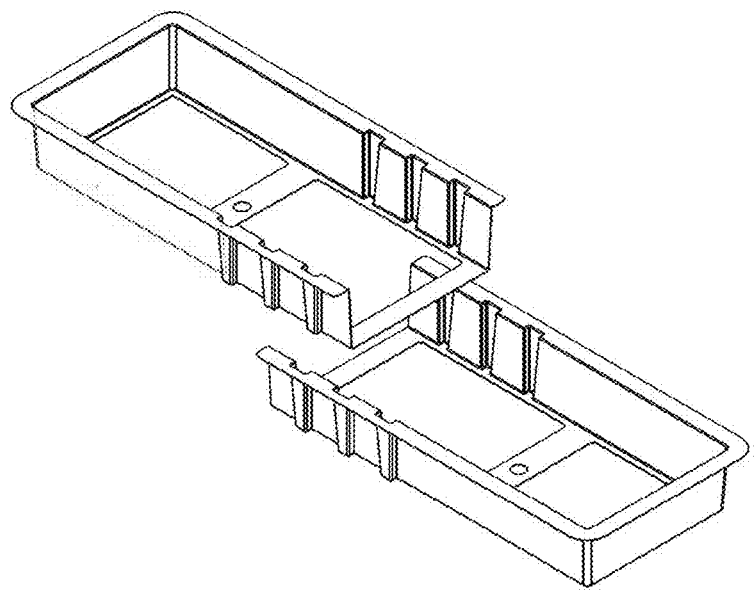
Figure 14D:
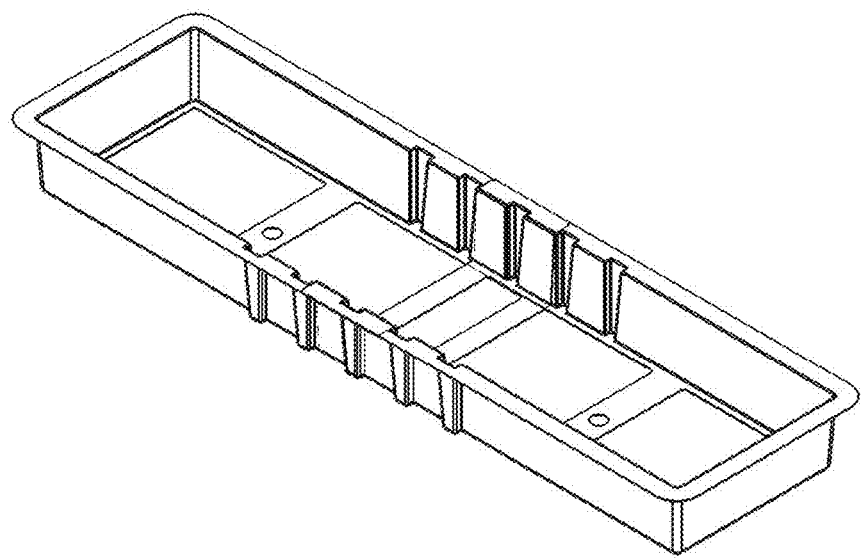

FIG. 14(A) shows a configurable ballast form (scalable size) and can be preformed out of aforementioned various materials. FIG. 14(B) is an alternative configurable ballast form. In FIG. 14(B), the two panel supports are also shown in place with the various support struts. These vertical supports transfer the weight of the panel to the ballast and provide mechanical stability.

FIGS. 14(CD) show still another configurable ballast form—one, which can be adjusted in size based upon conditions specified in the input specifications of the systems and methods disclosed in the present application. FIG. 14(C) depicts an exploded view of the ballast showing how the length is adjustable. FIG. 14(D) is a view when the two identical sides are connected. FIG. 15 shows an oblique perspective view of a five-module ballasted array schematic from a viewpoint level with that of the overall structure.

Additional Designs

In addition to the support structure upholding a set of modules, another mechanical aspect, concerning tracked systems, is the actual mechanics of movement, which involves gearing, axels, motors, mounting structures, and couplings. In the situation of a DAT, an armature or yoke is required. An exemplar depicted in FIG. 16, which provides the gearing, mechanical reduction ratios, and motors. The armature (5000) possesses journals for each of the two orthogonal tracking directions: elevation, which has two journals (5001 and 5002). There is a single journal (5005) for the azimuthal direction. For each of these two directions, a separate motor will be required, thus there are two motor mounts that are part of the armature: 5003 and 5004. The armature can be from made by casting, aluminum or iron. Alternatively, it can be made from galvanized steel tube, such has that which has been presented in other embodiments in the present application. A key element of its design is its ability to be material optimized just as the fixed, or static, system is, to have the minimum gauge that meets the requisite structural loading requirements on site.

Most tracking systems inherently have less structure than their static structure counterparts due to the ability to stow and reduce loading on the structure during periods of sustained wind buffeting/loading. They have to withstand weather conditions over decades such as temperature variations as well as stresses imposed by earthquakes and wind buffeting over time. Thus to be mechanically reliable over that time, a design that satisfies an appropriate set of input parameters needs to be implemented. While this disclosure concerns the tracking mechanics of a DAT, the aforementioned un-optimized design of those mechanics for the actual conditions still apply to those of any variation of SAT.

The use of bifacial PV modules can also be part of the input specifications. These modules feature front and back solar cells. While the front (towards the Sun) receives the majority of solar power, there is a ground reflective component of a more diffuse nature. Some of this light reaches the front surface. However, with a back surface of solar cells and a more reflective ground covering the overall light collecting power of a bifacial solar panel is increased, by some estimates between 20 and 35%. The reflectivity of the ground can be enhanced by the addition of a material such as lime, limestone, calcified limestone, sand, gypsum, gravel, calcium carbonate, or even white or aluminum paint. Moreover, bare soils have higher reflectivities in the visual than most green vegetation and are less wavelength selective.

In the mechanical design of the support system, selection of a bifacial module, results in a requirement of the support structure that does not obstruct the photosensitive areas. Such a structure will have to be optimized for the bifacial and its supports needs as well as all the other parameters and variables previously disclosed. The use of bifacial modules is probably more applicable when static support systems are used.

In the case of bifacial modules being installed on rooftops or other similar surface, these surfaces can be painted with a highly reflective coating, such as one containing titanium dioxide or aluminum not only to increase the surface reflectivity (and concomitantly reducing rooftop heat loading).

Electrical Design Optimization

There are a large number of input specifications involving electrical components: wiring (types, gauges, insulation, losses), conduits, various types of inverters or microinverters (min and max power ratings), transformers (DC to AC), DC-to-DC optimizers, combiner boxes (junctions which merge voltages from different strings), switchgear, grounding equipment, power management systems, energy storage systems, and maximum power point tracking electronics (MPPT) as well as the requirements for grid voltages and adding power thereto from the PV power plant.

A DC-to-DC optimizer is located behind each solar module which enables a technique called maximum power-point tracking. This is applied at the module level and not block or system-wide. These optimizers have high peak efficiencies of better than 99%, and can be connected in series and/or in parallel.

Maximum power-point tracking (MPPT) is a technique that grid-connected inverters, solar battery chargers and similar devices use to get the maximum possible power from one or more photovoltaic modules. Photovoltaic solar cells have a complex relationship between solar irradiance (Watts/m$^2$), temperature, and total resistance that produces a non-linear output efficiency which can be derived from the I-V curve (current-voltage). It is the purpose of the MPPT system to sample the output of the PV cells and apply the proper resistance (load) to obtain maximum power for any given environmental conditions. MPPT devices are typically integrated into an electric power converter system that provides voltage or current conversion, filtering, and regulation for driving various loads, including power grids, batteries, or motors. Inverters also may incorporate MPPT. Such inverters sample the output power (I-V curve) from the solar modules and apply the proper resistance (load) so as to obtain maximum power.

With respect to PV modules, there is no uniform set of specifications. The basic specifications usually consist of: cell type, number of cells, open-circuit voltage, short-circuit current, photoelectron conversion efficiency, maximum power current, voltage and current at reference conditions, and the decrease in efficiency of the cell as the temperature rises above a normalized point. Upon these basic module characteristics, the input specifications can be enhanced by additional circuitry such as breakdown diodes and/or blocking diodes. This information, along with additional entries, is contained in a PV module database. In additional to the standard PV module configuration, flexible modules and bifacial modules and their characteristics are included in the PV module database. One additional entry into the relevant database unique to flexible modules is the maximum allowable curvature.

Layout options are translated into electrical designs that are associated with the mechanical site layout. The amount of wiring and number of combiner boxes for a given layout is analyzed, and optimized, and is ultimately incorporated into the cost estimate. Minimization of electrical losses and/or costs of the electrical components is part of the optimization process. A map of an optimized example of three rows of panels is given in FIG. 17 that shows three rows of panels (2506) comprising one or more PV modules. The locations of the placed inverters (2501), combiners or combiner boxes (2502), the string attachment points (2503), the wirings (2504) of the string-to-combiner, and the wirings (2505) from the combiners to the inverters. In this example, ballasts supporting the panels (2507) are also indicated. (Ballasts are not used in other support structure designs.)

After the initial layout of the PV power plant based on first-order constraints, which should optimize the efficiency of laying down Photovoltaic (PV) modules, panels, or sub-arrays including row spacing, the next major task of any of the embodiments herein disclosed is the optimization of the placement and content of the strings. A string is a collection of modules electrically connected. When there is a change in the state of the current plant project (e.g., row spacing is altered) the embodiments check if electrical losses are within an acceptable range. Electrical losses between two points in the power plant are specified in advance as part of the input specifications.

Once the number of modules per string is known, the strings are distributed across the site by discretizing the site down into simple polygons and determining the best packing efficiencies for the integer number of strings to satisfy the GCR requirements. The module spacing and dimensions, along with the number of modules per string can fully define the string's area, and are thus used to determine how to distribute the strings given the GCR requirements. The maximum power available from the site, a user's desired power output, or the best target output indicates the total number of strings that need to fit into the site using a polygon-fit method or tessellation method.

Given the input parameters, such as topographical and meteorological concerning local conditions, the placement of the string of the array could vary by alteration of the dimensions of one or more specific support structures.

An embodiment is composed of at least two steps: first, the process grids the site coarsely with large strings or blocks of strings, ignoring keep-out or hazardous areas and possibly producing over-fill or under-fill on the first iteration. Subsequently, no-go zones are considered, with the large strings bifurcated across the zone in question. Finally, smaller strings are used to fill in any under-filled areas, keeping the same method of bifurcation across keep out zones if relevant. The entire process is automated and completes in less than a few minutes.

From the total number of strings, the type and number of inverters that can safely handle the maximum output can be determined; the DC and AC cable routings; the locations for where trenches (for electrical conduits) should be dug can be calculated; and the number of hours of various types of labor that are necessary to install these components can all be computed.

The data obtainable from the inverter database are used to simulate the performance of the inverters over time given input current from the strings as well as their approximate cost. As mentioned previously, the performance parameters include, but are not limited to: maximum input voltage and current, maximum power-point tracking voltage bounds, maximum possible AC power output, and output AC voltage.

The electrical design for the inverter-module pairing can be determined by grouping modules over the site to match the selected inverter's loading and system power requirements. Should the electrical losses not be within the acceptable range, the row spacing could be altered, either automatically within bounds or manually, to optimize (i.e., in this case to minimize) the electrical losses, upon which an electrical design can be generated.

The module and inverter types along with typical weather data from the site's location (see, e.g., the section on Site-Specific Considerations) will be used to determine how the modules will be arranged into strings to best fit an inverter's voltage for maximum power (i.e., peak loading) while staying inside that inverter's limits and as well as personal-safety voltage limits.

While often modules and/or inverters are specified in advance, there is no requirement for this assumption. These can be left as design variables and at the appropriate stage the process can suggest those modules and/or inverters, which are optimally appropriate for the constraints imposed by the input specifications.

In the case of wiring, the type, size, and length are variables that can be optimized with input specifications also including cost, electrical losses, and the type covering material.

There are also other electrical components that are part of the overall electrical system of a PV power plant: These include electrical switchgear and grounding equipment. A part of the latter are interface plates which fit between various metallic components of differing resistivities to provide proper grounding conductivity between them.

These aforementioned embodiments allow a higher granularity of rack positioning and specification allowed by structurally independent blocks fabricated with configurable manufacturing techniques yields a higher rack resolution than that of the electrical strings. Therefore no finer tuning of the design can be possible for a fixed array than by designing, manufacturing and guiding the installation of each block at the right tilt, location, azimuth, bank, height, etc.

Inverters and Microinverters

An inverter is an electrical device that converts DC electricity into AC. In designing a solar PV power plant, there are two conventional inverter modes: a microinverter, one that is localized to a panel or module, and a central inverter which is fed DC power from many panels. Depending upon its power rating, an inverter is either a string or a central inverter. Within this application, these are considered to be in the same class of inverters, distinct from microinverters.

Either of these approaches has advantages and disadvantages. An option exists in the design variables/input interface to try either both of these approaches to determine which is more economical, or just to select one as an initial constraint. In many design situations, the trade-offs of the conflicting goals are not clear, thus optimization is in order.

Many strings feed a centralized inverter; each string is a serial connection between a large collection of solar modules. Of note, the diminution of output, for whatever reason, of one solar cell or a module or a panel, will affect the ability of that entire string to produce electrical energy as efficiently as it could.

Modules with microinverters are wired in parallel and only with an AC output. Thus using microinverters in a distributed approach reduces the effects of (even partial) shading on one or more panels or modules. From this arrangement, microinverters can harvest more electrical energy, with estimates between 5 and 20% more power. In addition, most microinverter manufacturers incorporate communication electronics, thus remote real-time tracking of one or more microinverters becomes feasible. Should a microinverter fail, then the effect would be minor on the overall power output of the facility, in contradistinction to the failure of a central inverter. In the future, microinverters may be incorporated into modules themselves just as bypass diodes are today.

Parallel wiring of modules implies the level of voltages will be less, e.g., 240V instead of 600V. The AC output of the microinverter implies lower electrical resistance losses and the greater use of less expensive wiring for AC. This is in contradistinction to the higher cost for the high voltage DC wiring required in central inverters. Microinverters also have the advantage over central inverters in that they do not require significant support infrastructure such as an isolated and protected environment, a concrete pad, and ventilation for the excessive heat produced by said central inverter. Higher voltages are more efficiently transmitted than lower voltages, implying a central inverter would have an advantage. Also, central inverters can interface more readily with the grid.

Batteries (or other storage systems) may be used in PV power plants to generate optimal matching of energy production with demand, a technique known as load shaping. Demand for electricity in non-summer months in states like California for example tends to have an upward morning ramp and a higher peak in the early evening as people return home from work. Such a ramp is well served by having an optimally oversized solar field with a storage medium (such as batteries) that can release electricity into the grid at hours when it is most valuable, whether or not the solar resource is available. Other storage media than batteries include capacitors, fuel cells, and inductors.

If batteries are the medium used to store the extra electrical charge or power, they would have to be fed with DC power. Moreover, the rate of feeding power to them has to be carefully controlled. If microinverters are used instead of central inverters, then their AC output would have to be reconverted into DC before feeding a battery. This conversion is not without a loss. Thus with batteries, or other storage entities, such as capacitors, the power is better kept as DC until just before it enters the grid.

Besides these aforementioned factors, there is the cost differential between these two types of inverters and also substantial differences in warranties. This is likely to diminish over time as microinverter technology improves.

Power Management

PV power plant control systems and methods monitor and manipulate the amount of electricity produced by said plant, primarily for that electricity to enter ultimately the grid. An idealized view of the control of a PV power plant might be based on the idea that the plant can be controlled as a single unit. However, a more realistic view is that a PV plant has multiple sources of electricity in which each one is identified by, or culminates in, an inverter. The inverter's AC output needs to be merged intelligently with that of other inverters or even with the grid, thus requiring precise AC frequency control (or at least precise average frequency control).

Such control systems and methods need to regulate power factors at the point of grid injection; have precise frequency control; be able to control ramp rates, both down and up; control the output of the inverters so that they do not exceed the limits imposed by entry into the grid; and control overall electrical behavior of the solar power plant. The control also must be aware that inverter output cannot be diminished below a minimum level without causing a high DC voltage situation.

These control systems and methods comprise automatic voltage regulation, active power controls, ramp-rate controls, fault ride-through, frequency control and others. Automatic voltage regulation is achieved by three approaches: reactive power, power-factor, or voltage regulation.

Electrical Design Automation

The design of the type and location of the electrical components is ripe for optimizations, with implications for efficiency and cost. The design variables include the gauge and lengths of DC wirings and of AC wirings, the types and number of inverters, transformers, switchgear, grounding equipment, and power management systems. Other components also could include energy storage units such as batteries, inductors, and capacitors.

While it is often the case in designing the overall solar power plant that the electrical design is performed before the structural design, this is not an absolute or even a necessary requirement. There are various approaches that can be adopted depending upon the results of one or more optimizations that might have taken place before performing the electrical designs and layout.

These approaches can be crudely separated if one of the fundamental constraints is based upon a land-size limitation or a grid-size limitation. In the former, the amount of land that is to be utilized for PV panels, irrespective of the requirements of entering the grid. In the latter situation, the amount of energy produced by the solar PV plant is limited by what the grid can tolerate.

FIG. 19 presents an embodiment of a design process for a land-limited power plant. The initial step (1901) is to determine, either manually or automatically, the boundaries of the site. From the results of the determination, the site can undergo partitioning (1902) such as discretization or polygonization, meaning the virtual representation of the site is divided into sections and done so in an optimized fashion (along with allocations of access roads and conduit trenches) either to minimize the number of partitions (or a subset thereof, like squares or rectangles) or to minimize the placement of pre-defined partitions of a certain size, with additional placement of smaller partitions that fill in the remaining usable areas.

Upon partitioning, there is the option to automatically (or manually) assign blocks (sub-regions) within each of the determined partitions (1903) if the subsets of these modules found within these blocks are to be electrically connected serially and the cumulative DC voltage transported to one or several, ganged central inverters. An alternative is to use microinverters on each of the modules, merge the AC voltages of all the inverters before integrating it with the grid. The maximum expected amount of energy to be produced by a block can be estimated by scaling the total maximum energy to be collected by the PV power plant with the physical size of that block relative to the total site area.

Thus in the embodiment of FIG. 19, there is the choice to make, either automatically or by user input which type of inverter to be used. In the case of central inverters, one or more inverters can be assigned (1906) to each block. The DC wiring to the central inverter needs to be determined by optimization: the figure-of-merit or the secondary objective function will be to minimize the total DC wiring volume or the total DC wiring cost (1907) from the modules to one or more inverters. A separate secondary objective function (1907) will minimize the total volume or total cost of AC wiring from the collection of all inverters to the transformer(s), before the power is integrated with the grid. Power storage modules incorporated into the power plant, if used, should be receiving only DC power. Such power storage units could be batteries, inductors, or capacitors. There will be inefficiencies in converting DC to AC and another inefficiency in converting AC to DC. These inefficiencies have to be factored into the appropriate primary and secondary objective functions used.

After these optimizations, production, structural, Single Line Drawing (SLD), construction and layout drawings can be produced, bill-of-materials, as well as layout schematics for the implementation of all components and their locations within the site of the power plant. The output specifications for the electrical components comprise a bill-of-materials, costs of individual electrical components, single line diagrams, labeling lists, interconnection diagrams, CAD drawings and files, permit drawings, construction drawings, civil diagrams, production drawings, and plant layout.

If the design of the site is to be grid-limited, then two options are possible, depending upon the type of inverter chosen. An embodiment is depicted in FIG. 20, which is a flow chart with the various steps to optimize the electrical design based on the exclusive use of microinverters. There are the options in steps 2001 and 2002 to determine the site boundaries and subsequent automatic partitioning (i.e., discretization or polygonization), which really does not affect the electrical design as they would in the case when central inverters and extensive DC wirings are used. However, the solar plant layout should be known in advance (2003) so that the AC wiring layout can be determined as well as the minimization of its volume or its cost.

This particular approach is more straightforward in design than that of the use of central inverters, as microinverters as assigned (2004) to one or more modules. Moreover, the DC wiring will already be minimized, as the energy collected from the one or more modules is converted to AC in situ. The remaining (downstream) wiring is AC, and the layout of the various AC wiring routes is minimized (2005). This minimization also applies to the types of AC wiring used in order to satisfy the input specifications plus an over-design factor. Upon optimization of the AC wiring the production drawings and layout schematics can be generated. The system losses are the sum of losses from the DC wiring, the DC-DC optimizers, the DC-AC inverters, and any intervening electrical components such as energy storage units.

The other option for the grid-based limitation is the use of central inverters. This embodiment requires extensive and expensive DC wirings, presenting the need to minimize the amount or volume or cost of this component. FIG. 21 depicts such an embodiment to optimize the electrical design based upon the assumption of central inverters. After the site boundaries have been determined (2101), either automatically or via interaction with a user, automatic or manual partitioning occurs (2102). The number of partitions is minimized within the site boundaries. Alternatively, the number of pre-determined partitions can be automatically laid out, with additional smaller ones filling in the remaining unassigned areas.

The cost of replacing inverters has to be incorporated in the overall cost estimate. A typical warranty for a string or central inverter is for five years, thus for a 25 year project lifetime, an inverter could be replaced up to four times. Some microinverters are currently warranted for at least 20 years, reducing financial risk for owners who opt for them.

The next step is to assign modules to a string, which are connected in series to yield high-voltage, high-current DC outputs. The high current carried in the interconnecting cables results in relatively high losses due to electrical resistance. These losses are mostly dissipated as heat. An optimization is appropriate in this case where a secondary objective function (2103) is defined that is aimed to maximize the number of modules assigned to a string, while minimizing the DC wiring volume. The next step 2104 will be to define a second secondary objective function to minimize the number of inverters per block while maximizing the total output of all the inverters. A partition or block is a physical subset of the power plant in which the energy generated within that block is converted from DC to AC by a single inverter (2105). Upon optimization of the design the production drawings and the aforementioned electrical wiring diagrams can be generated.

Expert System

In general, an aspect of one or more embodiments disclosed herein includes an automated power plant design system for aiding a user to design a custom power plant. The design system includes an expert system having one or more rules which constrain the design. An interface for input specifications from a source such as a GUI or database is provided. A component definition system, having an input for receiving the input specifications, generates a complement of structural (i.e., mechanical) components and/or electrical components and provides specifications for the manufacture of said components.

Implementations of the embodiments described herein may include one or more of the following features. An automated manufacturing specifications generator provides manufacturing specifications needed by the manufacturing system to manufacture and to install the components of the custom solar power plant. The automated manufacturing specifications generator may additionally supply specifications for any one or more of the following: manufacturing structural components such as a structural support system of a plurality photovoltaic modules; electrical wiring to interconnect said modules; switchgear; grounding equipment; electrical wiring to carry electrical power from a plurality of modules to combiner boxes; a plurality of combiner boxes to combine electrical power from a plurality of modules; electrical wiring to carry electrical power from said plurality of combiner boxes to a plurality of inverters; a plurality of inverters to convert one type of electrical power into another type of electrical power; one or more transformers to convert electrical power of one type into that of another type of electrical power; and a integrator controlled by a power management system to feed the electrical power from the PV power plant into the grid under specified conditions.

The one or more rules may include one or more of the following characteristics: (a) a limitation imposed by the longitude/latitude of the site; limitations imposed by the size, terrain, and geometry of the site; a limitation imposed by the type of PV module to be used; a limitation imposed by the amount of grid electrical power; a limitation imposed by the available funding; a limitation imposed by the seismicity of the site; a limitation imposed by the meteorological conditions found at the site; a limitation imposed by the amount of electrical energy to be produced; a limitation imposed by the amount of IRR; a limitation imposed by the soil and bedrock of the site; a limitation on the maximum losses due to electrical components; a limitation imposed by the use of maximum power point tracking electronics; limitations imposed by local safety agency regulations and specifications such as building codes, and electrical code specifications. The list of choices may include button selectable options or a pull-down list of options or may be included in a database or file or entered by voice via voice/speech-recognition system.

The complement of components may include one or more components to structurally support a PV module and the component definition system may generate a mechanical design as part of the solar power plant. The complement of components may also include overall components of the electrical design as part of the design of the solar power plant. The component definition system may also calculate the amount of electrical energy to be generated. The component definition system may generate a mechanical design and/or an electrical design either or both of which are optimized with respect to a optimization parameter such as efficiency, reliability, cost, IRR, payback time, power generated over a given amount of time. Two or more of the optimization figures-of-merit may be assigned relative weights and the component definition system may generate the mechanical and/or electrical designs optimizing the optimization parameters of either, or both, of the mechanical and electrical components, according to the assigned relative weights.

Another component of the power plant design system is a cost estimation system that provides a bill-of-materials with total costs for each component, labor costs, and a total cost of manufacturing and installing the solar power plant.

The power plant design system constrains, to an acceptable range, the power plant specifications by enforcing the one or more rules and generates a customized and optimized power plant. An automated manufacturing specifications generator, having an input for receiving the custom power plant design, supplies output specifications needed by the manufacturing system to manufacture and specifications and instructions to install the custom power plant.

Another of the embodiments of the present application is a method for aiding a user to design a custom solar array to be manufactured by a predetermined manufacturing system characterized by a predefined set of tools, processes, and materials, the method comprising: receiving input specifications from said user; generating a complement of components based upon said specifications; generating a design for said custom solar array constrained using information representing predetermined limitations which, if observed, ensure that said custom solar array can be manufactured using said predefined set of tools, processes, and materials, said method preventing generation of a design that requires tools, processes, or materials other than the predefined set of tools, processes, or materials; and generating manufacturing specifications needed by said manufacturing system to manufacture said custom solar array and specifications and instructions to install said array.

Manufactured and/or recommended items includes the components of the recommended or selected array support structure, its design and specific dimensions for each item, the type and weight of the ballast (if selected), in which the one or more types and numbers of inverters, one or more types of wiring, and wiring layout, one or more DC-DC optimizers, one or more max-power-point trackers, one or more combiner boxes, one or more transformers, switchgear, grounding equipment, one or more energy storage devices, and one or more power management systems, and combiner boxes are derived from said optimization. These designs and components can be unique to each module, panel, or sub-array, depending upon the degree of optimization specified and other input information.

Another of the embodiments of the present application is an automated solar array design system for aiding a user to design a custom solar array to be manufactured by a predetermined manufacturing system characterized by a predefined set of tools, processes, and materials, the design system comprising: information representing predetermined limitations, including rules, which, if observed, ensure that said custom solar array can be fabricated using said predefined set of tools, processes, and materials; an interface for receiving solar array specifications from said user; a component definition feature having an input for receiving said solar array specifications, said component definition feature generating a complement of components based on said solar array specifications; said solar array design system generating a custom solar array design for said custom solar array constrained using said information, said system preventing generation of a design that requires tools, processes, and materials other than the predefined set of tools, processes, and materials; and an automated manufacturing specifications generator having an input for receiving said custom solar array design and supplying manufacturing specifications needed by said manufacturing system to manufacture said custom solar array.

Another embodiment of the present application is an automated site engineering system for aiding a user to design a custom solar array comprising photovoltaic panels, the design system comprising: a user input interface, in which said user can input one or more parameters pertaining to the specifications of the solar array; a component definition feature having an input for receiving said solar array specifications, said component definition feature generating a complement of components based upon said solar array specification and providing mechanical design and/or electrical design parameters for said components; a set of databases, in which data regarding the characteristics of components are stored, and obtained therefrom; and, an objective function that has—as constraint inputs—the complement of components, said set of databases, said user inputs, wherein the objective function is then optimized for said constraint inputs.

In another general aspect, one or more embodiments include methods for aiding a user to design a custom power plant. One or more rules representing limitations imposed by a manufacturing system is defined. The user provides specifications and a complement of components is generated. Mechanical parameters for the components are provided and mechanical design information is collected from the user. Electrical parameters for the components are provided and electrical design information is collected from the user. The range of acceptable inputs for the specifications or the mechanical design information and/or the electrical design information is constrained by enforcing the one or more rules.

Implementations of the embodiments described herein may include one or more of the following features. Determining output specifications needed by the manufacturing system to manufacture and to install the custom power plant may be generated. The output specifications may include one or more of the following: specifications for wiring for the custom power plant; specifications for manufacturing one or more structural support systems (or racks) for the custom power plant; and specifications for interconnecting combiner boxes, inverters, switchgear, ground equipment, power management systems, maximum power point trackers; and transformers between the PV modules of the custom power plant and the grid.

The custom power plant design may include a user-defined package and the specifications may include one or more of the following details: (a) a shape of, (b) a dimension of, (c) a position of at least one of the components in, or (d) an orientation of at least one of the components in, the user-defined package. Feasibility information may be provided to the user regarding acceptable relative locations and orientations for the components.

In another general aspect, one or more embodiments include a method for aiding a user to design a custom power plant. One or more rules representing limitations imposed by a manufacturing system are defined. Specifications are received from the user and a complement of components is generated based upon the specifications. Manufacturing specifications are generated that are needed by the manufacturing system to manufacture, as are installation specifications and instructions to install the custom power plant.

In another general aspect of one or more embodiments disclosed herein, the manufactured components are labelled as to installation location within the custom power plant or a group (of same physical characteristics) designation, or both.

Virtual Space Design Environment

Given the aforementioned complexities, an embodiment for the accomplishment of the design of a solar power plant is within a virtual state—a model that contains all of the constraints imposed upon it by the given input specifications and with visualization of this virtual state (or project state), a user can view the automatic placement of components, adjust input specifications and design variables in real-time to see the affects of such adjustments. Thus there is always a current project state, representing the current configuration of structural and electrical designs. If there is a change, for example, in any of the input specifications, whether a change or an addition, or a removal, the embodiments disclosed herein automatically evaluate and optimize any affected items. For example, if the spacing of the rows of panels is altered, then the electrical losses are updated, and compared with specified allowances. Automatic flagging of problems exists should a change cause limits to be exceeded. Thus current state of a project always represents the optimized total configuration based upon the input specifications. An interface, such as a GUI, can provide real-time updates as to the costs of the individual components (and their quantities), the electric losses, and other output information described in the present application.

The interface with a user may include a layout system in which component locations may be defined in a virtual space that contain representations of the geographical layout of the site. The layout system may include component icons representative of the complement of components. Icons might be for the modules, the panels, the type of support structures, the spacing between the panels or modules, the access roads, the trenches for the electrical conduits, inverters, combiner boxes, transformers, and wirings of various types. The icons may be moved around the virtual space to define the component locations.

The layout system may include a feature allowing the user to manipulate the size or shape of the virtual space. The layout system may include a drawing feature in which the system automatically adjusts the virtual space to fit an arrangement of the component icons. This arrangement may be created by the user. The layout system may include an automatic arrangement feature in which the system automatically arranges the component icons and creates the virtual space to fit the arrangement of the component icons. The virtual space may comprise a 2D or 3D surface. The component locations and the virtual space may define the mechanical and/or electrical specifications for the custom power plant, including support structures, wiring types and paths, locations of switchgear, grounding equipment, power management systems, locations of combiner boxes, inverters, transformers, access roads, and electrical conduit trenches.

SAM

Several well-tested algorithms, available from NREL's System Advisor Model (SAM), are used in the evaluations of power plant configurations of the embodiments described herein. SAM is a modeling program that calculates performance and financial metrics of renewable energy systems, including those based on photovoltaic modules. It makes performance predictions and cost of energy systems based on installation and operation costs and system design parameters that are specified by the user. A SAM model represents a particular model based upon these specific parameters. It does not perform optimization. Moreover, is the responsibility of the user to interpret the results. While the source code for SAM is not publicly available the core routines are available in the SAM Simulation Core (SSC) which can be called from external programs. SAM is described in Blair et al. (2014), and this reference is incorporated herein in its entirety.

Site-Specific Constraints (Site, Meteorological, Geological, Regulatory)

Geographic or topological conditions can be determined from a local survey or from commercial databases that provide satellite imagery, either from radar, lidar, or stereo techniques. Shading or shading from local effects, such as trees, mountains, buildings and the like can be modeled and calculated and interpolated and the imposed deficiencies therefrom entered as part of the overall design. Shadows tend to have a diurnal behavior that can be modeled and entered into the modeling procedure. FIG. 18 is an example of a model of a shading situation with the abscissa being the height of the base array in meters and the ordinate axis being the fractional shading factor, representing the amount of light lost relative to what could have been collected. This represents the shading caused by one row of panels upon another row of panels, for example.

Another factor that is considered is the level of seismic activity. Based upon the level of past seismic events, a modified structural design might be appropriate.

Meteorological conditions can be obtained from local anecdotal information, or from more sophisticated databases such as those offered by National Weather Service, Satellight, Solar Projector, Canadian EPW, SolarAnywhere, Helioclim-3, SolarGIS climData, NASA-SSE, SolarGIS iMaps, PVGIS-ESRA, RETscreen, or Meteonorm, or similar commercial entities. For example, diurnal ground fog (e.g., in the morning) might affect the array's performance during part of the day. Thus the design would take this into account via an hourly diminution in solar irradiance, thus biasing the design (a non-zero bank for each module) towards that part of the day which typically has clearer skies. Shadowing of the array or parts of the array during particular hours would be considered similarly in the optimization, of say, maximum power collected as the figure-of-merit.

For long term or average meteorological conditions, it is commonplace to use the database Typical Meteorological Year 3 (TMY3). This a compilation of weather data for specific locations, at least comprising 1454 sites in the US of A and its territories. The data for TMY3 were collected during either 1976-2005 or 1991-2005, depending upon the site. There are older TMY's, but the site sampling is very limited in both cases. The TMY3 information is fed into the power profile embodiment, and the result of that becomes the input to the income estimation embodiment, which in turn is fed into the embodiment that calculates the value.

It is important to know the soil conditions of a particular site as these dictate what support systems can be used. For example, if bedrock is located only a few feet below the basal subsoil, then pile- or screw-driven foundational support would be infeasible. If the site is landfill, then basically only ballasted support would be possible. A service that can provide information regarding the terrain and the depths of the bedrock is that of esri.com or ArcGIS.com.

The 3D profile of the terrain (DTM, digital terrain model) of the site is important for two reasons. First, the amount of earth that needs to be moved or graded to facilitate a more appropriate area for the placement of the power plant. An estimate can be derived as to the amount, just from modeling with a low-order 3D surface (the desired shape of the terrain of the site), and deriving a statistic (e.g., variance) between the actual 3D profile and the low-order model which would correlate with the amount of earth to be moved or the amount of effort to prepare the site. Thus a contribution to the overall project cost of site preparation will be derived assuming local rates for time, equipment, and labor or site reshaping/preparation.

In addition to altering the 3D profile of a site for a power plant, another estimate that enters into the overall cost estimate is the amount of vegetation, such as trees and shrubbery, which needs to be removed in advance for the site preparation. This can be estimated from one or more images of the site in differing wavelengths. The length of a shadow cast by an object, a tree for example, estimates its size and/or height above the ground. The images can be digitally processed by known image processing techniques, such as segmentation, and measurable quantities such as energy and entropy, to produce one or more metrics that correlate with the amount of work to be performed to prepare the site. An area within a site can be identified first by segmentation and then identified as a pond by being a closed structure and also using the values of energy and entropy within that area as compared to areas external to it.

Other inputs include the arrangement of the site into a grid space according to the given site borders, perimeter and internal roads, keep-out (no-go) zones (e.g. swales, river beds, and temporary construction zones including equipment areas) within the site, location, elevation maps, and any rolling landscape or topography. For instance, greater tilt implies greater row spacing. Another important detail to be considered is how the optimum array-filling factor is to be achieved. This represents a sub-problem to the overall optimization process. It is assumed that there is one best setup given the design parameters or at least a small family of best designs for each module and inverter pairing. On the other hand, this assumption might not be true, in which case options in this part become part of the design parameters.

Inputs involving civil design of the solar plant include specifications for roads, fencing, as well as drainage. Detailed civil drawings and plans of the resulting design, including plans and drawings for fencing and landscaping, site grading and earthwork, roads and drainage, as well as for solid waste removal, can be easily generated for the desired designs.

Cost Estimations

A PV power plant design, including components and labor, directly determines the cost of the installation. The input specifications from the user will include the methods by which this plant will be financed. Operating costs can also be factored into the computations so as to provide information regarding the cost of a given approach. Once a physical system has been fully designed the performance can be evaluated with a combination of custom and industry-standard simulation tools (such as SSC) to obtain the power delivered over time for the lifetime of the project. The installation cost, power income, loan payments, taxes and tax incentives, and operations cost to create a cash flow over the lifetime of the project. This cash flow is used to determine the value of a particular design. One of the mechanisms for setting any of the financial inputs is through the design interface, such as a GUI.

An exemplar of a portion of the design interface might look like is depicted in FIG. 22. The various financial inputs comprise: the type of market model for the utility; the lifespan of the financing; the loan term; the loan rate and fraction; a value for the expected inflation rate; insurance rate; and the type of depreciation and its options; labor rates for both electrical and structural, which are naturally dependent on the latitude and longitude (i.e., the locale); various tax rates; and a number of other inputs as well. Such information can also be entered via a database or other file.

One of the options is for the depreciation model. A drop down menu is one possible way that the various options can be readily displayed. Two examples of such models are MACRS (modified accelerated cost recovery system) and depreciation distributed over a fixed number of years.

Upon producing a design, the next step is cost estimation using the following method: the pressures and forces placed on the supporting structure from wind buffeting, seismic loads, snow loads, and dead loads (gravity) are calculated; the determination of the most economical, lightest gauge support structure strong enough to bear the maximum possible load plus an over-design factor is then determined. This procedure continues until there is a complete design for the given set of design input specifications. From this point the performance of the design over its lifespan can be modeled and the one or more figures-of-merit can be determined.

A detailed energy or performance simulation analysis will include detailed daily, monthly and yearly energy generation profiles including various energy loss diagrams.

The results of modeling the performance are stored in the simulation object (step 204, of either FIGS. 4(A or B); or step 506 of FIG. 5), which includes cash flow. This task is often not in parallel with the cost estimation task (409, FIGS. 4(A or B); or step 505b of FIG. 5).

After the parameters and initial conditions have been entered (input specifications), and after an embodiment has been executed, an arbitrary number of the best configurations will be presented. Each one is presented after it has been re-run one final time, during which multiple simulations can be used to double-check or cross-reference results. Associated with each of these configurations are options for additional input. A detailed report of the resulting design, resulting layout, relevant analyses, the power simulation results, the income, and the ultimate value of the project can be generated for the desired designs.

The structural codes are input to the designs of the electrical and structural/-mechanical layouts as well as the tilt, height, bank, and azimuthal values and the process is iteratively repeated. These entries are then fed into the design process or a mechanical layout feature or system and an associated cost is computed. The mechanical layout feature then produces outputs that allow revisions of the design parameters by the user. The next step is to take that revision to alter, optimally, the tilt, height, bank, azimuth and other values and repeat and the process is repeated. The mechanical layout feature possesses internal optimization systems and processes. The best N results are compiled and presented.

The other broad category of entry information is that of the system model, which will be ultimately represented by an objective or cost function, something that is well known in the art of linear or non-linear programming/optimization (see, e.g., Luenberger 2003).

From the total number of strings, the number of inverters that can safely handle the maximum output can be determined; the DC and AC cable routing; the locations for where trenches should be dug can be calculated; and the number of hours of various types of labor that are necessary to install these components can all be computed.

The total number of structural components to be manufactured; the cost of materials, labor, machinery, manufacturing tools & processes, transport to the site, are also added to the cost estimation.

Based on the results of the performance simulation analysis and the cost estimation of the designs, a comprehensive financial returns analysis can also be compiled, including rates of pre-tax and after-tax returns, payback periods, nominal cost of electricity, and net present value of the project. A comprehensive financial returns analysis can also include various sensitivity and benchmarking analyses versus various inputs and parameters, including site location, type of PV panel or type of structural components.

By fully automating the laborious design process a fuller understanding and sensitivity of the viable parameters can be achieved. This is in stark contrast to the lack of granularity in sensitivity analysis that can be achieved with the standard few iterations of a human PV design engineer or team of engineers. Thousands of iterations can be obtained in a short tolerable execution time to achieve not just small incremental improvements, but also strategically different designs, with unambiguous benefit to the solar developer and/or the final site owner.

One embodiment for the optimization algorithm is to determine the structural costs after the appropriate loads for the site have been calculated or input. A look-up table (database) can be computed and the top most economical structures to meet the design criteria can be selected or further examined. Costs include materials cost and number of labor hours multiplied by a local labor rate, with region-dependent prevailing wage and/or union wage factors built in. By having a number of feasible options for the structure, a cost function (objective function or figure-of-merit) can be computed and entered into the table. The best solutions can then be automatically identified and displayed for the user. Thus in this embodiment, instead of designing the layout and then seeing what structure (and its associated cost) has been determined for that layout, the number of modules per array will be an output from structural selection. For the first pass, the structural module will come before layout in order to determine the structural footprint.

Total Value and Financial Analysis

There are multiple types of total value (figures-of-merit), such as total energy produced (maximum site energy), payback period, or internal rate of return (IRR). For the IRR, the net present value is directly calculated given the hourly income (grouped into the utility company's pay periods and power purchasing agreements (PPA's) Time of Use factors) and numerical methods are used to calculate the IRR over a given period. The total value can be determined from the up-front costs and the income stream over time. This completes one iteration of the overall objective function.

Once all of the components have been designed, the cost for each component and hence a total cost for the project can be estimated. Once all of the components have been laid out, performance simulation analysis can be completed to compute the projected energy generated by the plant design. A detailed financial returns analysis involving a wide range of figures-of-merit can then be completed, including but not limited to, pre-tax and after-tax rate of return, net present value, levelized cost of energy, and payback period.

In FIG. 23, a perspective diagram shows the IRR in percent, as a function of both azimuth and tilt. The units are degrees. Optimization can be performed to find the highest IRR, given certain user or environmental constraints. Another way of looking at the effectiveness of a given design is the cost per panel as a function of tilt and height for a certain set of input parameters. FIG. 24 is a perspective diagram showing such a relationship for a specific site (longitude and latitude).

One of the latter aspects of the optimization process is a structural design, which will be the most economical design to fit the imposed or desired criteria. There are alternative embodiments, each of which presents a different set of advantages and disadvantages.

Monte Carlo Enhancements

As has been discussed, the process of optimization described herein centers on automating a design given some set of parameters and then simulating that design over time. The data used to drive the simulation therefore has a large impact on what design will ultimately be determined as optimal. To ensure robustness in this process, a "typical meteorological year" (TMY) data file from the National Renewable Energy Laboratory is used for primary simulation. This data file is built from the specific months out of years of historical data that were deemed to be most 'typical', and it therefore ignores abnormal events (e.g., volcano eruptions affecting solar irradiation for weeks or months). However, while by definition an abnormal event is not expected in the typical year, such an event could be expected over the lifetime of the installation, which can last up to three decades. For this reason, additional historical data, including data representing abnormal events, can also be used during simulation.

The process by which further information can be used in simulation is described. In evaluating the merit of the design, the simulation can include a TMY as well as a combination of other historical data. The historical data is recombined randomly to produce off-nominal years. Several of these off-nominal years are produced by what is known as "bootstrapping" in statistics: random sampling (with replacement) from the extant data. This process helps ensure that the optimal design is not overly tailored to a specific data file, but instead is robust against a range of known conditions for the site.

The process of using bootstrapping to randomize individual evaluations in an optimization process can be considered a Monte-Carlo approach to optimization. For a basic introduction to Monte-Carlo techniques see, e.g., Fishman (1996).

A useful aspect of the general optimization strategy described (the hybrid coordinate-search and global-search, discussed above) with a Monte-Carlo approach is that it allows the off-nominal data to be used in a graduated way, alleviating the computational expense of the added simulations. In evaluating the merits of two designs with grossly different performance over a TMY, evaluating the designs further over the off-nominal simulations would reveal little about which design was superior. However, because the coordinate-search-global-search method finds numerous local maxima (up to one per iteration of the coordinate search), it can keep track of competing but different designs. As numerous local maxima with similar performance are found in the parameter space, their ultimate differences can be determined by adding simulations over off-nominal conditions. With increased abnormal weather conditions predicted due to global warming, the ability to adjust design parameters to compensate for likely abnormal conditions becomes important.

As such, for the early stage of the optimization process, only TMY datasets are used. As differing designs become competitive, their differing performance is evaluated more carefully with the off-nominal conditions, yielding the best-expected performance for real conditions in a graduated way suitable for efficient optimization.

One of the embodiments of the present application is a method to optimize designs of a custom solar photovoltaic array system comprising: the use of normative databases of meteorological and seismic data as inputs to the designs of mechanical and electrical components of said array system; the use of real-time as well as predictive databases of financial (i.e. inflation, interest rates, exchange rates, cost of capital) and utility rate (i.e. cost of power across time of day or year) data as inputs to the designs of the said array; the adjustment of the normative databases based upon Monte Carlo simulations to predict abnormal behavior; the adjustment of the designs of the mechanical and electrical components to compensate for said abnormal behavior; and, storing, reporting, or further processing said designs.

Additional Considerations

In another embodiment, a civil layout system and procedure possess an input interface to receive design variables related to a civil layout and also to receive solar array input specifications. This system will generate at least one optimized civil design of the solar array, in which the design is Pareto efficient and the choice of civil features are derived from said optimization. The civil design layout can be a part of the virtual space design environment disclosed hereinabove.

In another aspect, applicable within any of the design systems and processes, the various optimized structural components into a finite or quantized number of sets (quantity selectable), reducing the number of different components that are to be manufactured, while achieving an increase in overall efficiency and/or a decrease in costs.

The method may be encoded into computer programmable codes which may be stored in a computer-readable memory that can direct a computer or other programmable data processing apparatus to function in a particular manner, such that the instructions stored in the computer-readable memory produce an articles of manufacture of the solar power plant including instructions which implement the functions/acts specified in the block diagrams and/or flowchart block or blocks.

The methods described here could be encoded as instructions to a variety of processors or programmable systems (including GPUs and FPGAs) to cause a series of operational steps to be performed on the processors or other programmable apparati to produce a processor-implemented process such that the instructions which execute on the processor or other programmable apparati provide steps for implementing the functions/acts specified in the block diagrams and/or flowchart block or blocks.

Accordingly, example embodiments may be implemented in hardware and/or in software (including firmware, resident software, micro-code, etc.). Furthermore, example embodiments may take the form of a computer program product on a computer-usable or computer-readable storage medium having computer-usable or computer-readable program code embodied in the medium for use by or in connection with an instruction execution system. In the context of this application, a computer-usable or computer-readable medium may be any medium that can contain, store, communicate, propagate, or transport the program for use by or in connection with the instruction execution system, apparatus, or device.

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated.

In the drawings and specifications of the present application, there have been disclosed exemplary embodiments of the invention. However, many variations and modifications can be made to these embodiments without substantially departing from the principles of the present invention. Accordingly, although specific terms are used, they are used in a generic and descriptive sense only and not for purposes of limitation, the scope of the invention being defined by the following claims.

Some of the methods and systems disclosed in this application are applicable only to a specific type of power plant, such as a ground-mount installation. The separation of and applicability of methods, and steps therein, as well as systems and components thereof, and their particular usages with each of the separate types of power plants, namely rooftop, carport coverings, and small-to-large scale utility installations, would be apparent to the ordinary skilled person in the art.

APPENDIX

| Parameter | Explanation |
|---|---|
| L | Project lifetime (default value between 25 and 30 years) |
| n or t | Year from beginning |
| R(i) | Revenues at hour i |
| E(i) | Energy at hour i |
| A(i) | Availability at hour I (default value = 0.999) |
| T(i) | Tariff at hour i |
| R(n) | Revenues collected at n'th year |

APPENDIX-continued

| Parameter | Explanation |
|---|---|
| $C_{DC}$ | DC Capacity in kW |
| CF(n) | Cash Flow to Project Owner at n'th year |
| TAX(n) | Taxes paid at n'th year |
| LL(n) | Land Lease paid at n'th year |
| INT(n) | Interest cost paid at n'th year |
| REPAY(n) | Repayment of loan over n'th year |
| $R_{int}(n)$ | Interest rate on the debt at year n |
| $R_{Tax}$ | Total Corporate Tax rate at year n |
| $R_{Dep}(n)$ | Rate of depreciation at year n |
| DEP(n) | Depreciation at year n |
| TI(n) | Taxable Income at year n |
| LB(t) | Loan Balance at time t |
| EBITDA(n) | Earnings before interest, taxes, depreciation, and amortization at n'th year |
| $R_{Ins}$ | Insurance Premium Rate |
| I(1) | Insurance cost for year one |
| I(n) | Insurance cost for n'th year |
| OM(n) | Operation and maintenance costs at n'th year |
| OMF | Fixed Operation and maintenance cost in USD per kiloWatts |
| OMV | Variable Operation and maintenance cost in USD per kiloWatthour |
| R(1) | Revenues collected at year one |
| E(1) | Energy collected at year one |
| E(n) | Energy collected at n'th year |
| BPPE(n) | Balance Value of property, plant, equipment |
| $COST_{STU}$ | Cost of Sales and Use Tax |
| $COST_{EPC}$ | Cost of engineering, procurement, and construction |
| $COST_{MAT}$ | Cost of the direct materials |
| $COST_{INSTALL}$ | Cost of the installation |
| $COST_{IND}$ | Cost of indirect capital costs |
| $COST_{ENG}$ | Cost of the engineering |
| $COST_{INTER}$ | Cost of the interconnection |
| $COST_{PER}$ | Cost of the permits |
| $COST_{FRD}$ | Cost of the freight and duties |
| $COST_{OVER/MAR}$ | Cost of contractor and supplier overhead and margins |
| $COST_{PREP}$ | Cost of the site preparation |
| $COST_{OM}$ | Cost of the operations and maintenance |
| $COST_{LAND}$ | Cost of the site or land |
| $COST_{DEV}$ | Cost of development |
| $COST_{IDC}$ | Cost of interest during construction |
| $COST_{ALL}$ | All installed cost of solar power plant |
| $r_E$ | Expected rate of return (default is $d_{nom}$ = nominal discount rate) |
| $r_F$ | Risk-free rate (default is $r_T$) |
| $r_P$ | Equity risk premium + small company risk premium + country risk premium |
| $r_T$ | Treasury interest rate (T-bonds) |
| $d_{real}$ | Real discount rate = nominal discount rate − inflation |
| $P_m$ | Price of a module |
| $N_m$ | Number of modules |
| $P_i$ | Price of an inverter |
| $N_i$ | Number of inverters |
| $P_s$ | Price of a structural component |
| $N_s$ | Number of structural components |
| $P_e$ | Price of an electrical component |
| $N_e$ | Number of electrical components |
| $P_p$ | Cost of labor |
| $N_p$ | Number of man-hours of labor |
| $C_{acre}$ | Cost per acre for land |
| $N_{acre}$ | Number of acres |
| PPA(i) | Power purchase agreement rate as of hour i at year 1 |
| ToU(i) | Time of Use factor in Power purchase agreement at hour 1 |
| R(i) | Residential Spot rate at hour i |
| C(i) | Commercial Spot rate at hour i |
| G(i) | Grid Spot rate at hour i |
| Tariff(i) | Tariff at hour i |
| ESC | Escalation rate of power purchase agreement |
| INF | Inflation rate |
| DEG(n) | Module sensitivity degradation at year n |
| Over % | Overhead as percentage of total direct costs |
| MAR % | Margin as percentage of total direct costs |
| DEBT % | Debt as percentage of total installed costs |
| LOAN | Loan Balance on date of commissioning |
| GRANT | Total Grant amount for construction |
| IC | Investment Credits, including Investment Tax Credits |

LCOE: Nominal and Real Levelized Cost of Electricity:

$$LCOE_{nom} = \frac{A_{nom}}{B_{nom}}$$

$$A_{nom} = \sum_{t=1}^{L} \left\{ \frac{E(t)}{(1+d_{nom})^t} \right\}$$

$$B_{nom} = \frac{EI + \sum_{t=1}^{L} [INT(t) + OM(t) + LL(t) + I(t) + TAX(t) + REPAY(t)]}{(1+d_{nom})^t}$$

$$LCOE_{real} = \frac{A_{real}}{B_{real}}$$

$$A_{real} = \sum_{t=1}^{L} \left[ \frac{E(t)}{(1+d_{real})^t} \right]$$

$$B_{real} = \frac{EI + \sum_{t=1}^{L} \{[INT(t) + OM(t) + LL(t) + I(t) + TAX(t) + REPAY(t)]\}}{(1+d_{real})^t}$$

$$EI = EQUITY_{Invested} = \sum_{n=1}^{L} \left[ \frac{CF(n) + TAX(n)}{(1+r)^n} \right]$$

$IRR_{Pretax}$ =r=rate of return and is derived from the above EI equation.
$IRR_{Aftertax}$ =r=rate of return and is derived from the above EI equation where TAX(n)=0.
Payback time=$t_{PB}$ such that $$\int_{o}^{t_{PB}} CF(t)\,dt = EI$$

$$NPV = \text{net present value} = \sum_{n=1}^{L} \frac{CF(n)}{(1+r_E)^n} - EI$$

COSTS $$COST \text{ (direct materials)} = \sum_{m=1}^{M} p_m n_m + \sum_{i=1}^{I} p_i n_i + \sum_{s=1}^{S} p_s n_s + \sum_{e=1}^{E} p_e n_e$$

$$COST \text{ (Balance of Plant)} = \sum_{s=1}^{S} p_s n_s + \sum_{e=1}^{E} p_e n_e$$

$$COST \text{ (install)} = \sum_{p=1}^{P} p_p n_p$$

$COST_{OVER/MAR}$=(Over %+Mar %)*{COST(direct materials)+COST(install)}

$COST_{IND}$={$COST_{ENG}$+$COST_{INTER}$+$COST_{PER}$+$COST_{STU}$+$COST_{PREP}$+$COST_{FRD}$}

$COST_{ALL}$=$COST_{EPC}$+$COST_{DEV}$ $COST_{EPC}$={$COST_{MAT}$+$COST_{INSTALL}$+$COST_{OVER/MAR}$+$COST_{IND}$−$COST_{STU}$}

$COST_{DEV}$={$COST_{LAND}$+$COST_{STU}$+$COST_{IDC}$}

$COST_{LAND}$=$C_{Acre}$×$N_{Acre}$ $COST_{IDC}$=$R_{INT}$*(m/12)*Debt %*$COST_{ALL}$, where m=months of construction $PPA_n(i)$=PPA(i)*(1+ESC)$^{n-1}$, where n=year $C_n(i)$=C(i)*(1+INF)$^{n-1}$ $R_n(i)$=R(i)*(1+INF)$^{n-1}$ $G_n(i)$=G(i)*(1+INF)$^{n-1}$ Tariff(i)=Tariff at hour i,
R(i)=Residential Spot Rate at hour i
C(i)=Commercial Spot Rate at hour i,
G(i)=Grid Spot Rate at hour i,
PC(i)=Production Credit Rate at hour i, $R(i)$=E(i)*A(i)*T(i)

[Revenues at hour i=(Energy at hour i)(Availability at hour i)(Tariff at hour i)]

$$R(1) = \sum_{i=0}^{8760} R(i)$$

$$E(1) = \sum_{i=0}^{8760} E(i)$$

$$E(n) = E(1)(1 - DEG(n))^{(n-1)}$$

$$\text{Total Revenues over lifetime} = \sum_{i=1}^{L} R(n)$$

OM(n)=(OMF)($C_{DC}$)(1+INF)$^{(n-1)}$, if fixed costs

OM(n)=(OMV)(E(n))(1+INF)$^{(n-1)}$, if variable costs $C_{DC}$=DC capacity in kiloWatts I(1)=$R_{Ins}$*$COST_{EPC}$ I(n)=I(1)*(1−DEP(n))$^{n-1}$*(1+INF)$^{n-1}$ EBITDA(n)=R(n)−OM(n)−I(n)−LL(n)

INT(n)=LB(n)*$R_{Int}$(n)

LB(n+1)=LB(n)−REPAY(n)

DEP(n)=BPPE(n)*$R_{Dep}$(n)

BPPE(n+1)=BPPE(n)−DEP(n)

TI(n)=EBITDA(n)−INT(n)−DEP(n)

TAX(n)=TI(n)*$R_{Tax}$(n)

CF(n)=TI(n)+DEP(n)−TAX(n)−REPAY(n)

Equity invested=$COST_{ALL}$−LOAN−GRANT−IC

LOAN=($COST_{ALL}$−GRANT−IC)×DEBT %

| Parameter | Explanation |
|---|---|
| $I_{GH}(t)$ | Global Horizontal Irradiance at time t |
| $I_{OC}(t)$ | Incidence factor over collector plane at time t (factor based on tracking or fixed) |

-continued

| Parameter | Explanation |
|---|---|
| $N_S(t)$ | Near shadings losses at time t |
| $S_L(t)$ | Soiling losses at time t |
| $EI_{oC}(t)$ | Effective Irradiance on collectors |
| CA | Total collector area of PV modules |
| $E_{stc}$ | Efficiency at standard temp coefficient |
| $E_{nom}(t)$ | Nominal Array Energy generated at time t |
| $I_L(t)$ | PV loss due to Irradiance at time t |
| $T_L(t)$ | PV loss due to temperature at time t |
| $E_{SL}(t)$ | Electrical Shading losses at time t |
| $M_Q$ | Module quality loss |
| $A_{ML}(t)$ | Array mismatch loss at time t |
| $O_{WL}(t)$ | Ohmic wiring losses at time t |
| $E_{DC}$ | Energy injected into Inverter or DC Energy at time t |
| $I_{OL}(t)$ | Inverter Operational Loss (or Inverter Efficiency loss) at time t |
| $I_{LPT}(t)$ | Inverter Loss due to Power threshold at time t |
| $I_{LNOM}(t)$ | Inverter Loss over Nominal inverter power at time t |
| $I_{LVNOM}(t)$ | Inverter Loss over nominal inverter voltage at time t |
| $I_{LVT}(t)$ | Inverter Loss due to Voltage threshold at time t |
| $E_{inv}$ | Energy Output from Inverter at time t |
| $A_{COL}(t)$ | AC Ohmic Losses (AC Electrical wiring) at time t |
| TL(t) | Transformer Loss at time t |
| E(t) | Net Energy Output at time t |

$$EI_{oC}(t)=I_{GH}(t)(1+I_{OC}(t))(1-N_S(t))(1-S_L(t))$$

$$E_{nom}(t)=I_{GH}(t)(CA)E_{stc}$$

$$E_{DC}(t)=E_{nom}(t)(1-(I_L(t))(1-(T_L(t))(1-(E_{SL}(t))(1-(M_Q))(1-A_{ML}(t))(1-O_{WL}(t))$$

$$E_{inv}(t)=E_{DC}(1-(I_{OL}(t))(1-I_{LNOM}(t))(1-I_{LPT}(t))(1-I_{LVNOM}(t))(1-(I_{LVT}(t))$$

$$E(t)=E_{inv}(1-(A_{COL}(t))(1-TL(t))$$

REFERENCES (HEREBY INCORPORATED IN THEIR TOTALITY BY REFERENCE)

Blair et al. 2014, System Advisor Model, SAM 2014 Jan. 14, General Description, NREL Technical Report NREL/TP-6A20-61019.

Narvarte & Lorenzo 2008, 'Tracking and Ground Cover Ratio,' Prog Photovoltaics 16, 703-714.

Luenberger 2003, Linear and Nonlinear Programming, $2^{nd}$ Edition, Addison-Wesley, ISBN 0-201-15794-2, 1984.

Polak 1997, Optimization: Algorithms and Consistent Approximations. Springer-Verlag. ISBN 0-387-94971-2.

Zitzler et al. 2003, Performance Assessment of Multiobjective Optimizers, IEEE Trans Evo Comp 7, 117-132.

Goldberg 1989, Genetic Algorithms for Search, Optimization, and Machine Learning, Addison-Wesley.

Goldberg 2002, The Design of Innovation, Kluwer/Springer, ISBN 978-1-4757-3643-4.

Deb et al. 2002, A fast and elitist multi-objective genetic algorithm, IEEE Trans Evo Comp 6, 182-197.

Steuer 1986, Multiple criteria Optimization: theory, computation, and application, Wiley.

Rechenberg 1973, Evolutionsstrategie—Optimierung technischer Systeme nach Prinzipien der biologischen Evolution, Frommann Verlag.

Watanabe et al. 2002, NCGA: Neighborhood Cultivation Genetic Algorithm for Multi-objective Optimization Problems, in 2002 Genetic and Evolutionary Computation Conference, New York, 458-465.

Tiwari et al. 2008, 'An archive-based microgenetic algorithm for multiobjective optimization,' in Proceedings of genetic and evolutionary computation conference, Atlanta, 729-736.

Aittokoski et al. 2009, 'Clustering aided approach for decision making in computationally expensive multiobjective optimization,' Optimization Methods & Software 24, 157-174.

Gay et al. 2010, 'Finding robust solutions in requirements models,' Automated Software Engineering 17, 87-116.

Morse 1980, "Reducing the size of the nondominated set: Pruning by clustering," Computers & Operations Research 7, 55-66.

Rosenman & Gero 1985, "Reducing the pareto optimal set in multicriteria optimization.," Engineering Optimization 8, 189.

Mattson et al. 2004, "Smart Pareto filter: obtaining a minimal representation of multiobjective design space," Engineering Optimization 36, 721.

Boehm et al. 1998, "Using the WinWin spiral model: a case study," Computer 31, 33-44.

Deb 2001, Multi-Objective Optimization using Evolutionary Algorithms, Wiley.

Coello et al. 2002, Evolutionary Algorithms for Solving Multi-Objective Problems, Kluwer.

Busacca et al. 2001, Reliab. Eng. Syst. Saf. 72, 59.

Rachmawati & Srinivasan 2006, in Congress on Evol. Comp., IEEE Conf. Proc., 962-968.

Coello 2000, in Congress on Evol. Comp., IEEE Conf. Proc., 30.

Fausett 1994, Fundamentals of Neural Networks, Prentice-Hall.

Zio et al. 2009, Reliab. Eng. Sys. Saf. 94, 432.

Blasco et al. 2008, Multiobj. Optim. Inf. Sci., 178, 3908-3924.

Cooper et al. 2006, Data Envelopment Analysis, Springer.

Zio & Bazzo 2011, Eur. J. Oper. Res. 210, 624.

It is claimed:

1. A computer-implemented method to construct a solar PV power plant (SPVPP) located at a given site using an optimized configuration of electrical components, comprising:
   selecting a set of input specifications, comprising:
   a first subset comprising one or more numerical constraints and/or constants;
   a second subset comprising one or more process controls;
   a third subset comprising one or more rules;
   a fourth subset comprising a plurality of design variables;
   in which rules comprise:
      limitations imposed by a longitude/latitude of a site, limitations imposed by a type of PV module to be used, limitations imposed by an amount of grid electrical power, limitations imposed by available funding, limitations imposed by meteorological conditions found at the site, limitations imposed by an amount of electrical energy to be produced, limitations imposed by an amount of internal rate of return (IRR) or levelized cost of energy (LCOE; nominal or real), limitations on a ground-coverage-ratio, limitations on losses due to electrical components, limitations imposed by use of maximum power point tracking electronics, limitations imposed by site shading, limitations imposed by a total cost of wiring (AC and DC), limitations imposed by site thermal conditions, warranty limitations, and/or limitations imposed by local electrical code specifications;

in which each design variable of the fourth subset represents one or more characteristics that represents a feature of a type of electrical component or combinations thereof, in which types of electrical components comprise:

wirings (AC and DC), photovoltaic modules (flat, bifacial, and/or flexible), inverters, transformers, power management systems, optimizers, maximum power-point trackers, combiner boxes, warranties for electrical components, energy storage devices, switchgear, grounding equipment, string configurations, cooling systems, and/or electrical support infrastructures, wherein the electrical support infrastructures comprise concrete pads for inverters and transformers, cooling facilities for electrical components, conduit trenches, and enclosures for electrical components;

in which the characteristics comprise one or more of:

types, power ratings, electrical losses, warranties, dimensions, site locations, insulations/coatings, component unit costs, temperature sensitivities, module sensitivity degradations, max power tracking availability, blocking and/or breakdown diode configurations, current-voltage relationship, inverter capacities, conversion efficiencies, quantities, infrastructure requirements, load resistance adjustments, capacities, energy storage device mechanism (capacitive, inductive, battery, fuel cell), site preparations, installation costs, and/or assembly costs;

defining one or more objective functions by mathematical combinations of a plurality of figures-of-merit, the figures-of-merit comprising:

total cost of each type of electrical component, ground-coverage-ratio, electrical losses, and/or operations and maintenance for each type of electrical component over a period of time, in which at least one of the plurality of figures-of-merit comprises LCOE (nominal or real) or IRR, in which the figures-of-merit are comprised of elements from the first and fourth subsets of input specifications;

determining electronically, by programmable code resident on one or more processors or programmable systems, a set of optimized configurations of electrical components comprising a first local optimum and second local optimum by optimizing the one or more objective functions, according to at least one optimization algorithm, by;

executing a first iteration of a coordinate search of a parameter space based on the first, second, third, and fourth input specifications to identify the first local optimum; and executing a second iteration of a coordinate search of a parameter space based on the first, second, third, and fourth input specifications to identify the second local optimum;

simulating the first local optimum and second local optimum with off-nominal evaluation data to determine a global optimum configuration of electrical components; and outputting the at least one global optimum configuration of electrical components for the construction of the SPVPP, the SPVPP being constructed using the at least one global optimum configuration of electrical components.

2. The computer-implemented method of claim 1, wherein the at least one optimization algorithm comprises: gradient-based, Taguchi, neural network, response surface approximations, Bayesian, evolutionary, genetic, non-dominated sorting, neighborhood cultivation genetic, and/or archived-based micro-genetic algorithms.

3. The computer-implemented method of claim 1, wherein the optimization algorithm comprises one or more internal optimization processes and/or systems, the internal optimization processes and/or systems optimizing at least one of rack structural stability, LCOE (nominal or real), IRR, combinations of mechanical components which form a rack system and/or rack tracking system, and/or designs of individual mechanical components.

4. A non-transitory computer-readable medium onto which is resident computer program code to execute electronically a computer-implemented method to determine one or more optimized configurations of electrical components of a solar PV power plant (SPVPP) located at a given site, the method comprising:

selecting a set of input specifications, comprising:

a first subset comprising one or more numerical constraints and/or constants;

a second subset comprising one or more process controls;

a third subset comprising one or more rules;

a fourth subset comprising a plurality of design variables;

in which the rules comprise:

limitations imposed by a longitude/latitude of the site, limitations imposed by a type of PV module to be used, limitations imposed by the amount of grid electrical power, limitations imposed by the available funding, limitations imposed by the meteorological conditions found at the site, limitations imposed by an amount of electrical energy to be produced, limitations imposed by the amount of internal rate of return (IRR) or levelized cost of energy (LCOE; nominal or real), limitations on the ground-coverage-ratio, limitations on losses due to electrical components, limitations imposed by the use of maximum power point tracking electronics, limitations imposed by site shading, limitations imposed by the total cost of wiring (AC and DC), limitations imposed by site thermal conditions, warranty limitations, and/or limitations imposed by local electrical code specifications;

in which each design variable of the fourth subset represents one or more characteristics that represents a feature of a type of electrical component or combinations thereof, in which types of electrical components comprise:

wirings (AC and DC), photovoltaic modules (flat, bifacial, and/or flexible), inverters, transformers, power management systems, optimizers, maximum power-point trackers, combiner boxes, warranties for electrical components, energy storage devices, switchgear, grounding equipment, string configurations, cooling systems, and/or electrical support infrastructures;

in which the characteristics comprise one or more of:

types, power ratings, electrical losses, warranties, dimensions, site locations, insulations/coatings, component unit costs, temperature sensitivities, module sensitivity degradations, max power tracking availability, blocking and/or breakdown diode configurations, current-voltage relationship, inverter capacities, conversion efficiencies, quantities, infrastructure requirements, load resistance adjustments, capacities, energy storage device mechanism (capacitive, inductive, battery, fuel cell), site preparations, installation costs, and/or assembly costs;

defining one or more objective functions by mathematical combinations of a plurality of figures-of-merit, the figures-of-merit comprising:
total cost of each type of electrical component, ground-coverage-ratio, electrical losses, and/or operations and maintenance for each type of electrical component over a period of time, in which at least one of the plurality of figures-of-merit comprises LCOE (nominal or real) or IRR, in which the figures-of-merit are comprised of elements from the first and fourth subsets of input specifications;
determining electronically, by programmable code resident on one or more processors or programmable systems, a set of optimized configurations of electrical components comprising a first local optimum and second local optimum by optimizing the one or more objective functions, according to at least one optimization algorithm, by;
executing a first iteration of a first coordinate search of a parameter space based on the first, second, third, and fourth input specifications to identify the first local optimum; and
executing a second iteration of a second coordinate search of the parameter space based on the first, second, third, and fourth input specifications to identify the second local optimum;
simulating the first local optimum and second local optimum with off-nominal evaluation data to determine a global optimum configuration of electrical components;
wherein the one or more objective functions of electrical components comprise: cost-related metric of the DC wiring, cost-related metric of AC wiring, cost-related metric of one or more inverters, cost-related and types of photovoltaic modules (flat, bifacial, and/or flexible), cost-related metric of max-power point tracking electronics, cost-related metric of one or more of grounding equipment, cost-related metric of one or more of electrical switchgear, cost-related metric of one or more transformers, cost-related metric of one or more DC-DC optimizers, cost-related metric of electrical infrastructures, cost-related metric of one or more energy storage devices, cost-related metric of operations and maintenance of the electrical components over a period of time, and cost-related metric of one or more power management systems to control electrical output of the power plant and to merge power-plant-generate electricity into that of the grid electricity; and
outputting the at least one global optimum configuration of electrical components for the construction of the SPVPP, the SPVPP being constructed using the at least one global optimum configuration of electrical components.

5. The non-transitory computer-readable medium of claim 4, wherein the at least one optimization algorithm comprises: gradient-based, Taguchi, neural network, response surface approximations, Bayesian, evolutionary, genetic, non-dominated sorting, neighborhood cultivation genetic, and/or archived-based micro-genetic algorithms.

6. The non-transitory computer-readable medium of claim 4, wherein the optimization algorithm comprises one or more internal optimization processes and/or systems, the internal optimization processes and/or systems optimizing at least one of rack structural stability, LCOE (nominal or real), IRR, combinations of mechanical components which form a rack system and/or rack tracking system, and/or designs of individual mechanical components.

7. A non-transitory computer-readable medium onto which is resident computer program code to execute electronically a computer-implemented method to determine one or more optimized configurations of electrical components of a solar PV power plant (SPVPP) located at a given site, the method comprising:
selecting a set of input specifications, comprising:
a first subset comprising one or more numerical constraints and/or constants;
a second subset comprising one or more process controls;
a third subset comprising one or more rules;
a fourth subset comprising a plurality of design variables;
in which the rules comprise:
limitations imposed by a longitude/latitude of the site, limitations imposed by a type of PV module to be used, limitations imposed by the amount of grid electrical power, limitations imposed by the available funding, limitations imposed by the meteorological conditions found at the site, limitations imposed by an amount of electrical energy to be produced, limitations imposed by the amount of internal rate of return (IRR) or levelized cost of energy (LCOE; nominal or real), limitations on the ground-coverage-ratio, limitations on losses due to electrical components, limitations imposed by use of maximum power point tracking electronics, limitations imposed by site shading, limitations imposed by a total cost of wiring (AC and DC), limitations imposed by site thermal conditions, warranty limitations, and/or limitations imposed by local electrical code specifications;
in which each design variable of the fourth subset represents one or more characteristics that represents a feature of a type of electrical component or combinations thereof, in which types of electrical components comprise:
wirings (AC and DC), photovoltaic modules (flat, bifacial, and/or flexible), inverters, transformers, power management systems, optimizers, maximum power-point trackers, combiner boxes, warranties for electrical components, energy storage devices, switchgear, grounding equipment, string configurations, cooling systems, and/or electrical support infrastructures, wherein the electrical support infrastructures comprise concrete pads for inverters and transformers, cooling facilities for electrical components, conduit trenches, and enclosures for electrical components such as inverters, transformers, power management systems, and power storage systems;
in which the characteristics comprise one or more of:
types, power ratings, electrical losses, warranties, dimensions, site locations, insulations/coatings, component unit costs, temperature sensitivities, module sensitivity degradations, max power tracking availability, blocking and/or breakdown diode configurations, current-voltage relationship, inverter capacities, conversion efficiencies, quantities, infrastructure requirements, load resistance adjustments, capacities, energy storage device mechanism (capacitive, inductive, battery, fuel cell), site preparations, installation costs, and/or assembly costs;
defining one or more objective functions by mathematical combinations of a plurality of figures-of-merit, the figures-of-merit comprising:

total cost of each type of electrical component, ground-coverage-ratio, electrical losses, and/or operations and maintenance for each type of electrical component over a period of time, in which at least one of the plurality of figures-of-merit comprises LCOE (nominal or real) or IRR, in which the figures-of-merit are comprised of elements from the first and fourth subsets of input specifications;

determining electronically, by programmable code resident on one or more processors or programmable systems, a set of optimized configurations of electrical components comprising a first local optimum and second local optimum by optimizing the one or more objective functions, according to at least one optimization algorithm, by;
  executing a first iteration of a first coordinate search of a parameter space based on the first, second, third, and fourth input specifications to identify the first local optimum; and
  executing a second iteration of a second coordinate search of the parameter space based on the first, second, third, and fourth input specifications to identify the second local optimum;

simulating the first local optimum and second local optimum with off-nominal evaluation data to determine a global optimum configuration of electrical components;
and outputting the at least one global optimum configuration of electrical components for the construction of the SPVPP, the SPVPP being constructed using the at least one global optimum configuration of electrical components.

8. The non-transitory computer-readable medium of claim 7, wherein the at least one optimization algorithm comprises: gradient-based, Taguchi, neural network, response surface approximations, Bayesian, evolutionary, genetic, non-dominated sorting, neighborhood cultivation genetic, and/or archived-based micro-genetic algorithms.

9. The non-transitory computer-readable medium of claim 7, wherein the optimization algorithm comprises one or more internal optimization processes and/or systems, the internal optimization processes and/or systems optimizing at least one of rack structural stability, LCOE (nominal or real), IRR, combinations of mechanical components which form a rack system and/or rack tracking system, and/or designs of individual mechanical components.

10. A computer-implemented engineering design system for a solar photovoltaic power plant (SPVPP) located at a given site, the design system comprising:
  a set of input specifications that is selected, in which the set is comprised of:
  a first subset comprising one or more numerical constraints and/or constants;
  a second subset comprising one or more optimization process controls;
  a third subset comprising one or more rules; and
  a fourth subset comprising a set of design variables, in which each design variable represents one or more characteristics of a component of the SPVPP, in which the component is modelled by at least one characteristic of the characteristics;
  in which the rules comprise:
    limitations imposed by a longitude/latitude of the site, limitations imposed by the size, terrain, and geometry of the site (including allocated and excluded areas), limitations imposed by a type of PV module to be used, limitations imposed by the amount of grid electrical power, limitations imposed by the available funding, limitations imposed by the seismicity of the site, limitations imposed by the meteorological conditions found at the site, limitations imposed by an amount of electrical energy to be generated, limitations imposed by the amount of internal rate-of-return (IRR), limitations imposed by the site geological, foundational, and geotechnical conditions, limitations on the maximum losses due to electrical components, limitations imposed by the use of maximum power point tracking electronics, limitations imposed by a levelized cost of electricity (LCOE; nominal or real), limitations from site shading, limitations from site geographic conditions, limitations from site thermal conditions, limitations from component availability, limitations from the available manufacturing system, limitations from wind/snow loading, limitations imposed by component warranties, labor limitations, limitations on curvatures of flexible modules, limitations imposed by a ground-coverage ratio, limitation on total cost of electrical wiring, limitations on lateral and/or vertical rack stability, limitations on rack tracking accuracy, and/or limitations imposed by local regulatory codes;
  in which the regulatory codes comprise one or more of: codes for rooftop installations, codes for carport installations, codes for utility installations, codes for electrical components, codes for structural components, seismic codes, codes for coatings of components, component's over-design factors, civil design codes, and/or building codes;
  a component definition system comprising:
  one or more processors or programmable systems, the one or more processors or programmable systems resident with programmable code electronically configured to determine the nature of and locations of a set of components that comprise a first local optimum design and a second local optimum design of the SPVPP, in which generation of the first local optimum design and the second local optimum design of the SPVPP is by one or more optimizations of an objective function performed by at least one optimization algorithm which adjusts a plurality of elements of the fourth subset, constrained by elements of the first, second, and third subsets of the input specifications by iteratively executing a coordinate search of a parameter space;
  in which the objective function is mathematically comprised of a plurality of the following figures-of-merit:
    an internal rate of return (IRR), payback period for investment, LCOE (nominal or real), total capital cost, IRR given a specific maximum capital cost, IRR given a specific maximum site areal coverage, total wiring costs (AC and DC), total cost of electrical components, total cost of maintenance of electrical components, total cost of the installation of the electrical components, total cost of structural components, total cost of site preparation, total cost of the installation of structural components, power purchasing agreement (PPA) time of use, net present value of system, max power density collected, lateral and/or vertical stability of a rack system, rack tracking accuracy, a statistic related to the amount of solar energy collected over a period of time, investment profit over a period of time, power delivered to a grid, site preparation costs, IRR or LCOE (nominal or real) based on utility time of use factors, total module area, total civil engineering component costs, total solar energy load, costs of operations and maintenance, costs of labor, costs of land, costs of land development, costs of transportation of materials, ground-coverage-ratio, and/or warranties of electrical components;

in which each figure-of-merit is comprised of a mathematical combination of elements of the fourth subset and the first subset, in which at least one of the plurality of figures-of-merit comprises either LCOE (nominal or real) or IRR;

a decision maker comprising one or more programmable systems onto which is resident programmable code configured to select one of the first local optimum or second local optimum of a design of the SPVPP by simulating the first local optimum and second local optimum with off-nominal evaluation data to determine a global optimum mechanical/structural design;

a mechanical layout subsystem (MLS) nested within the component definition system, the MLS configured to generate one or more global optimum mechanical/structural design of the SPVPP by the adjustment of a subset of design variables corresponding to characteristics of mechanical/structural components performed by at least one optimization algorithm, in which the components comprise one or more of:

types of racks, types of tracking, modules (flat, bifacial, and/or flexible), struts, HSS-, wide-flange-, I-beams, piles, posts, ballasts, rails, armatures, motors, gears, ground screws, yokes, pipes, tubing, channels, purlins, journals, bearings, ballasts, axles, and/or interface plates;

wherein the characteristics of an optimized ballast comprise at least one of:
horizontal dimensions, vertical dimensions, location of the ballast relative to topsoil grade, total weight;

in which the constraints in determining the optimized ballast comprise one or more of:
topsoil characteristics, subsoil characteristics, water table level, wind/snow loading, and/or type of rack support; and an output subsystem nested within the component definition system, the output subsystem configured to output the one or more global optimum mechanical/structural design of the SPVPP for construction, the one or more global optimum mechanical/structural design of the SPVPP being constructed.

11. The computer-implemented engineering design system of claim 10, wherein the at least one optimization algorithm comprises: gradient-based, Taguchi, neural network, response surface approximations, Bayesian, evolutionary, genetic, non-dominated sorting, neighborhood cultivation genetic, and/or archived-based micro-genetic algorithms.

12. The computer-implemented engineering design system of claim 10, wherein the optimization algorithm comprises one or more internal optimization processes and/or systems, the internal optimization processes and/or systems optimizing at least one of rack structural stability, LCOE (nominal or real), IRR, combinations of mechanical components which form a rack system and/or rack tracking system, and/or designs of individual mechanical components.

13. A computer-implemented engineering design method for a solar photovoltaic power plant (SPVPP) located at a given site, comprised of a plurality of components, the design method comprising:

selecting a set of input specifications comprising one or more numerical constraints and/or constants, one or more process controls, one or more rules, and one or more design variables, in which each design variable represents one or more characteristics of a component of the SPVPP, in which the one or more rules comprise:
limitations imposed by a longitude/latitude of the site, limitations imposed by the size, terrain, and geometry of the site (including allocated and excluded areas), limitations imposed by a type of PV module to be used, limitations imposed by the amount of grid electrical power, limitations imposed by the available funding, limitations imposed by the seismicity of the site, limitations imposed by the meteorological conditions found at the site, limitations imposed by an amount of electrical energy to be generated, limitations imposed by the amount of internal rate-of-return (IRR), limitations imposed by the site geological, foundational, and geotechnical conditions, limitations on the maximum losses due to electrical components, limitations on curvatures of flexible modules, limitations on lateral and/or vertical stability of a rack system, limitations on rack tracking accuracy, limitations imposed by the use of maximum power point tracking electronics, limitations imposed by a levelized cost of electricity (LCOE: nominal or real), limitations from site shading, limitations from site geographic conditions, limitations from site thermal conditions, limitations from component availability, limitations from the available manufacturing system, limitations from wind/snow loading, limitations imposed by component warranties, labor limitations, limitations imposed by a ground coverage ratio, limitation on total cost of electrical wiring, and/or limitations imposed by local regulatory codes;

in which the regulatory codes comprise one or more of: codes for rooftop installations, codes for carport installations, codes for utility installations, codes for electrical components, codes for structural components, seismic codes, codes for coatings of components, component's over-design factors, civil design codes, and/or building codes;

electronically determining, when executed by a computer, the nature of and locations of each of a plurality of components of a first local optimum design and a second local optimum design of an objective function controlled by at least one optimization algorithm searching a parameter space, adjusting the design variables, constrained by a subset of input specifications, in which the objective function is a mathematical combination of a plurality of the following figures-of-merit:

a statistic related to the amount of solar energy collected over a period of time, investment profit over a period of time, power delivered to a grid, site preparation costs, IRR or LCOE (nominal or real) based on utility time of use factors, total module area, total civil engineering component costs, total solar energy load, costs of operations and maintenance, costs of labor, costs of land, costs of land development, costs of transportation of materials, and warranties of electrical components, IRR, payback period for investment, ground-coverage-ratio, LCOE (nominal or real), total capital cost, IRR given a specific maximum capital cost, IRR given a specific maximum site area coverage, total wiring costs (AC+DC) total cost of electrical components, total cost of maintenance of electrical components, total cost of the installation of the electrical components, lateral and/or vertical stability of a rack system, rack tracking accuracy, total cost of structural components, total cost of site preparation, total cost of the installation of structural components, power purchasing agreement time of use, net present value of system, IRR or LCOE (nominal or real) based on utility time of use factors, and/or maximum power density collected in which at least one of the plurality of figures-of-merit comprises either LCOE (nominal or real) or IRR;

selecting electronically, by programmable code resident in one or more processors or programmable systems from the first local optimum design and the second local optimum design, a global optimum configuration of electrical components by simulating the first local optimum and second local optimum with off-nominal evaluation data;

wherein the characteristics of an optimized ballast comprise at least one of the following:
horizontal dimensions, vertical dimensions, total weight, and
wherein the constraints in determining the optimized ballast comprise one or more of:
topsoil characteristics, subsoil characteristics, water table level, wind/snow loading, and/or type of rack support; and
outputting the global optimum configuration of electrical components comprising the nature of and locations of each of the plurality of components of the at least one optimized design for the construction of the SPVPP, the SPVPP being constructed using the global optimum configuration of electrical components.

14. The computer-implemented engineering design method of claim 13, wherein the at least one optimization algorithm comprises: gradient-based, Taguchi, neural network, response surface approximations, Bayesian, evolutionary, genetic, non-dominated sorting, neighborhood cultivation genetic, and/or archived-based micro-genetic algorithms.

15. The computer-implemented engineering design method of claim 13, wherein the optimization algorithm comprises one or more internal optimization processes and/or systems, the internal optimization processes and/or systems optimizing at least one of rack structural stability, LCOE (nominal or real), IRR, combinations of mechanical components which form a rack system and/or rack tracking system, and/or designs of individual mechanical components.

16. A non-transitory computer-readable medium onto which is resident computer program code is embedded, which when executed executes a method to optimize construction of a solar photovoltaic power plant (SPVPP), the method comprising:
selecting a set of input specifications comprising one or more numerical constraints and/or constants, one or more process controls, one or more rules, and one or more design variables, in which each design variable represents one or more characteristics of a component of the SPVPP, in which the one or more rules comprise:
limitations imposed by a longitude/latitude of the site, limitations imposed by the size, terrain, and geometry of the site (including allocated and excluded areas), limitations imposed by a type of PV module to be used, limitations imposed by the amount of grid electrical power, limitations imposed by the available funding, limitations imposed by the seismicity of the site, limitations imposed by the meteorological conditions found at the site, limitations imposed by an amount of electrical energy to be generated, limitations imposed by the amount of internal rate-of-return (IRR), limitations imposed by the site geological, foundational, and geotechnical conditions, limitations on the maximum losses due to electrical components, limitations on curvatures of flexible modules, limitations on lateral and/or vertical stability of a rack system, limitations on rack tracking accuracy limitations imposed by the use of maximum power point tracking electronics, limitations imposed by a levelized cost of electricity (LCOE, nominal or real), limitations from site shading, limitations from site geographic conditions, limitations from site thermal conditions, limitations from component availability, limitations from the available manufacturing system, limitations from wind/snow loading, limitations imposed by component warranties, labor limitations, limitations imposed by a ground coverage ratio, limitation on total cost of electrical wiring, and/or limitations imposed by local regulatory codes;

in which the regulatory codes comprise one or more of:
codes for rooftop installations, codes for carport installations, codes for utility installations, codes for electrical components, codes for structural components, seismic codes, codes for coatings of components, component's over-design factors, civil design codes, and/or building codes;

electronically determining, when executed by a computer, the nature of and locations of each of a plurality of components of a first local optimum design and a second local optimum design of an objective function controlled by at least one optimization algorithm searching a parameter space, adjusting the design variables, constrained by a subset of input specifications, in which the objective function is a mathematical combination of a plurality of the following figures-of-merit:
a statistic related to the amount of solar energy collected over a period of time, investment profit over a period of time, power delivered to a grid, site preparation costs, IRR or LCOE (nominal or real) based on utility time of use factors, total module area, total civil engineering component costs, total solar energy load, costs of operations and maintenance, costs of labor, costs of land, costs of land development, costs of transportation of materials, and warranties of electrical components, IRR, payback period for investment, ground-coverage-ratio, LCOE (nominal or real), total capital cost, IRR given a specific maximum capital cost, IRR given a specific maximum site areal coverage, total wiring costs (AC+DC), total cost of electrical components, total cost of maintenance of electrical components, total cost of the installation of the electrical components, lateral and/or vertical stability of a rack system, rack tracking accuracy, total cost of structural components, total cost of site preparation, total cost of the installation of structural components, power purchasing agreement time of use, net present value of system, IRR or LCOE (nominal or real) based on utility time of use factors, and/or maximum power density collected;

in which at least one of the plurality of figures-of-merit comprises either LCOE (nominal or real) or IRR;

selecting electronically, by programmable code resident in one or more processors or programmable systems from the first local optimum design and the second local optimum design, a global optimum configuration of electrical components by simulating the first local optimum and second local optimum with off-nominal evaluation data;

wherein the optimization further optimizes the dimensions and weight distribution of a ballast, and in which the constraints in determining the optimized ballast comprise one or more of:

topsoil characteristics, subsoil characteristics, water table level, wind/snow loading, and/or type of rack support; and outputting the global optimum configuration of electrical components comprising the nature of and locations of each of the plurality of components of the at least one optimized design for the construction of the SPVPP, the SPVPP being constructed using the global optimum configuration of electrical components.

17. The non-transitory computer-readable medium of claim 16, wherein the at least one optimization algorithm comprises: gradient-based, Taguchi, neural network, response surface approximations, Bayesian, evolutionary, genetic, non-dominated sorting, neighborhood cultivation genetic, and/or archived-based micro-genetic algorithms.

18. The non-transitory computer-readable medium of claim 16, wherein the optimization algorithm comprises one or more internal optimization processes and/or systems, the internal optimization processes and/or systems optimizing at least one of rack structural stability, LCOE (nominal or real), IRR, combinations of mechanical components which form a rack system and/or rack tracking system, and/or designs of individual mechanical components.

19. A computer-implemented engineering design system for a solar photovoltaic power plant (SPVPP) located at a given site, the design system comprising:

a set of input specifications that is selected, in which the set is comprised of:

a first subset comprising one or more numerical constraints and/or constants;

a second subset comprising one or more optimization process controls;

a third subset comprising one or more rules; and a fourth subset comprising a set of design variables, in which each design variable represents one or more characteristics of a component of the SPVPP, in which the component is modelled by at least one characteristic of the characteristics;

in which the rules comprise:

limitations imposed by a longitude/latitude of the site, limitations imposed by the size, terrain, and geometry of the site (including allocated and excluded areas), limitations imposed by a type of PV module to be used, limitations imposed by the amount of grid electrical power, limitations imposed by the available funding, limitations imposed by the seismicity of the site, limitations imposed by the meteorological conditions found at the site, limitations imposed by an amount of electrical energy to be generated, limitations imposed by the amount of internal rate-of-return (IRR), limitations imposed by the site geological, foundational, and geotechnical conditions, limitations on the maximum losses due to electrical components, limitations imposed by the use of maximum power point tracking electronics, limitations imposed by a levelized cost of electricity (LCOE; nominal or real), limitations from site shading, limitations from site geographic conditions, limitations from site thermal conditions, limitations from component availability, limitations from the available manufacturing system, limitations from wind/snow loading, limitations imposed by component warranties, labor limitations, limitations on curvatures of flexible modules, limitations imposed by a ground-coverage ratio, limitation on total cost of electrical wiring, limitations on lateral and/or vertical rack stability, limitations on rack tracking accuracy, and/or limitations imposed by local regulatory codes;

in which the regulatory codes comprise one or more of:
codes for rooftop installations, codes for carport installations, codes for utility installations, codes for electrical components, codes for structural components, seismic codes, codes for coatings of components, component's over-design factors, civil design codes, and/or building codes;

a component definition system comprising:

one or more processors or programmable systems, the one or more processors or programmable systems resident with programmable code electronically configured to determine the nature of and locations of a set of components that comprise a first local optimum design and a second local optimum design of the SPVPP, in which generation of the first local optimum design and the second local optimum design of the SPVPP is by one or more optimizations of an objective function performed by at least one optimization algorithm which adjusts a plurality of elements of the fourth subset, constrained by elements of the first, second, and third subsets of the input specifications by iteratively executing a coordinate search of a parameter space;

in which the objective function is mathematically comprised of a plurality of the following figures-of-merit:
an internal rate of return (IRR), payback period for investment, LCOE (nominal or real), total capital cost, IRR given a specific maximum capital cost, IRR given a specific maximum site areal coverage, total wiring costs (AC and DC), total cost of electrical components, total cost of maintenance of electrical components, total cost of the installation of the electrical components, total cost of structural components, total cost of site preparation, total cost of the installation of structural components, power purchasing agreement (PPA) time of use, net present value of system, max power density collected, lateral and/or vertical stability of a rack system, rack tracking accuracy, a statistic related to the amount of solar energy collected over a period of time, investment profit over a period of time, power delivered to a grid, site preparation costs, IRR or LCOE (nominal or real) based on utility time of use factors, total module area, total civil engineering component costs, total solar energy load, costs of operations and maintenance, costs of labor, costs of land, costs of land development, costs of transportation of materials, ground-coverage-ratio, and/or warranties of electrical components;

in which each figure-of-merit is comprised of a mathematical combination of elements of the fourth subset and the first subset, in which at least one of the plurality of figures-of-merit comprises either LCOE (nominal or real) or IRR;

a decision maker comprising one or more programmable systems onto which is resident programmable code configured to select one of the first local optimum or second local optimum of a design of the SPVPP by simulating the first local optimum and second local optimum with off-nominal evaluation data to determine a global optimum mechanical/structural design;

a mechanical layout subsystem (MLS) nested within the component definition system, the MLS configured to generate one or more global optimum mechanical/structural design of the SPVPP by the adjustment of a subset of design variables corresponding to characteristics of mechanical/structural components performed by at least one optimization algorithm, in which the components comprise one or more of:

types of racks, types of tracking, modules (flat, bifacial, and/or flexible), struts, HSS-, wide-flange-, I-beams, piles, posts, ballasts, rails, armatures, motors, gears, ground screws, yokes, pipes, tubing, channels, purlins, journals, bearings, ballasts, axles, and/or interface plates, wherein the modules or a subset of the modules are flexible and in which curvatures of the flexible modules are computationally determined to maximize energy collected over a period of time; and an output subsystem nested within the component definition system, the output subsystem configured to output the one or more global optimum mechanical/structural design of the SPVPP for construction, the one or more global optimum mechanical/structural design of the SPVPP being constructed.

20. The computer-implemented engineering design system of claim 19, wherein the at least one optimization algorithm comprises: gradient-based, Taguchi, neural network, response surface approximations, Bayesian, evolutionary, genetic, non-dominated sorting, neighborhood cultivation genetic, and/or archived-based micro-genetic algorithms.

21. The computer-implemented engineering design system of claim 19, wherein the optimization algorithm comprises one or more internal optimization processes and/or systems, the internal optimization processes and/or systems optimizing at least one of rack structural stability, LCOE (nominal or real), IRR, combinations of mechanical components which form a rack system and/or rack tracking system, and/or designs of individual mechanical components.

22. A computer-implemented engineering design system for a solar photovoltaic power plant (SPVPP) located at a given site, the design system comprising:

a set of input specifications that are selected, in which the set is comprised of:
 a first subset comprising one or more numerical constraints and/or constants;
 a second subset comprising one or more optimization process controls;
 a third subset comprising one or more rules; and
 a fourth subset comprising a set of design variables;
 wherein each design variable represents one or more characteristics of a component of the SPVPP, in which the component is modelled by at least one characteristic of the characteristics;

wherein the rules comprise:
 limitations imposed by a longitude/latitude of the site, limitations imposed by the size, terrain, and geometry of the site (including allocated and excluded areas), one or more limitations imposed by a type of PV module to be used, limitations imposed by the amount of grid electrical power, limitations imposed by the available funding, limitations imposed by the seismicity of the site, limitations imposed by the meteorological conditions found at the site, limitations imposed by an amount of electrical energy to be generated, limitations imposed by the amount of internal rate-of-return (IRR), limitations imposed by the site geological, foundational, and geotechnical conditions, limitations on the maximum losses due to electrical components, limitations imposed by the use of maximum power point tracking electronics, limitations imposed by a levelized cost of electricity (LCOE; nominal or real), limitations from site shading, limitations from site geographic conditions, limitations from site thermal conditions, limitations from component availability, limitations from the available manufacturing system, limitations from wind/snow loading, limitations imposed by component warranties, labor limitations, limitations on curvatures of flexible modules, limitations imposed by a ground-coverage ratio, limitation on total cost of electrical wiring, limitations on lateral and/or vertical rack stability, limitations on rack tracking accuracy, and/or limitations imposed by local regulatory codes;

in which the regulatory codes comprise one or more of:
 codes for rooftop installations, codes for carport installations, codes for utility installations, codes for electrical components, codes for structural components, seismic codes, codes for coatings of components, component's over-design factors, civil design codes, and/or building codes;

a component definition system comprising:
one or more processors or programmable systems, the one or more processors or programmable systems resident with programmable code electronically configured to determine the nature of and locations of a set of components that comprise a first local optimum design and a second local optimum design of the SPVPP, in which generation of the first local optimum design and the second local optimum design of the SPVPP is by one or more optimizations of an objective function performed by at least one optimization algorithm which adjusts a plurality of elements of the fourth subset, constrained by elements of the first, second, and third subsets of the input specifications by iteratively executing a coordinate search of a parameter space;

in which the objective function is mathematically comprised of a plurality of the following:
 figures-of-merit-a internal rate of return (IRR), payback period for investment, LCOE (nominal or real), total capital cost, IRR given a specific maximum capital cost, IRR given a specific maximum site areal coverage, total wiring costs (AC and DC), total cost of electrical components, total cost of maintenance of electrical components, total cost of the installation of the electrical components, total cost of structural components, total cost of site preparation, total cost of the installation of structural components, power purchasing agreement (PPA) time of use, net present value of system, max power density collected, lateral and/or vertical stability of a rack system, rack tracking accuracy, a statistic related to the amount of solar energy collected over a period of time, investment profit over a period of time, power delivered to a grid, site preparation costs, IRR or LCOE (nominal or real) based on utility time of use factors, total module area, total civil engineering component costs, total solar energy load, costs of operations and maintenance, costs of labor, costs of land, costs of land development, costs of transportation of materials, ground-coverage-ratio, and/or warranties of electrical components;

in which each figure-of-merit is comprised of a mathematical combination of elements of the fourth subset and the first subset, in which at least one of the plurality of figures-of-merit comprises either LCOE (nominal or real) or IRR;

a decision maker comprising one or more programmable systems onto which is resident programmable code configured to select one of the first local optimum or second local optimum of a design of the SPVPP by simulating the first local optimum and second local optimum with off-nominal evaluation data to determine a global optimum mechanical/structural design;

an electrical layout subsystem (ELS) nested within the component definition system, the ELS configured to generate one or more global optimum configurations of one or more types of electrical components of the SPVPP by the adjustment of a subset of design variables related to characteristics of types of electrical components using at least one optimization algorithm, in which the type of electrical component comprises:

inverters, wirings (AC and DC), optimizers, max-power-point trackers, modules (flat bifacial, and/or flexible), transformers, energy storage devices, power management systems, combiner boxes, string configurations, rack tracking electronics, cooling systems, support infrastructures, grounding equipment and/or switchgear;

wherein the ELS is further configured with one or more internal optimization processes and/or systems, the internal optimization processes and/or systems optimize at least one of costs of electrical components of a configuration, LCOE (nominal or real) or IRR of electrical configuration, wirings (AC and DC), electrical losses, and/or of designs of configurations of electrical components or combinations thereof;

wherein the modules or a subset of the modules are flexible and in which curvatures of the flexible modules are computationally determined to maximize energy collected over a period of time; and an output subsystem nested within the component definition system, the output subsystem configured to output the global optimum design of the SPVPP for construction, the SPVPP being constructed in accordance with the at least one of the global optimum design of the SPVPP.

23. The computer-implemented engineering design system of claim 22, wherein the at least one optimization algorithm comprises: gradient-based, Taguchi, neural network, response surface approximations, Bayesian, evolutionary, genetic, non-dominated sorting, neighborhood cultivation genetic, and/or archived-based micro-genetic algorithms.

24. The computer-implemented engineering design system of claim 22, wherein the optimization algorithm comprises one or more internal optimization processes and/or systems, the internal optimization processes and/or systems optimizing at least one of rack structural stability, LCOE (nominal or real), IRR, combinations of mechanical components which form a rack system and/or rack tracking system, and/or designs of individual mechanical components.

25. An automated site engineering design system to design an optimized solar array of photovoltaic panels (SAPP), the design system comprising:

a user input interface, in which the user can input a set of input specifications comprising one or more numerical constraints and one or more rules, and one or more design variables;

a set of databases, in which data regarding characteristics of components are stored, updated, and obtained therefrom;

an objective function that is constrained by one or more input specifications, in which the objective function is optimized producing, by adjustment of the design variables, a first local optimum, constrained by the input specifications, by executing a first coordinate search of a parameter space, and a second local optimum, constrained by the input specifications, by executing a second coordinate search of the parameter space;

a decision maker that selects one of the first local optimum or second local optimum as a design solution by simulating the first local optimum and second local optimum with off-nominal evaluation data to determine a global optimum configuration;

a component definition feature having an input for receiving the set of input specifications and the design variables of the first local optimum or second local optimum, the component definition feature generating designs of a complement of components based upon the set of input specifications and the design variables of the first local optimum or second local optimum;

a mechanical layout feature having an input for receiving one or more design variables of first local optimum or second local optimum related to mechanical structures;

an input for receiving the set of input specifications, the design system generating a global optimum configuration of mechanical designs of the optimized SAPP, wherein the design system further optimizes the optimized SAPP engineering design based upon one or more secondary objective functions, and wherein the one or more secondary objective functions are structural stability of a module or panel support structure within the constraints imposed by the input specifications, costs and designs of any individual electrical component, costs and designs of structural materials, costs of operations and maintenance, costs of labor, costs of land, costs of land development, costs of transportation of materials, and warranties of electrical components; and an output feature that outputs the global optimum configuration of mechanical designs of the optimized SAPP, the optimized SAPP being constructed in accordance with the global optimum configuration of mechanical designs of the optimized SAPP.

26. The automated site engineering design system of claim 25, wherein the design system further optimizes the optimized SAPP engineering design using at least one optimization algorithm comprising: gradient-based, Taguchi, neural network, response surface approximations, Bayesian, evolutionary, genetic, non-dominated sorting, neighborhood cultivation genetic, and/or archived-based micro-genetic algorithms.

27. The automated site engineering design system of claim 22, wherein the design system further comprises one or more internal optimization processes and/or systems, the internal optimization processes and/or systems optimizing at least one of rack structural stability, LCOE (nominal or real), IRR, combinations of mechanical components which form a rack system and/or rack tracking system, and/or designs of individual mechanical components.

28. A method to minimize the cost of the electrical design of a solar PV power plant (SPVPP), comprising:
   selecting a site for the SPVPP;
   estimating an amount of electrical power that can be produced by the SPVPP at the site;
   selecting a set of input specifications, comprising one or more numerical constraints and one or more rules;
   selecting a set of design variables comprising one or more of the following electrical components:
      types and amounts of DC wiring, types and numbers of photovoltaic modules, types and amounts of AC wiring, the numbers and types of inverters, the numbers and types of transformers, the numbers and types of power management systems, the numbers and types of DC-DC optimizers, types and numbers of maximum power-point trackers, the numbers and types of combiner boxes, warranties for electrical components, and the numbers and types of energy storage devices;
   determining a first local optimum and second local optimum of electrical designs for the SPVPP by optimizing one or more objective functions by adjusting the design variables and further constrained by the input specifications while iterating one or more coordinate searches of a parameter space, the one or more objective functions being defined as one or more costs of the electrical components and one or more costs of electrical infrastructures, which are to be minimized, and the one or more objective functions are constrained by set of input specifications, wherein the one or more costs of electrical components comprise:
      cost of the DC wiring, cost of AC wiring, costs of one or more inverters, costs and types of photovoltaic modules, costs of maxpower point tracking electronics, costs of one or more of grounding equipment, costs of one or more of electrical switchgear, costs of one or more transformers, costs of one or more DC-DC optimizers, costs of one or more energy storage devices, costs of operations and maintenance of the electrical components over a period of time, and costs of one or more power management systems to control electrical output of the SPVPP and to merge power-plant-generated electricity into that of the grid electricity;
   wherein the one or more costs of electrical infrastructures comprise;
      concrete pads for inverters and transformers, cooling facilities for electrical components, conduit trenches, and enclosures for electrical components such as inverters;
   selecting one of the electrical designs from the first local optimum and second local optimum by simulating the first local optimum and second local optimum with off-nominal evaluation data to determine a global optimum configuration;
   generating output specifications based upon the global optimum configuration; and
   providing the output specifications based upon the global optimum configuration for construction of the SPVPP, the SPVPP being constructed in accordance with the output specifications based upon the selected design for construction of the SPVPP.

29. The method of claim 28, wherein optimizing one or more objective functions comprises utilizing at least one optimization algorithm comprising: gradient-based, Taguchi, neural network, response surface approximations, Bayesian, evolutionary, genetic, non-dominated sorting, neighborhood cultivation genetic, and/or archived-based micro-genetic algorithms.

30. The method of claim 28, wherein optimizing one or more objective functions comprises utilizing one or more internal optimization processes and/or systems, the internal optimization processes and/or systems optimizing at least one of rack structural stability, LCOE (nominal or real), IRR, combinations of mechanical components which form a rack system and/or rack tracking system, and/or designs of individual mechanical components.

31. A method to minimize the cost of the electrical design of a solar PV power plant (SPVPP), comprising:
   selecting a site for the SPVPP;
   estimating an amount of electrical power that can be produced by the SPVPP at the site;
   selecting a set of input specifications, comprising one or more numerical constraints and one or more rules;
   selecting a set of design variables comprising one or more of the following electrical components:
      types and amounts of DC wiring, types and numbers of photovoltaic modules, types and amounts of AC wiring, the numbers and types of inverters, the numbers and types of transformers, the numbers and types of power management systems, the numbers and types of DC-DC optimizers, types and numbers of maximum power-point trackers, the numbers and types of combiner boxes, warranties for electrical components, and the numbers and types of energy storage devices;
   determining a first local optimum and second local optimum of electrical designs for the SPVPP by optimizing one or more objective functions by adjusting the design variables and further constraining by the input specifications;
   defining an objective function correlated to the ground coverage ratio;
   determining the first local optimum and second local optimum of electrical designs with the objective function correlated to the ground coverage ratio in combination with the one more objective functions while iterating one or more coordinate searches of a parameter space;
   selecting one of the electrical designs from the first local optimum and the second local optimum by simulating the first local optimum and the second local optimum with off-nominal evaluation data to determine a global optimum configuration;
   generating output specifications based upon the global optimum configuration; and
   providing the output specifications based on the global optimum configuration for construction of the SPVPP, the SPVPP being constructed in accordance with the output specifications and/or the selected one of the electrical designs from the global optimum configuration.

32. The method of claim 31, wherein optimizing one or more objective functions comprises utilizing at least one optimization algorithm comprising: gradient-based, Taguchi, neural network, response surface approximations, Bayesian, evolutionary, genetic, non-dominated sorting, neighborhood cultivation genetic, and/or archived-based micro-genetic algorithms.

33. The method of claim 31, wherein optimizing one or more objective functions comprises utilizing one or more internal optimization processes and/or systems, the internal optimization processes and/or systems optimizing at least one of rack structural stability, LCOE (nominal or real), IRR, combinations of mechanical components which form a rack system and/or rack tracking system, and/or designs of individual mechanical components.

* * * * *